(12) United States Patent
Lennartz et al.

(10) Patent No.: US 10,347,851 B2
(45) Date of Patent: Jul. 9, 2019

(54) HIGHLY EFFICIENT OLED DEVICES WITH VERY SHORT DECAY TIMES

(71) Applicant: UDC Ireland Limited, Dublin (IE)

(72) Inventors: Christian Lennartz, Schifferstadt (DE); Stefan Metz, Mannheim (DE); Korinna Dormann, Bad Dürkheim (DE); Gerhard Wagenblast, Wachenheim (DE); Ute Heinemeyer, Neustadt (DE); Hannah Mangold, Karlsruhe (DE); Minlu Zhang, Bad Dürkheim (DE); Thomas-Wesley Holcombe, Schifferstadt (DE)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 15/105,947

(22) PCT Filed: Dec. 17, 2014

(86) PCT No.: PCT/EP2014/078342
§ 371 (c)(1),
(2) Date: Jun. 17, 2016

(87) PCT Pub. No.: WO2015/091716
PCT Pub. Date: Jun. 25, 2015

(65) Prior Publication Data
US 2016/0315274 A1 Oct. 27, 2016

(30) Foreign Application Priority Data
Dec. 20, 2013 (EP) .................................. 13198990

(51) Int. Cl.
*H01L 51/00* (2006.01)
*H01L 51/50* (2006.01)
(Continued)

(52) U.S. Cl.
CPC ........ *H01L 51/0085* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS 2,006,222 A 6/1935 Ridler
2,009,066 A 7/1935 Marklow
(Continued)

FOREIGN PATENT DOCUMENTS

CN 1583691 2/2005
DE 102005058557 6/2007
(Continued)

OTHER PUBLICATIONS

Adachi et al., "Endothermic energy transfer: A mechanism for generating very efficient high-energy phosphorescent emission in organic materials," 2001, Applied Physics Letters, 79:2018.
(Continued)

*Primary Examiner* — Jack S Chen
(74) *Attorney, Agent, or Firm* — Riverside Law LLP

(57) ABSTRACT

The present invention relates to organic light-emitting devices comprising (a) an anode, (i) a cathode, and (e) an emitting layer between the anode and cathode, comprising 2 to 40% by weight of a luminescent organometallic complex X having a difference of the singlet energy ($E_{S1}(X)$) and the triplet energy ($E_{T1}(X)$) of smaller than 0.2 eV [$\Delta$ ($E_{S1}(X)$)–($E_{T1}(X)$)<0.2 eV], 0.05 to 5.0% by weight of a fluorescent emitter Y and 55 to 97.95% by weight of a host compound(s), wherein the amount of the organometallic complex X, the fluorescent emitter Y and the host compound(s) adds up to a total of 100% by weight and the singlet energy of the luminescent organometallic complex X ($E_{S1}(X)$) is greater than the singlet energy of the fluorescent emitter Y ($E_{S1}(Y)$) [($E_{S1}(X)$)>$E_{S1}(Y)$]. By doping, for example, an emitting layer containing a luminescent organometallic complex having a small $S_1$-$T_1$ splitting, with a fluorescent emitter the emission decay time can significantly be shortened without sacrificing external quantum efficiency (EQE) because of very efficient energy transfer.

17 Claims, 3 Drawing Sheets

(51) Int. Cl.
*C09K 11/06* (2006.01)
*C09K 11/02* (2006.01)

(52) U.S. Cl.
CPC .......... *H01L 51/006* (2013.01); *H01L 51/008* (2013.01); *H01L 51/009* (2013.01); *H01L 51/0034* (2013.01); *H01L 51/0055* (2013.01); *H01L 51/0059* (2013.01); *H01L 51/0071* (2013.01); *H01L 51/0072* (2013.01); *H01L 51/0073* (2013.01); *H01L 51/0091* (2013.01); *H01L 51/0094* (2013.01); *H01L 51/5028* (2013.01); *C09K 2211/1007* (2013.01); *C09K 2211/1014* (2013.01); *C09K 2211/1022* (2013.01); *C09K 2211/1029* (2013.01); *C09K 2211/1044* (2013.01); *C09K 2211/1059* (2013.01); *C09K 2211/1088* (2013.01); *C09K 2211/185* (2013.01); *C09K 2211/188* (2013.01); *H01L 51/0052* (2013.01); *H01L 51/0064* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/5384* (2013.01); *H01L 2251/55* (2013.01); *Y02E 10/549* (2013.01)

(56) References Cited

U.S. PATENT DOCUMENTS

| | | |
|---|---|---|
| 2,009,134 A | 7/1935 | Grelck |
| 2,009,284 A | 7/1935 | Warner |
| 2,011,057 A | 8/1935 | Kraft |
| 2,011,108 A | 8/1935 | Lehmann |
| 2,012,181 A | 8/1935 | Byrd, Jr. |
| 2,012,261 A | 8/1935 | Drumm |
| 2,013,025 A | 9/1935 | Roger |
| 2,013,150 A | 9/1935 | Henze |
| 2,013,264 A | 9/1935 | Buder |
| 4,769,292 A | 9/1988 | Tang |
| 5,121,029 A | 6/1992 | Hosokawa |
| 5,130,603 A | 7/1992 | Tokailin |
| 6,020,078 A | 2/2000 | Chen |
| 6,251,531 B1 | 6/2001 | Enokida |
| 7,250,532 B2 | 7/2007 | Iwakuma |
| 2005/0260442 A1 | 11/2005 | Yu |
| 2006/0210830 A1 | 9/2006 | Funahashi |
| 2006/0222886 A1 | 10/2006 | Kwong |
| 2006/0251925 A1 | 11/2006 | Hosokawa |
| 2007/0092753 A1 | 4/2007 | Begley |
| 2007/0122656 A1 | 5/2007 | Klubek |
| 2007/0224446 A1 | 9/2007 | Nakano |
| 2007/0252517 A1 | 11/2007 | Owczarczyk |
| 2008/0113101 A1 | 5/2008 | Inoue |
| 2008/0303423 A1 | 12/2008 | Heil et al. |
| 2009/0066226 A1 | 3/2009 | Sugita |
| 2009/0104488 A1 | 4/2009 | Gruss |
| 2009/0153034 A1 | 6/2009 | Lin |
| 2011/0266528 A1 | 11/2011 | Langer |
| 2012/0305894 A1 | 12/2012 | Kim |
| 2016/0315274 A1* | 10/2016 | Lennartz ............ H01L 51/0055 |

FOREIGN PATENT DOCUMENTS

| | | |
|---|---|---|
| EP | 373582 | 6/1990 |
| EP | 1705727 | 9/2006 |
| EP | 1786050 | 5/2007 |
| EP | 1837926 | 9/2007 |
| EP | 1837927 | 9/2007 |
| EP | 1885818 | 2/2008 |
| EP | 1957606 | 8/2008 |
| EP | 1970976 | 9/2008 |
| EP | 1998388 | 12/2008 |
| EP | 2034538 | 3/2009 |
| EP | 2246862 | 11/2010 |
| EP | 12175635 | 7/2012 |
| EP | 12185230 | 9/2012 |
| EP | 12191408 | 11/2012 |
| EP | 2543672 | 1/2013 |
| EP | 2551932 | 1/2013 |
| EP | 14162805 | 3/2014 |
| JP | 2001052870 | 2/2001 |
| JP | 2002050483 | 2/2002 |
| JP | 2005116520 | 4/2005 |
| JP | 2006140182 | 6/2006 |
| JP | 2008021687 | 1/2008 |
| JP | 2008066569 | 3/2008 |
| JP | 2008074939 | 4/2008 |
| JP | 2008084913 | 4/2008 |
| JP | 2008207520 | 9/2008 |
| JP | 2009021336 | 1/2009 |
| JP | 2009059767 | 3/2009 |
| JP | 2009114369 | 5/2009 |
| JP | 2009114370 | 5/2009 |
| JP | 2009135183 | 6/2009 |
| JP | 2009267255 | 11/2009 |
| JP | 2010040830 | 2/2010 |
| JP | 2010114180 | 5/2010 |
| JP | 2010135467 | 6/2010 |
| KR | 20110041725 | 4/2011 |
| KR | 20110041728 | 4/2011 |
| KR | 20120011336 | 2/2012 |
| KR | 20120052499 | 5/2012 |
| KR | 20120074722 | 7/2012 |
| KR | 20130110347 | 10/2013 |
| TW | 201244212 | 11/2012 |
| TW | 201307367 | 2/2013 |
| WO | 0108230 | 2/2001 |
| WO | 0108230 A1 | 2/2001 |
| WO | 2004047499 | 6/2004 |
| WO | 2004092111 | 10/2004 |
| WO | 2006000388 | 1/2006 |
| WO | 2006000389 | 1/2006 |
| WO | 2006056418 | 6/2006 |
| WO | 2006058737 | 6/2006 |
| WO | 2006025273 | 9/2006 |
| WO | 2006098080 | 9/2006 |
| WO | 2006114337 | 11/2006 |
| WO | 2006121811 | 11/2006 |
| WO | 2006122630 | 11/2006 |
| WO | 2006128800 | 12/2006 |
| WO | 2007003520 | 1/2007 |
| WO | 2007065549 | 6/2007 |
| WO | 2007065678 | 6/2007 |
| WO | 2007077810 | 7/2007 |
| WO | 2007095118 | 8/2007 |
| WO | 2007108362 | 9/2007 |
| WO | 2007108459 | 9/2007 |
| WO | 2007114244 | 10/2007 |
| WO | 2007115610 | 10/2007 |
| WO | 2007115970 | 10/2007 |
| WO | 2007115970 A1 | 10/2007 |
| WO | 2007115981 | 10/2007 |
| WO | 2007119816 | 10/2007 |
| WO | 2007140847 | 12/2007 |
| WO | 2008000727 | 1/2008 |
| WO | 2008006449 | 1/2008 |
| WO | 2008029652 | 3/2008 |
| WO | 2008029729 | 3/2008 |
| WO | 2008035571 | 3/2008 |
| WO | 2008058713 | 5/2008 |
| WO | 2008072596 | 6/2008 |
| WO | 2008090912 | 7/2008 |
| WO | 2008131750 | 11/2008 |
| WO | 2008140114 | 11/2008 |
| WO | 2008146838 | 12/2008 |
| WO | 2008156105 | 12/2008 |
| WO | 2008156879 | 12/2008 |
| WO | 2009003898 | 1/2009 |
| WO | 2009003919 | 1/2009 |
| WO | 2009008099 | 1/2009 |
| WO | 2009008100 | 1/2009 |
| WO | 2009050281 | 4/2009 |

(56) References Cited

FOREIGN PATENT DOCUMENTS

| WO | 2009050290 | 4/2009 |
|----|------------|--------|
| WO | 2009060742 | 5/2009 |
| WO | 2009060757 | 5/2009 |
| WO | 2009060779 | 5/2009 |
| WO | 2009060780 | 5/2009 |
| WO | 2009063757 | 5/2009 |
| WO | 2009084413 | 7/2009 |
| WO | 2009086028 | 7/2009 |
| WO | 2010004877 | 1/2010 |
| WO | 2010040777 | 4/2010 |
| WO | 2010044342 | 4/2010 |
| WO | 2010067746 | 6/2010 |
| WO | 2010068876 | 6/2010 |
| WO | 2010079051 | 7/2010 |
| WO | 2010079678 | 7/2010 |
| WO | 2010087222 | 8/2010 |
| WO | 2010090077 | 8/2010 |
| WO | 2010095564 | 8/2010 |
| WO | 2010122810 | 10/2010 |
| WO | 2010132236 | 11/2010 |
| WO | 2011040607 | 4/2011 |
| WO | 2011043083 | 4/2011 |
| WO | 2011051404 | 5/2011 |
| WO | 2011052186 | 5/2011 |
| WO | 2011059099 | 5/2011 |
| WO | 2011073149 | 6/2011 |
| WO | 2011086935 | 7/2011 |
| WO | 2011086941 | 7/2011 |
| WO | 2011090149 | 7/2011 |
| WO | 2011106344 | 9/2011 |
| WO | 2011137072 | 11/2011 |
| WO | 2010001830 | 12/2011 |
| WO | 2011157779 | 12/2011 |
| WO | 2011157790 | 12/2011 |
| WO | 2012014621 | 2/2012 |
| WO | 2012048266 | 4/2012 |
| WO | 2012111462 | 8/2012 |
| WO | 2012121936 | 9/2012 |
| WO | 2012130709 | 10/2012 |
| WO | 2012147397 | 11/2012 |
| WO | 2012156378 | 11/2012 |
| WO | 2012162325 | 11/2012 |
| WO | 2012170461 | 12/2012 |
| WO | 2012170463 | 12/2012 |
| WO | 2012170571 | 12/2012 |
| WO | 2012172482 | 12/2012 |
| WO | 2013001086 | 1/2013 |
| WO | 2013007707 | 1/2013 |
| WO | 2013017675 | 2/2013 |
| WO | 2013072508 | 5/2013 |
| WO | 2013185871 | 12/2013 |
| WO | 2014037077 | 3/2014 |
| WO | 2012105310 | 7/2014 |
| WO | 2014109814 | 7/2014 |

OTHER PUBLICATIONS

Ahlrichs et al., "Electronic structure calculations on workstation computers: The program system turbomole," 1989, Chem. Phys. Lett. 162:165.

Andrae et al., "Energy-adjusted ab initio pseudopotentials for the second and third row transition elements," 1990, Theor. Chim. Acta 77:123-141.

Baldo et al., "High-efficiency fluorescent organic light-emitting devices using a phosphorescent sensitizer," 2000, Nature 403:750.

Becke, "Density functional thermochemistry. III. The role of exact exchange," 1993, J. Chem. Phys. 98:5648.

Chen et al., "Recent developments in molecular organic electroluminescent materials," 1997, Macromol. Symp. 125:1-48.

Deaton et al., "E-Type Delayed Fluorescence of a Phosphine-Supported Cu2(μ-NAr2)2 Diamond Core: Harvesting Singlet and Triplet Excitons in OLEDs," 2010, J. Am. Chem. Soc. 132: 9499-9508.

Dexter, "A Theory of Sensitized Luminescence in Solids," 1953, J. Chem. Phys. 21:836.

Gao and Kahn, "Controlled p doping of the hole-transport molecular material N,N'-diphenyl-N,N'-bis(1-naphthyl)-1,1'-biphenyl-4,4'-diamine with tetrafluorotetracyanoquinodimethane," 2003, J. Appl. Phys. 94:359-366.

Harkins et al., "Probing the Electronic Structures of [Cu2(μ-XR2)]n+ Diamond Cores as a Function of the Bridging X Atom (X = N or P) and Charge (n = 0, 1, 2)," 2008, J. Am. Chem. Soc. 130:3478-3485.

Hashimoto et al., "Highly Efficient Green Organic Light-Emitting Diodes Containing Luminescent Three-Coordinate Copper(I) Complexes," 2011, J. Am. Chem. Soc. 133:10348-10351.

Himmetoglu et al., "Role of electronic localization in the phosphorescence of iridium sensitizing dyes," 2012, J. Chem. Phys. 137:154309.

Hofbeck et al., "The Triplet State of fac-Ir(ppy)3," 2010, Inorg. Chem. 49:9290-9299.

Hung and Chen, "Recent progress of molecular organic electroluminescent materials and devices," 2002, Mat. Sci. and Eng. R. 39:143-222.

Leitl et al., "Phosphorescence versus Thermally Activated Delayed Fluorescence. Controlling Singlet—Triplet Splitting in Brightly Emitting and Sublimable Cu(I) Compounds," 2014, J. Am. Chem. Soc. 136:16032-16038.

Perdew, "Density-functional approximation for the correlation energy of the inhomogeneous electron gas," 1986, Phys. Rev. B 33:8822.

Pfeiffer et al., "Doped organic semiconductors: Physics and application in light emitting diodes", 2003, Organic Electronics 4:89-103.

Sasabe et al., "2-Phenylpyrimidine skeleton-based electron-transport materials for extremely efficient green organic light-emitting devices," 2008, Chem. Comm. 5821-5823.

Sasabe et al., "Wide-Energy-Gap Electron-Transport Materials Containing 3,5-Dipyridylphenyl Moieties for an Ultra High Efficiency Blue Organic Light-Emitting Device," 2008, Chem. Mater. 20:5951-5953.

Schäfer et al., "Fully optimized contracted Gaussian basis sets for atoms Li to Kr," 1992, J. Chem. Phys. 9:2571.

Su et al., "Improved efficiency and colour purity of blue electrophosphorescent devices by codoping a fluorescent emitter," 2008, J. Phys. D: Appl. Phys 41:125108.

Tanaka et al., "Ultra High Efficiency Green Organic Light-Emitting Devices," 2007, Japanese J. Appl. Phys. 46:L10.

van Lenthe et al., "Geometry optimizations in the zero order regular approximation for relativistic effects," 1999, J. Chem. Phys. 110:8943.

Walzer et al., "Highly Efficient Organic Devices Based on Electrically Doped Transport Layers", 2007, Chem. Soc. Rev. 107:1233-1271.

Wang and Zeigler, "A simplified relativistic time-dependent density-functional theory formalism for the calculations of excitation energies including spin-orbit coupling effect," 2005, J. Chem. Phys. 123:154102.

Werner et al., "Pyronin B as a donor for n-type doping of organic thin films," 2003, Appl. Phys. Lett. 82:4495-4497.

Zhu et al., "Abrupt change of luminescence spectrum in single-layer phosphorescent polymer light emitting diode," 2012, J. Luminescence 132:12-15.

Van Lenthe and Baerends, "Optimized Slater-Type Basis Sets for the Elements 1-118", 2003, J. Comp. Chem. 24:1142.

* cited by examiner

Fig. 1
Fig. 1a:
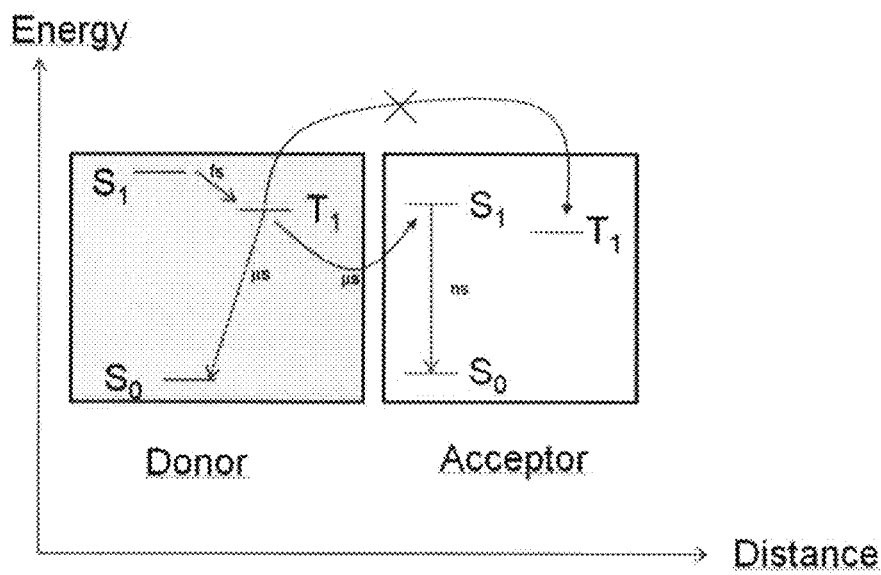
Fig. 1b:
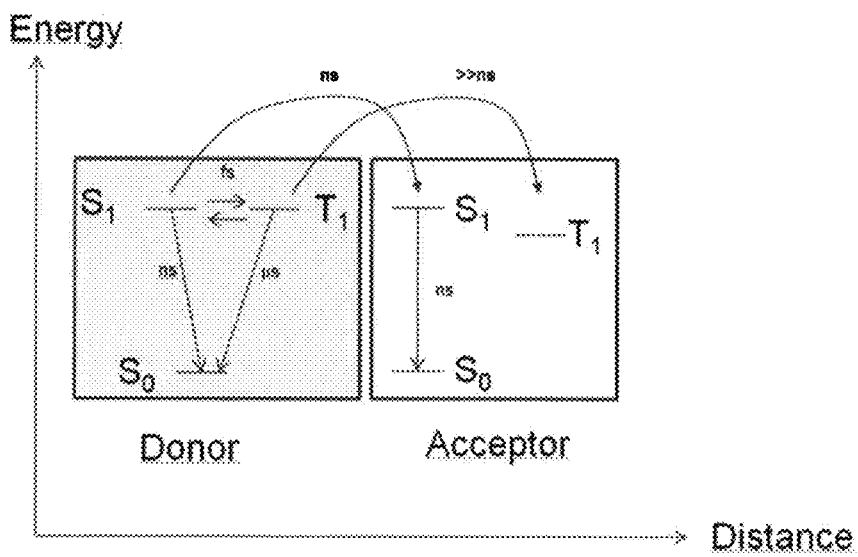

HIGHLY EFFICIENT OLED DEVICES WITH VERY SHORT DECAY TIMES

CROSS-REFERENCE TO RELATED APPLICATIONS

This application is a national stage application (under 35 U.S.C. § 371) of PCT/EP2014/078342, filed Dec. 17, 2014, which claims the benefit of European Application No. 13198990.7, filed Dec. 20, 2013, both of which are incorporated herein by reference in their entirety.

The present invention relates to organic light-emitting devices comprising (a) an anode, (i) a cathode, and (e) an emitting layer between the anode and cathode, comprising 2 to 40% by weight of a luminescent organometallic complex X having a difference of the singlet energy ($E_{S1}(X)$) and the triplet energy ($E_{T1}(X)$) of smaller than 0.2 eV [$\Delta$ ($E_{S1}(X)$)−($E_{T1}(X)$)<0.2 eV], 0.05 to 5.0% by weight of a fluorescent emitter Y and 55 to 97.95% by weight of a host compound(s), wherein the amount of the organometallic complex X, the fluorescent emitter Y and the host compound(s) adds up to a total of 100% by weight and the singlet energy of the luminescent organometallic complex X ($E_{S1}(X)$) is greater than the singlet energy of the fluorescent emitter Y ($E_{S1}(Y)$) [$E_{S1}(X)$>$E_{S1}(Y)$].

In EP1705727A a concept is described, as, despite the intrinsically limited to 25% quantum efficiency of direct light emission of a fluorescent blue emitter, the overall efficiency of a white-light OLED can be made to 100%, by using a fluorescent blue emitter with a triplet energy, which is higher than the triplet energy of at least one phosphorescent emitter used. By diffusion of the non-radiative triplet excitons through the blue emitting layer to a further emission layer containing the phosphorescent emitter, and subsequent exothermic energy transfer the triplet excitons of the blue emitter may be used for light emission. In conclusion in this case, a transfer from the fluorescent to the phosphoreszent compound is described.

WO0108230 relates to organic light emitting devices (OLED) comprising a heterostructure for producing luminescence, comprising an emissive layer,
wherein the emissive layer is a combination of a conductive host material and a fluorescent emissive molecule, such as, for example, DCM2, present as a dopant in said host material:
wherein the emissive molecule is adapted to luminesce when a voltage is applied across the heterostructure; and
wherein the heterostructure comprises an intersystem crossing molecule, such as, for example, Ir(ppy)$_3$, which is an efficient phosphor whose emission spectrum substantially overlaps with the absorption spectrum of the emissive molecule.

In FIG. 1 an OLED is shown with alternating thin layers (5×) of CBP (89%) and Ir(ppy)$_3$ (11%) and CBP (99%) and DCM2 (1%), respectively.

WO2008131750 discloses organic light emitting devices, wherein the emission layer comprises at least one mainly emitting in the blue or blue-green spectrum light, fluorescent emitter and at least one predominantly in the non-blue spectral light emitting phosphorescent emitter. The observed small decrease in the quantum efficiency is explained as follows: The problem, that a large accumulation of triplet excitons is produced at the necessary high current densities in the fluorescent emission layer, resulting in the efficiency of the so-called "roll-off" effect, is solved by the direct blending of one or more phosphorescent emitter, since thus the triplet formed on one or all fluorescent emitters are transferred directly to the phosphorescent emitter and the triplet-triplet accumulation cannot arise.

US2011108769 (WO2010006681) proposes a so-called "singlet harvesting" process. The T$_1$ state is occupied by the already known effects of triplet harvesting, and the usual T$_1$→S$_0$ phosphorescence results, but with the unfavourably long emission lifetime. The complex compounds proposed for use in accordance with US2011108769 have a very small energetic separation $\Delta$E between the singlet S$_1$ and the triplet T$_1$. In this case, very efficient thermal re-occupation from the initially very efficiently occupied T$_1$ state into the S$_1$ state can occur at room temperature. The thermal re-occupation process described opens a fast emission channel from the short-lived S$_1$ state, and the overall lifetime is significantly reduced.

M. A. Baldo et al., Nature 403 (2000) 750 use a phosphorescent sensitizer to excite a fluorescent dye. The mechanism for energetic coupling between phosphorescent and fluorescent molecular species is a long-range, non-radiative energy transfer: the internal efficiency of fluorescence can be as high as 100%. In FIG. 1 of M. A. Baldo et al., Nature 403 (2000) 750 an organic light emitting device having the following structure is shown: glass substrate/indium tin oxide (anode)/N,N'-diphenyl-N,N'-bis(3-methylphenyl)-[1,1'-biphenyl]-4,4'-diamine (TPD, hole transport layer)/10 alternating layers of 10% Ir(ppy)3/CBP and 1% DCM2/CBP/2,9-dimethyl-4,7-diphenyl-1,10-phenanthroline (BCP, blocking layer)/tris-(8-hydroxyquinoline) aluminium (Alq3, electron transport layer)/Mg/Ag (cathode). The intermolecular energy transfer is dominated by the slow transfer rate out of the T$_1$-state of the donor (FIG. 1a). Since intersystem crossing is very fast (~fs) also the singlet states end up in the T$_1$-state, which therefore limits the rate of the transfer due to its partly forbidden nature. The sensitized electroluminescence (EL) decay time is measured to be around 100 ns. Measurements of the EL decay time in devices is hindered by secondary processes such as charge transport (depending on charge mobility), trapping processes and capacitive processes, which leads to distortions of the radiative decay time of the excited states of emitter species, especially in the range equal, or smaller than 200 ns. Therefore a measurement of the EL decay kinetics is not instructive for determining emissive decay times in the present invention.

M. A. Baldo et al., APPLIED PHYSICS LETTERS 79 (2001) reports high-efficiency yellow organic light-emitting devices (OLEDs) employing [2-methyl-6-[2,3,6,7-tetrahydro-1H,5H-benzo[ij]quinolizin-9-yl]ethenyl]-4H-pyran-4-ylidene] propane-dinitrile (DCM2) as a fluorescent lumophore, with a green electrophosphorescent sensitizer, fac-tris(2-phenylpyridine) iridium (Ir(ppy)3) co-doped into a 4,4'-N,N-dicarbazole-biphenyl host. The devices exhibit peak external fluorescent quantum and power efficiencies of 9%±1% (25 cd/A) and 17±2 lm/W at 0.01 mA/cm$^2$, respectively. The exceptionally high performance for a fluorescent dye is due to the ~100% efficient transfer of both singlet and triplet excited states in the doubly doped host to the fluorescent material using Ir(ppy)$_3$ as a sensitizing agent.

X. Zhu et al., Journal of Luminescence 132 (2012) 12-15 disclose PVK-based single-layer phosphorescent polymer OLEDs (organic light emitting diodes) with different rubrene concentrations. The structure of fabricated devices was: ITO/PEDOT:PSS/PVK+Flr-pic (bis[(4,6-difluorophenyl)-pyridinato-N,C²](picolinate) iridium(III))+rubrene (5,6,11,12-tetraphenylnaphthacene)+OXD7/LiF/Al. PVK (poly(N-vinylcarbazole)) is used as a hole transporting host polymer and OXD7 (3-bis (4-tert-butylphenyl-1,3,4-oxadiazoyl)phenylene) is used as an electron transporting moiety. The weight ratio of PVK:OXD7 was 2.56:1 and the weight percent of Flrpic was 10 wt % of total amount of organics. The amount of rubrene was varied from 0 to 10 wt % of Flrpic. Below 2% doping of rubrene the emission from rubrene was hardly detected. At 4% doping of rubrene, however, significant energy transfer from Flrpic to rubrene occurred.

Zisheng Su et al., J. Phys. D: Appl. Phys. 41 (2008) 125108 report improved efficiency and colour purity of blue electrophosphorescent devices based on Flrpic by codoping a fluorescent emitter 2,5,8,11-tetra-t-butyl-perylene (TBPe). The optimized device codoped with 8 wt % Flrpic and 0.15 wt % TBPe shows a maximum current efficiency and power efficiency of 11.6 cd A$^{-1}$ and 7.3 lmW$^{-1}$, which were increased by 20% and 40%, respectively, compared with that of the reference device.

The devices have a structure of ITO/2-TNATA (5 nm)/NPB (40 nm)/mCP:Flrpic:TBPe (30 nm)/Bphen (10 nm)/Alq3 (20 nm)/LiF (0.5 nm)/Al (100 nm). The doping concentration of Flrpic in the EML was fixed at 8 wt %, while the concentration of TBPe was varied from 0 to 0.5 wt %.

With a few exceptions, the electronic excited state, which can also be formed by energy transfer from a suitable precursor exciton, is either a singlet or triplet state, consisting of three sub-states. Since the two states are generally occupied in a ratio of 1:3 on the basis of spin statistics, the result is that the emission from the singlet state, which is referred to as fluorescence, leads to maximum emission of only 25% of the excitons produced. In contrast, triplet emission, which is referred to as phosphorescence, exploits and converts all excitons and emits them as light (triplet harvesting) such that the internal quantum yield in this case can reach the value of 100%, provided that the additionally excited singlet state, which is above the triplet state in terms of energy, relaxes fully to the triplet state (intersystem crossing, ISC), and radiationless competing processes remain insignificant.

The triplet emitters suitable for triplet harvesting used are generally transition metal complexes in which the metal is selected from the third period of the transition metals and which show emission lifetimes in the μs range. The long decay times of the triplet emitters give rise to interaction of triplet excitons (triplet-triplet annihilation), or interaction of triplet-polaron interaction (triplet-polaron quenching). This leads to a distinct decline in efficiency of the OLED device with rising current density (called "roll-off" behavior). For instance, disadvantages are found particularly in the case of use of emitters with long emission lifetimes for OLED illuminations where a high luminance, for example of more than 1000 cd/m², is required (cf.: J.

Kido et al. Jap. J. Appl. Phys. 2007, 46, L10.). Furthermore, molecules in electronically excited states are frequently more chemically reactive than in ground states so that the likelihood of unwanted chemical reactions increases with the length of the emission lifetime. The occurrence of such unwanted chemical reactions has a negative effect on the lifetime of the device.

Thus, it is the object of the present invention to provide an emitting system which makes use of 100% of the triplet excitons and enables decay times below 100 ns, which result in an increased stability of the emitting system.

It was surprisingly found that doping, for example, an emitting layer containing a luminescent organometallic complex having a small $S_1$-$T_1$ splitting, with a fluorescent emitter can significantly shorten the emission decay time well below 100 ns without sacrificing external quantum efficiency (EQE) because of very efficient energy transfer (FIG. 1b). Here the transfer originates mainly from the singlet state of the donor molecule in contrast to the scenario shown in FIG. 1a. Additional positive effects can be an improved OLED stability and a lower roll-off at high luminance.

Accordingly, the present invention relates to organic electronic devices, especially organic light-emitting devices comprising
(a) an anode,
(i) a cathode, and
(e) an emitting layer between the anode and cathode, comprising
2 to 40% by weight of a luminescent organometallic complex X having a difference of the singlet energy ($E_{S1}(X)$) and the triplet energy ($E_{T1}(X)$) of smaller than 0.2 eV [Δ($E_{S1}(X)$)−($E_{T1}(X)$)<0.2 eV],
0.05 to 5.0% by weight of a fluorescent emitter Y and
55 to 97.95% by weight of a host compound(s), wherein the amount of the organometallic complex X, the fluorescent emitter Y and the host compound(s) adds up to a total of 100% by weight and the singlet energy of the luminescent organometallic complex X ($E_{S1}(X)$) is greater than the singlet energy of the fluorescent emitter Y ($E_{S1}(Y)$) [($E_{S1}(X)$)>$E_{S1}(Y)$].

Determination of the $S_1$-$T_1$-splitting

To determine the $S_1$-$T_1$-splitting a combined approach involving temperature dependent determination of excited state lifetimes and quantum chemical calculations are used.
a) Experimental Approach A 60 μm thin film of the luminescent organometallic complex X in PMMA (2%) is prepared by doctor blading from dichloromethane onto a quartz substrate. A cryostat (Optistat CF, Oxford Instruments) is used for cooling the sample with liquid helium. The photoluminescence (PL) spectra and the PL decay time at the maximum of the emission are measured with a spectrometer (Edinburgh Instruments FLS 920P) at the following temperatures: 4K, 10K, 20K, 30K, 50K, 75K, 100K, 150K, 200K, 250K, 300K, 350K, 375K, 400K.

Fitting:

The temperature dependence of the averaged PL decay time provides information about the energy levels and decay rates of different states that are populated according to the Boltzmann distribution (M. J. Leitl, V. A. Krylova, P. I. Djurovich, M. E. Thompson, H. Yersin J. Am. Chem. Soc. 2014, 136, 16032-16038; T. Hofbeck, H. Yersin, Inorg. Chem. 2010, 49, 9290-9299). For a system with two populated excited states the following expression can be fitted to the measured data $k_{av}$ vs T:

$$k_{av} = \frac{k_I + k_{II} e^{-\Delta E_{I,II}/(k_B T)}}{1 + e^{-\Delta E_{I,II}/(k_B T)}} \quad \text{Equation 1}$$

For a system with three populated excited states equation 2 is used.

$$k_{av} = \frac{k_I + k_{II}e^{-\Delta E_{I,II}/(k_BT)} + k_{III}e^{-\Delta E_{I,III}/(k_BT)}}{1 + e^{-\Delta E_{I,II}/(k_BT)} + e^{-\Delta E_{I,III}/(K_BT)}} \quad \text{Equation 2}$$

where $k_{av}$ is the decay rate determined from the measurement, $k_I$, $k_{II}$, $k_{III}$ are the decay rates of the respective excited states, $E_{I,II}$ and $E_{I,III}$ are the energy differences of the excited states I and II compared to the lowest excited state, $k_B$ is the Boltzmann constant and T is the temperature.

A high value of k ($>2*10^6$ s$^{-1}$) is an indication that the respective excited state could be a singlet. However, since the spin multiplicity of the excited states cannot be proven by PL measurements, additional quantum chemical calculations were carried out and compared to the excited-state levels found from the fitting of the measurement.

b) Quantum Chemical Approach

First the triplet geometries of the potential donor molecules were optimized at the unrestricted BP86 [J. P. Perdew, Phys. Rev. B 33, 8822 (1986) and J. P. Perdew, Phys. Rev. B 33, 8822 (1986)]/SV(P) [A. Schafer, H. Horn, and R. Ahlrichs, J. Chem. Phys. 9, 2571 (1992)]-level of theory including effective core potentials in case of iridium transition metal complexes [D. Andrae, U. Haeussermann, M. Dolg, H. Stoll, and H. Preuss, Theor. Chim. Acta 77, 123 (1990)]. Based on these triplet geometries relativistic all electron calculations were performed to determine the $S_1$-$T_1$-splitting. Specifically we used the B3LYP-functional [Becke, A. D., J. Chem. Phys. 98, 5648 (1993)] in combination with an all-electron basis set of double zeta quality [E. van Lenthe and E. J. Baerends, J. Comp. Chemistry 24, 1142 (2003)]. Scalar relativistic effects were included at the SCF level via the ZORA approach [E. van Lenthe, A. E. Ehlers and E. J. Baerends, Journal of Chemical Physics 110, 8943 (1999)]. Based on that wavefunction time dependent density functional calculations were performed including spin orbit coupling via perturbation theory [F. Wang and T. Ziegler, Journal of Chemical Physics 123, 154102 (2005)]. The $S_1$-$T_1$-splitting is then finally determined as the energy difference of the lowest $T_1$-sublevel to the first spin-orbit corrected $S_1$-state. Relativistic calculations were carried out using the ADF program package [3. ADF2009.01, SCM, Theoretical Chemistry, Vrije Universiteit, Amsterdam, The Netherlands, http://www.scm.com] whereas for the geometry optimisations the TURBOMOLE program package [R. Ahlrichs, M. Bär, M. Häser, H. Horn, and C. Cölmel, Chem. Phys. Lett. 162, 165 (1989)] was used. According to the present invention the difference of the singlet energy ($E_{S1}$(X)) and the triplet energy ($E_{T1}$(X)) is the experimentally determined value.

The present invention is also directed to the use of a fluorescent emitter Y for doping an emitting layer comprising a luminescent organometallic complex X having a difference of the singlet energy ($E_{S1}$(X)) and the triplet energy ($E_{T1}$(X)) of smaller than 0.2 eV [$\Delta$ ($E_{S1}$(X))–($E_{T1}$(X))<0.2 eV] and having a singlet energy ($E_{S1}$(X)) which is greater than the singlet energy of the fluorescent emitter Y ($E_{S1}$(Y)) [($E_{S1}$(X))>$E_{S1}$(Y)] and a host compound(s) to decrease the decay time of the emission below 100 ns.

Determination of Emissive Lifetime

In accordance with the present invention the decay time of the emission is the emissive lifetime to, which is calculated by $\tau_0 = \tau_v$/QY, of thin films consisting of the luminescent organometallic complex X (2 to 40% by weight), fluorescent emitter Y (0.05 to 5.0% by weight) and host compound(s) (55 to 97.95% by weight). The quantum-yields (QY) of the prepared thin films are measured with the integrating-sphere method using the Absolute PL Quantum Yield Measurement System (Hamamatsu, Model C9920-02) (excitation wavelength: 310 nm).

The excited-state lifetime ($\tau_v$) of the prepared thin films is measured by exciting the thin films with a pulsed diode laser with an excitation wavelength of 310 nm operated at 10 kHz and detecting the emission with time correlated single photon counting (TCSPC).

The emissive lifetime $\tau_0$ is preferably in the range of 0.1 to 80 ns, more preferably 0.5 to 50 ns, most preferred 0.5 to 40 ns.

The difference of the singlet energy and the triplet energy of the luminescent organometallic complex X is preferably smaller than 0.1 eV, more preferably smaller than 0.05 eV.

Preferably, the emitting layer comprises 5 to 40% by weight of the luminescent organometallic complex X, 0.1 to 4.0% by weight of the fluorescent emitter Y and 94.9 to 56.0% by weight of a host compound(s), wherein the amount of the organometallic complex X, the fluorescent emitter Y and the host compound(s) adds up to a total of 100% by weight. More preferably, the emitting layer comprises 10 to 40% by weight of the luminescent organometallic complex X, 0.1 to 3.0% by weight of the fluorescent emitter Y and 89.9 to 57.0% by weight of a host compound(s), wherein the amount of the organometallic complex X, the fluorescent emitter Y and the host compound(s) adds up to a total of 100% by weight. Most preferred, the emitting layer comprises 20 to 40% by weight of the luminescent organometallic complex X, 0.1 to 3.0% by weight of the fluorescent emitter Y and 79.9 to 57.0% by weight of a host compound(s), wherein the amount of the organometallic complex X, the fluorescent emitter Y and the host compound(s) adds up to a total of 100% by weight.

FIG. 1a shows an energy level diagram demonstrating that intermolecular transfer is dominated by the slow transfer rate out of the $T_1$-state of the donor.

FIG. 1b shows an energy level diagram for the fluorescent emitter Y (=donor) and the luminescent organometallic complex X (acceptor) used according to the present invention.

Figure 2:
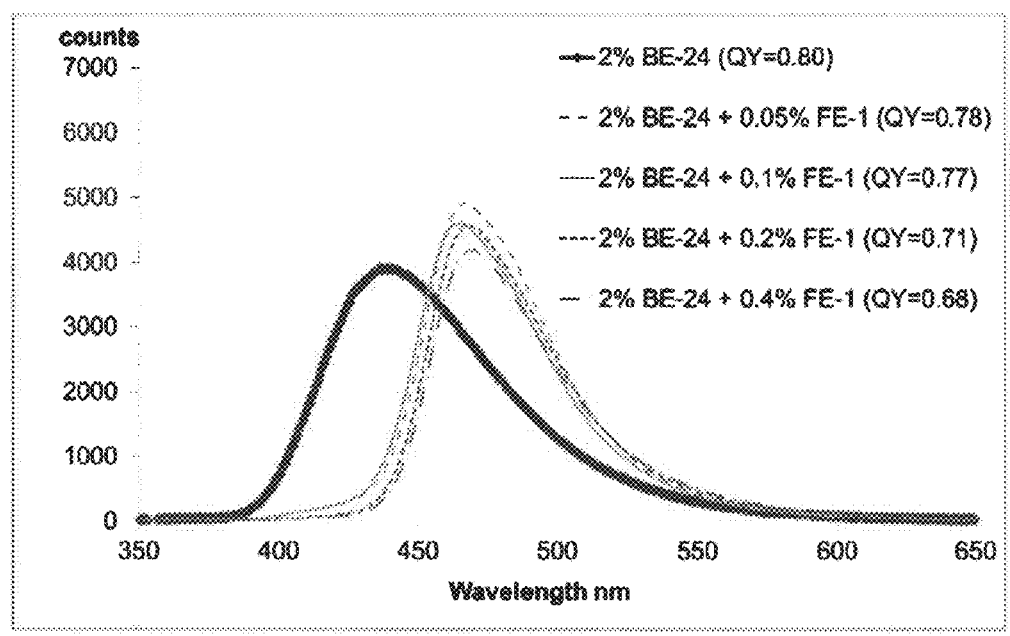
FIG. 2 shows PL-spectra of 2% luminescent organometallic complex BE-24 and varying concentrations of the fluorescent emitter FE-1 in PMMA

Suitable structures of organic light emitting devices are known to those skilled in the art and are specified below.

Substrate may be any suitable substrate that provides desired structural properties. Substrate may be flexible or rigid. Substrate may be transparent, translucent or opaque. Plastic and glass are examples of preferred rigid substrate materials. Plastic and metal foils are examples of preferred flexible substrate materials. Substrate may be a semiconductor material in order to facilitate the fabrication of circuitry. For example, substrate may be a silicon wafer upon which circuits are fabricated, capable of controlling organic light emitting devices (OLEDs) subsequently deposited on the substrate. Other substrates may be used. The material and thickness of substrate may be chosen to obtain desired structural and optical properties.

In a preferred embodiment the organic light-emitting device according to the present invention comprises in this order:

(a) an anode,
(b) optionally a hole injection layer,
(c) optionally a hole transport layer, (d) optionally an exciton blocking layer
(e) an emitting layer, comprising the luminescent organometallic complex X, the fluorescent emitter Y and the host compound(s),
(f) optionally a hole/exciton blocking layer
(g) optionally an electron transport layer,
(h) optionally an electron injection layer, and
(i) a cathode.

In a particularly preferred embodiment the organic light-emitting device according to the present invention comprises in this order:
(a) an anode,
(b) optionally a hole injection layer,
(c) a hole transport layer,
(d) an exciton blocking layer
(e) an emitting layer, comprising the luminescent organometallic complex X, the fluorescent emitter Y and the host compound(s),
(f) a hole/exciton blocking layer
(g) an electron transport layer, and
(h) optionally an electron injection layer, and
(i) a cathode.

The properties and functions of these various layers, as well as example materials are known from the prior art and are described in more detail below on basis of preferred embodiments.

Anode (a):

The anode is an electrode which provides positive charge carriers. It may be composed, for example, of materials which comprise a metal, a mixture of different metals, a metal alloy, a metal oxide or a mixture of different metal oxides. Alternatively, the anode may be a conductive polymer. Suitable metals comprise the metals of groups 11, 4, 5 and 6 of the Periodic Table of the Elements, and also the transition metals of groups 8 to 10. When the anode is to be transparent, mixed metal oxides of groups 12, 13 and 14 of the Periodic Table of the Elements are generally used, for example indium tin oxide (ITO). It is likewise possible that the anode (a) comprises an organic material, for example polyaniline, as described, for example, in Nature, Vol. 357, pages 477 to 479 (Jun. 11, 1992). Preferred anode materials include conductive metal oxides, such as indium tin oxide (ITO) and indium zinc oxide (IZO), aluminum zinc oxide (AlZnO), and metals. Anode (and substrate) may be sufficiently transparent to create a bottom-emitting device. A preferred transparent substrate and anode combination is commercially available ITO (anode) deposited on glass or plastic (substrate). A reflective anode may be preferred for some top-emitting devices, to increase the amount of light emitted from the top of the device. At least either the anode or the cathode should be at least partly transparent in order to be able to emit the light formed. Other anode materials and structures may be used.

Hole Injection Layer (b):

Generally, injection layers are comprised of a material that may improve the injection of charge carriers from one layer, such as an electrode or a charge generating layer, into an adjacent organic layer. Injection layers may also perform a charge transport function. The hole injection layer may be any layer that improves the injection of holes from anode into an adjacent organic layer. A hole injection layer may comprise a solution deposited material, such as a spin-coated polymer, or it may be a vapor deposited small molecule material, such as, for example, CuPc or MTDATA.

Polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl) (Plexcore® OC Conducting Inks commercially available from Plextronics), and copolymers such as poly(3,4-ethylenedioxythiophene)/poly(4-styrenesulfonate) also called PEDOT/PSS.

Hole Transport Layer (c):

Either hole-transporting molecules or polymers may be used as the hole transport material. Suitable hole transport materials for layer (c) of the inventive OLED are disclosed, for example, in Kirk-Othmer Encyclopedia of Chemical Technology, 4th Edition, Vol. 18, pages 837 to 860, 1996, US20070278938, US2008/0106190, US2011/0163302 (triarylamines with (di)benzothiophen/(di)benzofuran; Nan-Xing Hu et al. Synth. Met. 111 (2000) 421 (indolocarbazoles), WO2010002850 (substituted phenylamine compounds) and WO2012/16601 (in particular the hole transport materials mentioned on pages 16 and 17 of WO2012/16601). Combination of different hole transport material may be used. Reference is made for example, to WO2013/022419, wherein (HTL1-1)

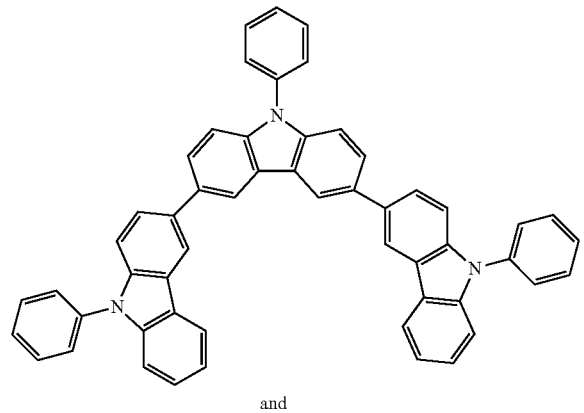

and (HTL2-1)

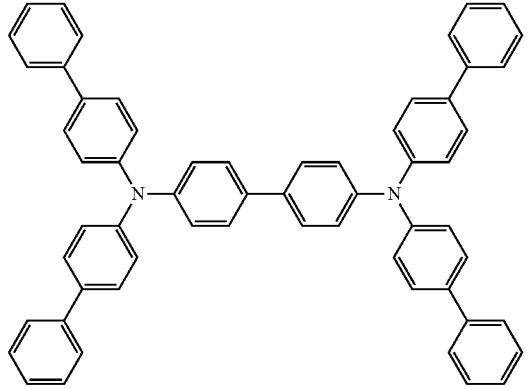 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

constitute the hole transport layer.

Customarily used hole-transporting molecules are selected from the group consisting of

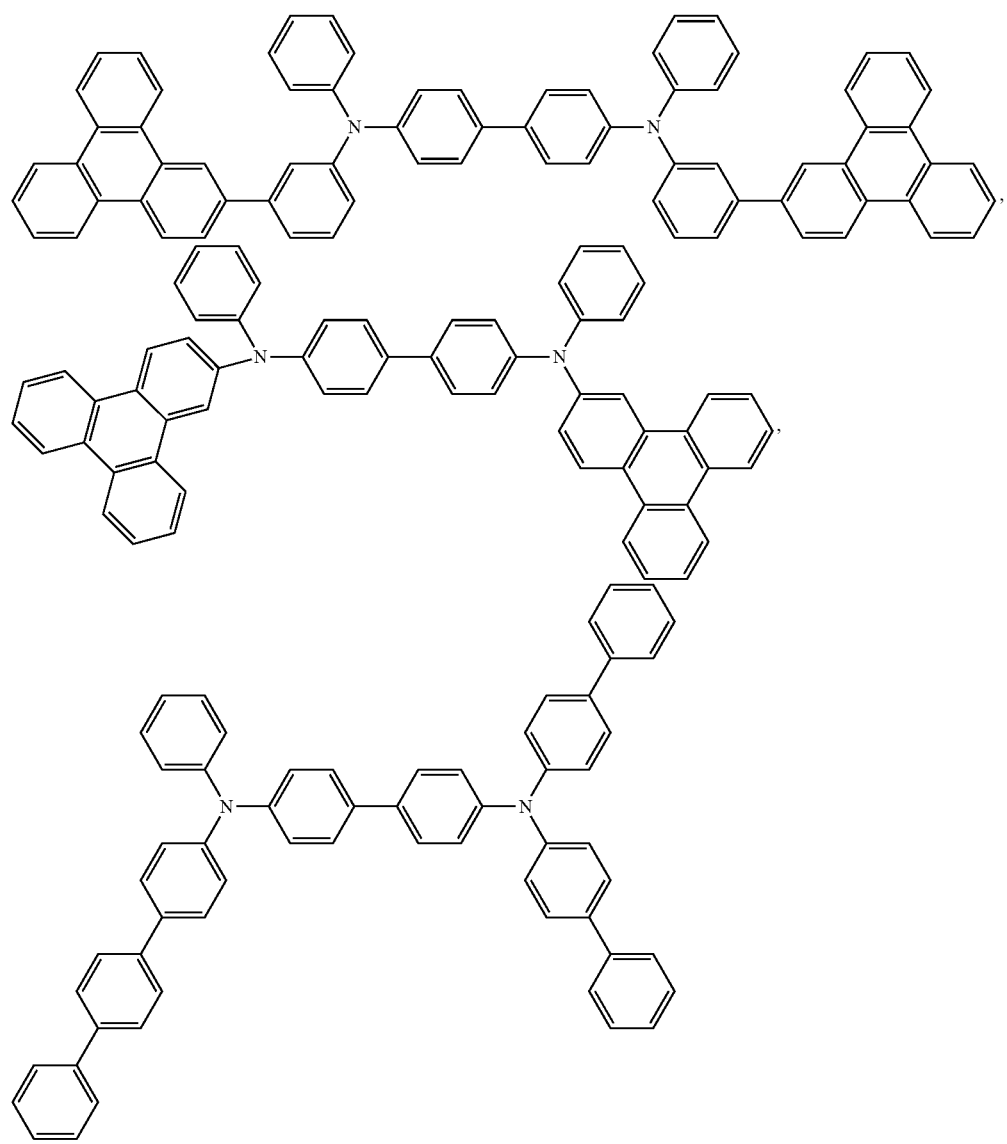
(4-phenyl-N-(4-phenylphenyl)-N-[4-[4-(N-[4-(4-phenyl-phenyl)phenyl]anilino)phenyl]phenyl]aniline),
(4-phenyl-N-(4-phenylphenyl)-N-[4-[4-(4-phenyl-N-(4-phenylphenyl)anilino)phenyl]phenyl]aniline),
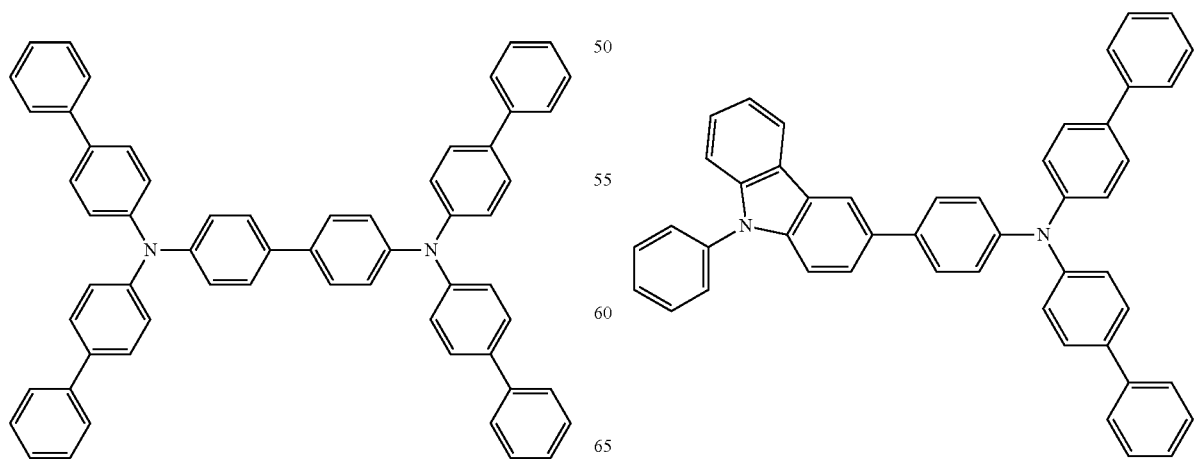

(4-phenyl-N-[4-(9-phenylcarbazol-3-yl)phenyl]-N-(4-phenylphenyl)aniline),

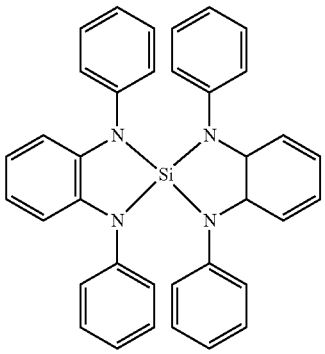 [SMILES: C1=CC2C(C=C1)N(c1ccccc1)[Si]1(N(c3ccccc3)c3ccccc3N1c1ccccc1)N2c1ccccc1]

(1,1',3,3'-tetraphenylspiro[1,3,2-benzodiazasilole-2,2'-3a,7a-dihydro-1,3,2-benzodiazasilole]),

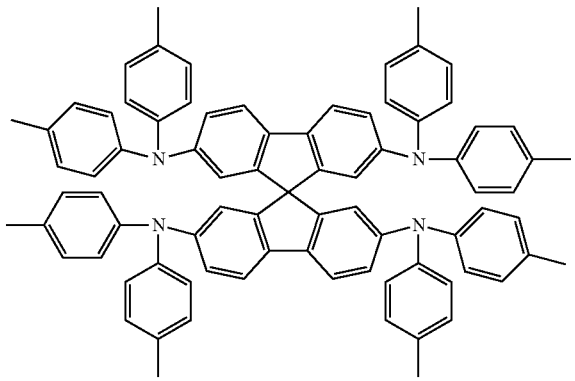

(N2,N2,N2',N2',N7,N7,N7',N7'-octa-kis(p-tolyl)-9,9'-spirobi[fluorene]-2,2',7,7'-tetramine), 4,4'-bis[N-(1-naphthyl)-N-phenyl-amino]biphenyl (α-NPD), N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenyl-hydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)-cyclobutane (DCZB), N,N,N',N'-tetrakis(4-methylphenyl)-(1,1'-biphenyl)-4,4'-diamine (TTB), fluorine compounds such as 2,2',7,7'-tetra(N,N-di-tolyl)amino9,9-spirobifluorene (spiro-TTB), N,N'-bis(naphthalen-1-yl)-N,N'-bis(phenyl)9,9-spirobifluorene (spiro-NPB) and 9,9-bis(4-(N,N-bis-biphenyl-4-yl-amino)phenyl-9Hfluorene, benzidine compounds such as N,N'-bis(naphthalen-1-yl)-N,N'-bis(phenyl)benzidine and porphyrin compounds such as copper phthalocyanines. In addition, polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl] (Plexcore® OC Conducting Inks commercially available from Plextronics), and copolymers such as poly(3,4-ethylenedioxythiophene)/poly(4-styrenesulfonate) also called PEDOT/PSS. In a preferred embodiment it is possible to use metal carbene complexes as hole transport materials. Suitable carbene complexes are, for example, carbene complexes as described in WO2005/019373A2, WO2006/056418 A2, WO2005/113704, WO2007/115970, WO2007/115981, WO2008/000727 and WO2014/147134. One example of a suitable carbene complex is Ir(DPBIC)$_3$ with the formula:

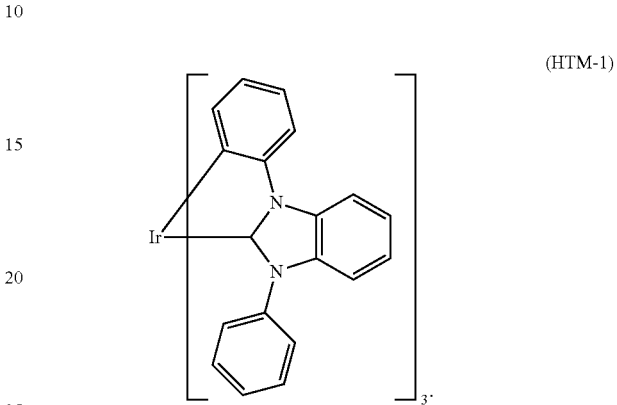

(HTM-1)

Another example of a suitable carbene complex is Ir(ABIC)$_3$ with the formula:

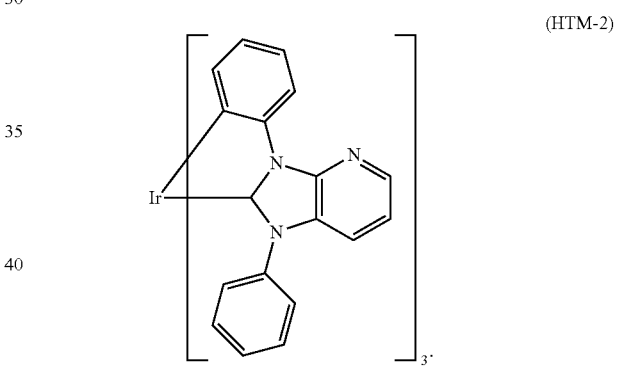

(HTM-2)

The hole-transporting layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, 2003, 359 (p-doped organic layers); A. G. Werner, F. Li, K. Harada, M. Pfeiffer, T. Fritz, K. Leo, Appl. Phys. Lett., Vol. 82, No. 25, 2003, 4495 and Pfeiffer et al., Organic Electronics 2003, 4, 89-103 and K. Walzer, B. Maennig, M. Pfeiffer, K. Leo, Chem. Soc. Rev. 2007, 107, 1233. For example it is possible to use mixtures in the hole-transporting layer, in particular mixtures which lead to electrical p-doping of the hole-transporting layer. p-Doping is achieved by the addition of oxidizing materials. These mixtures may, for example, be the following mixtures: mixtures of the abovementioned hole transport materials with at least one metal oxide, for example $MoO_2$, $MoO_3$, $WO_x$, $ReO_3$ and/or $V_2O_5$, preferably $MoO_3$ and/or $ReO_3$, more preferably $MoO_3$, or mixtures comprising the aforementioned hole transport materials and one or more compounds selected from 7,7,8,8-tetracyanoquinodimethane (TCNQ), 2,3,5,6-tetrafluoro-7,7,8,8-tetracyanoquinodimethane ($F_4$-TCNQ), 2,5-bis(2-hydroxyethoxy)-7,7,8,8-tetracyanoquinodimethane, bis(tetra-n-butylammonium)tetracyanodiphenoquinodimethane, 2,5-dimethyl-7,7,8,8-tetracyanoquinodimethane, tetracyanoethylene, 11,11,12,12-tetracyanonaphtho-2,6-quinodimethane, 2-fluoro-7,7,8,8-tetracyanoquino-dimethane, 2,5-difluoro-7,7,8,8-etracyanoquinodimethane, dicyanomethylene-1,3,4,5,7,8-hexafluoro-6H-naphthalen-2-ylidene)malononitrile ($F_6$-TNAP), Mo(tfd)$_3$ (from Kahn et al., J. Am. Chem. Soc. 2009, 131 (35), 12530-12531), compounds as described in EP1988587, US2008265216, EP2180029, US20100102709, WO2010132236, EP2180029 and quinone compounds as mentioned in EP2401254. Preferred mixtures comprise the aforementioned carbene complexes, such as, for example, the carbene complexes HTM-1 and HTM-2, and MoO$_3$ and/or ReO$_3$, especially MoO$_3$. In a particularly preferred embodiment the holetransport layer comprises from 0.1 to 10 wt % of MoO$_3$ and 90 to 99.9 wt % carbene complex, especially of a carbene complex HTM-1 and HTM-2, wherein the total amount of the MoO$_3$ and the carbene complex is 100 wt %.

Exciton Blocking Layer (d):

Blocking layers may be used to reduce the number of charge carriers (electrons or holes) and/or excitons that leave the emissive layer. An electron/exciton blocking layer (d) may be disposed between the emitting layer (e) and the hole transport layer (c), to block electrons from emitting layer (e) in the direction of hole transport layer (c). Blocking layers may also be used to block excitons from diffusing out of the emissive layer. Suitable metal complexes for use as electron/exciton blocker material are, for example, carbene complexes as described in WO2005/019373A2, WO2006/056418A2, WO2005/113704, WO2007/115970, WO2007/115981, WO2008/000727 and WO2014/147134. Explicit reference is made here to the disclosure of the WO applications cited, and these disclosures shall be considered to be incorporated into the content of the present application. One example of a suitable carbene complex is compound HTM-1. Another example of a suitable carbene complex is compound HTM-2.

The Light-Emitting Layer (e)

The device comprises a light-emitting layer (e).

The emitting layer comprises 2 to 40% by weight of a luminescent organometallic complex X having a difference of the singlet energy and the triplet energy of smaller than 0.2 eV, 0.05 to 5% by weight of a fluorescent emitter Y and 55 to 97.95% by weight of a host compound(s), wherein the amount of the organometallic complex X, the fluorescent emitter Y and the host compound(s) adds up to a total of 100% by weight and the singlet energy of the luminescent organomettalic complex X ($E_{S1}(X)$) is greater than the singlet energy of the fluorescent emitter Y ($E_{S1}(Y)$).

The difference of the singlet energy and the triplet energy of the luminescent organometallic complex X is preferably smaller than 0.1 eV, more preferably smaller than 0.05 eV.

Preferably, the emitting layer comprises 5 to 40% by weight of the luminescent organometallic complex X, 0.1 to 4.0% by weight of the fluorescent emitter Y and 94.9 to 56.0% by weight of a host compound(s), wherein the amount of the organometallic complex X, the fluorescent emitter Y and the host compound(s) adds up to a total of 100% by weight. More preferably, the emitting layer comprises 10 to 40% by weight of the luminescent organometallic complex X, 0.1 to 3.0% by weight of the fluorescent emitter Y and 89.9 to 57.0% by weight of a host compound(s), wherein the amount of the organometallic complex X, the fluorescent emitter Y and the host compound(s) adds up to a total of 100% by weight. Most preferred, the emitting layer comprises 20 to 40% by weight of the luminescent organometallic complex X, 0.1 to 3.0% by weight of the fluorescent emitter Y and 79.9 to 57.0% by weight of a host compound(s), wherein the amount of the organometallic complex X, the fluorescent emitter Y and the host compound(s) adds up to a total of 100% by weight.

The Luminescent Organometallic Complex (=Donor):

The luminescent organometallic complex X has a difference of the singlet excited state and the triplet excited state of smaller than 0.2 eV [$\Delta(E_{S1}(X))-(E_{T1}(X))<0.2$ eV], especially of smaller than 0.1 eV, very especially of smaller than 0.05 eV. Therefore all organometallic complexes fulfilling this criteria are, in principle, suitable as luminescent organometallic complex X. Criteria, which help to identify most adequate structures fulfilling the requirements stated above, are described below:

i) For a fast energy transfer from the donor to the acceptor a significant population of the $S_1$-state in the donor molecule is a necessary condition. This requires a very small $S_1$-$T_1$-splitting in the donor molecule. In order to obtain these very small splittings the frontier orbitals involved into the formation of the excited state at the donor (typically HOMO and LUMO) have to be localized in spatially different regions of the molecule, thus minimizing the exchange integral K due to vanishing orbital overlap. For homoleptic iridium-complexes involving monoanionic bidentate ligands the degeneracy of the ligands has to be lifted in order to induce interligand transitions in order to localize electrons in different regions of space as described above. A preferred method is the synthesis of the $C_1$-symmetric meridional complexes, where all three ligands have different bonding situations and therefore different energies. Facial heteroleptic iridium-complexes involving monoanionic bidentate ligands can also be used to induce inter-ligand transitions by choosing ligands with different electronic levels.

An important loss channel regarding quantum efficiency can be due to direct transfer of $T_1$-excitons from the donor molecule to the fluorescent acceptor. Although a significant singlet population in the donor systems is expected as described above, still some triplet population will be present. Triplet-transfer according to the Dexter-mechanism (D. L. Dexter, J. Chem. Phys., 21, 836 (1953)) is a short range process based on electron exchange mechanism between donor and acceptor. For an exchange interaction to be large a good overlap between the HOMOs of the donor and acceptor and simultaneously the overlap of the LUMOs of the donor and acceptor is required. Also in this respect the spatial separation of HOMO and LUMO is beneficial. Standard quantum chemical calculations (DFT) can give a clear guidance here. For example, the orbital structure of BE-24 is localized and the the orbital structure of Ir(ppy)$_3$ is delocalized according to B3LYP/DZP-level of theory.

ii) After the selection of organometallic complexes X according the the first selection criterion i) quantum chemical calculations to predict the $S_1$-$T_1$-splitting should be carried out.

iii) Quantum chemically calculated $S_1$-$T_1$-splittings are verified by temperature dependent emissive lifetime measurements.

In an embodiment of the present invention the luminescent organometallic complex X is a luminescent iridium complex. Suitable luminescent iridium complexes are specified in the following publications: WO2006/056418A2, WO2007/115970, WO2007/115981, WO2008/000727, WO2009050281, WO2009050290, WO2011051404, US2011/057559 WO2011/073149, WO2012/121936A2, US2012/0305894A1, WO2012/170571, WO2012/170461, WO2012/170463, WO2006/121811, WO2007/095118, WO2008/156879, WO2008/156879, WO2010/068876, US2011/0057559, WO2011/106344, US2011/0233528, WO2012/048266, WO2012/172482 and European patent application no. 14162805.7.

Preferably, the luminescent organometallic iridium complex X is a luminescent homoleptic meridional iridium carbene complex, or a luminescent heteroleptic iridium carbene complex.

The luminescent iridium complex is preferably a compound of formula

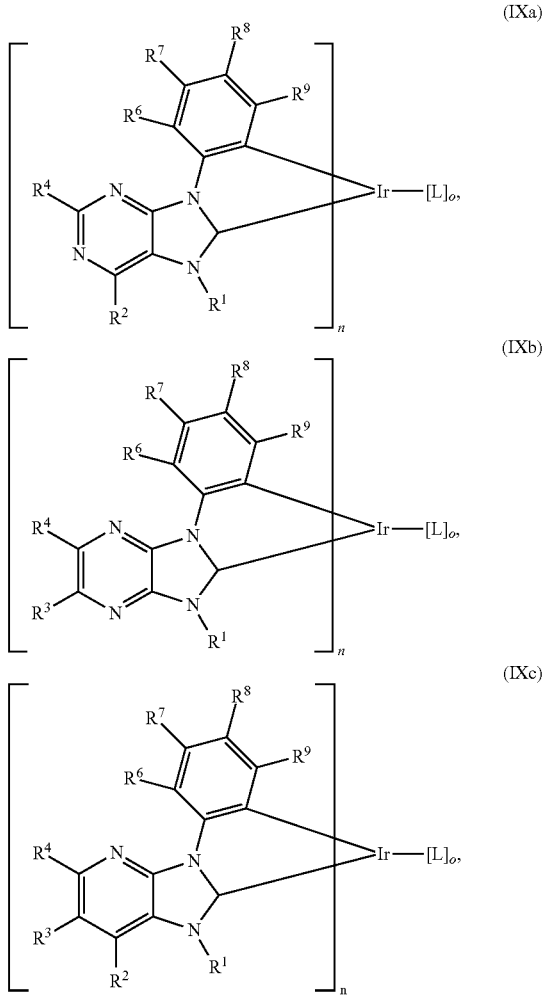

which are, for example, described in WO2011/073149, US2012/0305894, WO2012121936 and WO2012/172482, wherein the ligand(s) are each bidentate ligands;

$R^1$ is a linear or branched alkyl radical optionally interrupted by at least one heteroatom, optionally bearing at least one functional group and having 1 to 20 carbon atoms, substituted or unsubstituted cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having a total of 5 to 18 carbon atoms and/or heteroatoms, $R^2$, $R^3$ and $R^4$ are each independently hydrogen, a linear or branched alkyl radical optionally interrupted by at least one heteroatom, optionally bearing at least one functional group and having 1 to 20 carbon atoms, substituted or unsubstituted cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having a total of 5 to 18 carbon atoms and/or heteroatoms, group with donor or acceptor action, or $R^2$ and $R^3$ or $R^3$ and $R^4$ together with the carbon atoms to which they are bonded form an optionally substituted, saturated or unsaturated or aromatic ring optionally interrupted by at least one further heteroatom and having a total of 5 to 18 carbon atoms and/or heteroatoms, and may optionally be fused to at least one further optionally substituted saturated or unsaturated or aromatic ring optionally interrupted by at least one further heteroatom and having a total of 5 to 18 carbon atoms and/or heteroatoms, $R^6$, $R^7$, $R^8$ and $R^9$ are each independently hydrogen, a linear or branched alkyl radical optionally interrupted by at least one heteroatom, optionally bearing at least one functional group and having 1 to 20 carbon atoms, substituted or unsubstituted cycloalkyl radical optionally interrupted by at least one heteroatom, optionally bearing at least one functional group and having 3 to 20 carbon atoms, substituted or unsubstituted heterocycloalkyl radical optionally interrupted by at least one heteroatom, optionally bearing at least one functional group and having 3 to 20 carbon atoms and/or heteroatoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having a total of 5 to 18 carbon atoms and/or heteroatoms, group with donor or acceptor action, or $R^6$ and $R^7$, $R^7$ and $R^8$ or $R^8$ and $R^9$, together with the carbon atoms to which they are bonded, form a saturated, unsaturated or aromatic, optionally substituted ring which is optionally interrupted by at least one heteroatom, has a total of 5 to 18 carbon atoms and/or heteroatoms, and may optionally be fused to at least one further optionally substituted saturated or unsaturated or aromatic ring optionally interrupted by at least one further heteroatom and having a total of 5 to 18 carbon atoms and/or heteroatoms, L is a monoanionic bidendate ligand, n is 1, 2 or 3, o is 0, 1 or 2, where, when o is 2, the L ligands may be the same or different.

The homoleptic metal-carbene complexes may be present in the form of facial or meridional isomers, wherein the meridional isomers are preferred.

A particularly preferred embodiment of the present invention therefore relates to an OLED comprising at least one homoleptic metal-carbene complex of the general formula (IXa), (IXb), or (IXc) as luminescent organometallic complex X, the homoleptic metal-carbene complex of the formula (IXa), (IXb), or (IXc) preferably being used in the form of the meridional isomer thereof.

In the case of the heteroleptic metal-carbene complexes, four different isomers may be present.

Examples of particularly preferred luminescent iridium complexes are compounds (BE-35a), (BE-1) to (BE-37) shown in claim 6. In addition, luminescent iridium complexes described in European patent application no. 14162805.7 are preferred. Among the luminescent iridium complexes described in European patent application no. 14162805.7 iridium complexes of formula

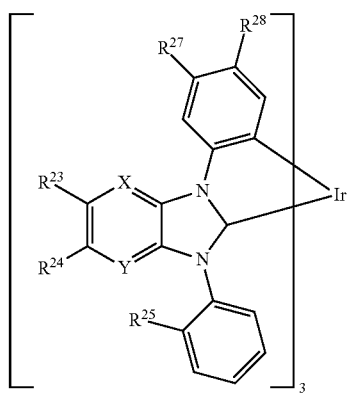

(X)

are more preferred, wherein X and Y are independently of each other CH, or N, with the proviso that at least one of X and Y is N;

$R^{23}$, $R^{24}$, $R^{27}$ and $R^{28}$ are each independently hydrogen; deuterium; methyl, ethyl, n-propyl, iso-propyl, n-butyl, tert-butyl, sec-butyl, iso-butyl, cyclopentyl, cyclohexyl, $OCH_3$, $OCF_3$; phenyl, pyridyl, primidyl, pyrazinyl, carbazolyl, dibenzofuranyl, dibenzothiophenyl, benzofuranyl and benzothiophenyl, wherein the aforementioned radicals may be unsubstituted or substituted by methyl, ethyl, n-propyl, iso-propyl, n-butyl, tert-butyl, sec-butyl, iso-butyl, methoxy, $CF_3$ or phenyl; a group with donor or acceptor action, selected from F, $CF_3$, CN and $SiPh_3$; and $R^{25}$ is methyl, ethyl, n-propyl, iso-propyl, n-butyl, tert-butyl, sec-butyl, iso-butyl, cyclopentyl, cyclohexyl, $OCH_3$, $OCF_3$; phenyl, pyridyl, primidyl, pyrazinyl, wherein the aforementioned radicals may be substituted by, preferably monosubstituted, by methyl, ethyl, n-propyl, iso-propyl, n-butyl, tert-butyl, sec-butyl, iso-butyl, methoxy or phenyl or unsubstituted; a group with donor or acceptor action, selected from $CF_3$ and CN;

Examples of iridium complexes described in European patent application no. 14162805.7, which can advantageously be used as luminescent metal complex, are shown below.

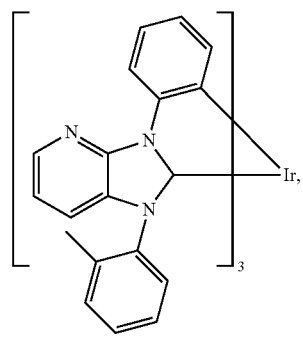

(BE-38)

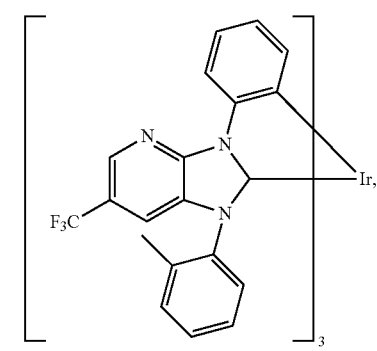

(BE-39)

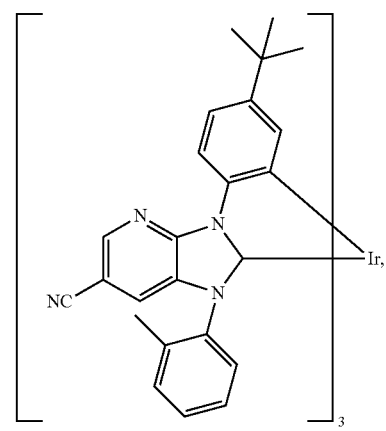

(BE-40)

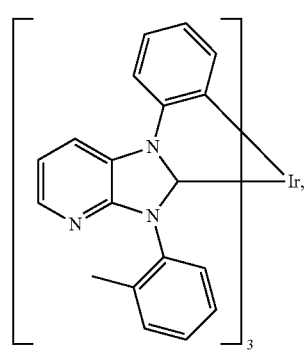

(BE-41)

(BE-42)
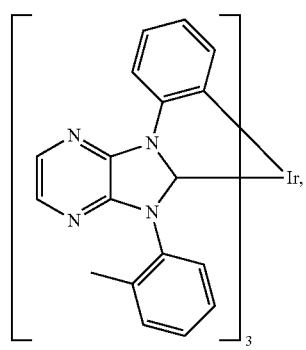
(BE-43)
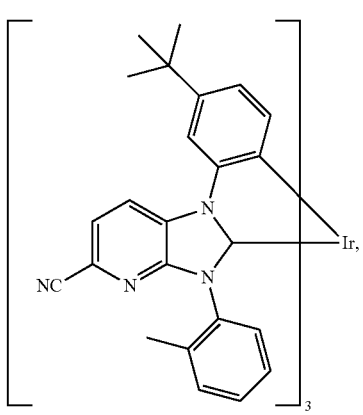
(BE-44)
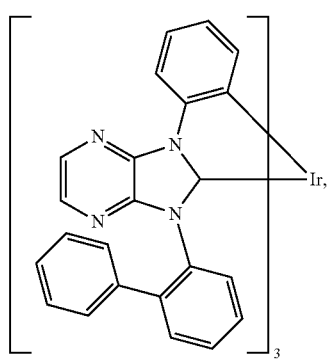
(BE-45)
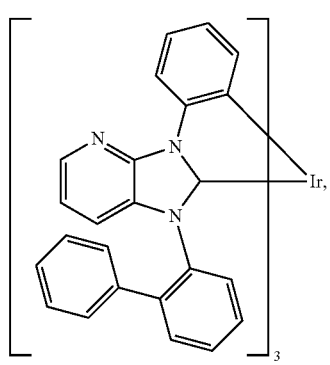
(BE-46)
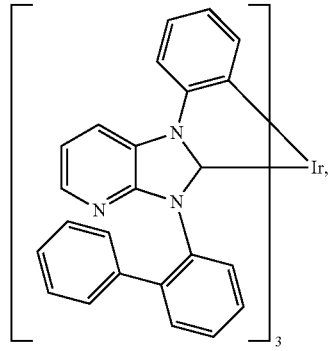
(BE-47)
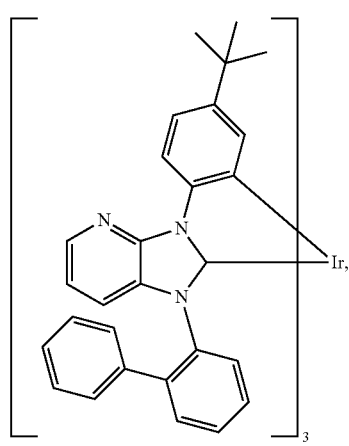
(BE-48)
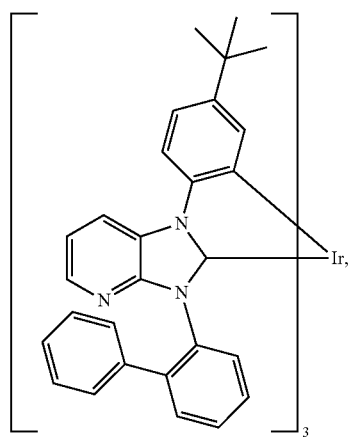

-continued
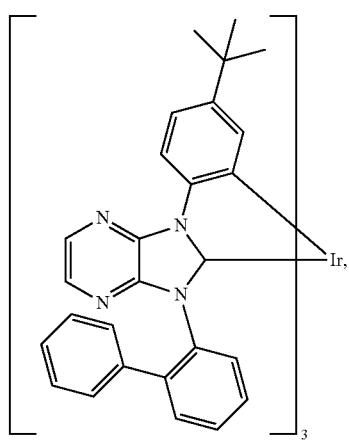
(BE-49)
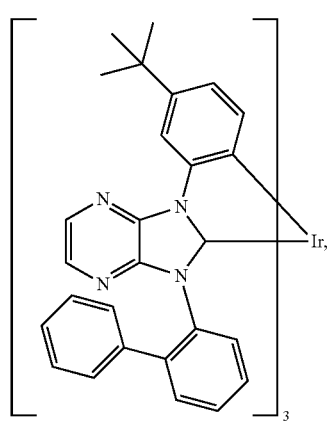
(BE-52)
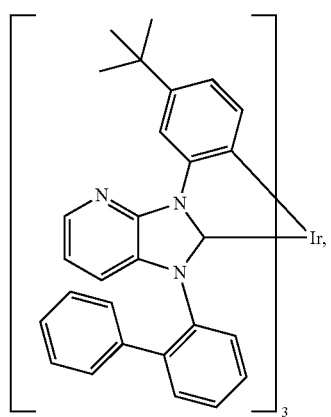
(BE-50)
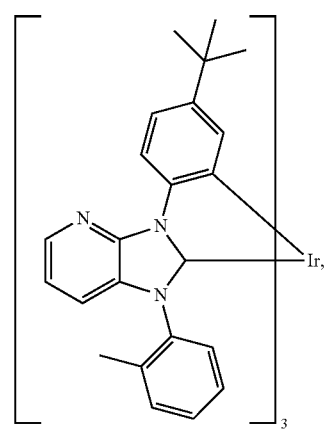
(BE-53)
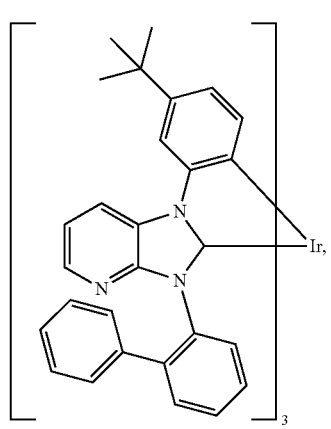
(BE-51)
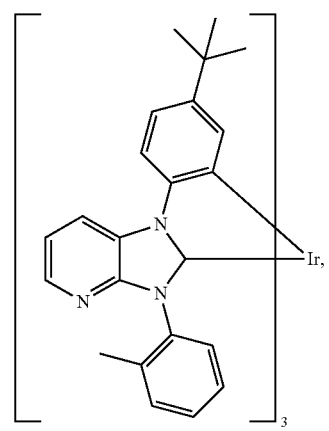
(BE-54)

(BE-55)
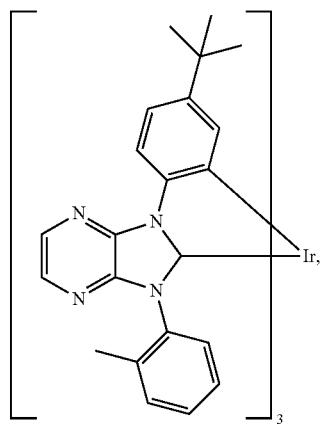

(BE-56)
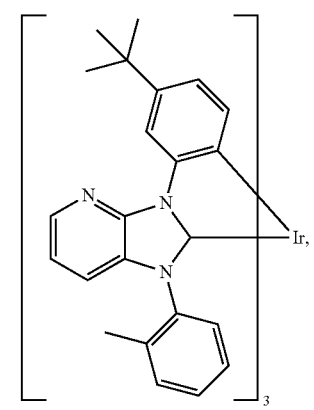

(BE-57)
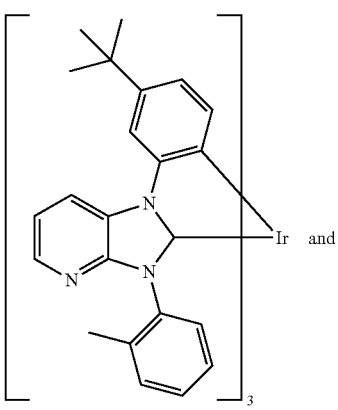

(BE-58)
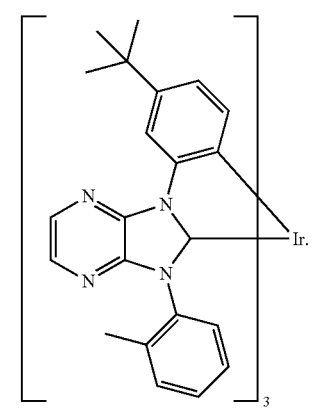

Luminescent homoleptic meridional iridium carbene complexes are preferred.

Among the luminescent iridium complexes (BE-1) to (BE-58) the luminescent iridium complexes (BE-2), (BE-3), (BE-24) and (BE-25) to (BE-58) are more preferred.

The homoleptic metal-carbene complexes may be present in the form of facial or meridional isomers, preference being given to the meridional isomers.

In another preferred embodiment of the present invention the luminescent organometallic complex X is a luminescent copper complex having a difference of the singlet energy ($E_{S1}(X)$) and the triplet energy ($E_{T1}(X)$) of smaller than 0.2 eV, especially 0.1 eV, very especially 0.05 eV. Such luminescent copper complexes are, for example, described in US2013264518, US2013150581, WO2013017675, WO2013007707, WO2013001086, WO2012156378, US2013025649, WO2013072508 and EP2543672.

US2013264518 and WO2013007707 discloses organic emitter molecules, this molecules having a $\Delta E(S_1\text{-}T_1)$ value between the lowermost excited singlet state ($S_1$) and the triplet state beneath it ($T_1$) of less than 2500 cm$^{-1}$.

US2013150581 discloses neutral mononuclear copper(I) complexes for the emission of light with a structure according to formula

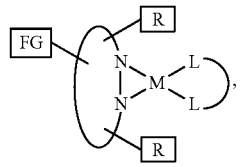

with:
M: Cu(I);
L∩L: a single negatively charged by bidentate ligand;
N∩N: an diimine ligand, substituted with R and FG, in particular a substituted 2,2'-bipyridine-derivative (bpy) or a 1,10-phenanthroline-derivative (phen);
R: at least one sterically demanding substituent for preventing a change of geometry of copper(I) complexes towards a planarization in an exited state;
FG=function group: at least a second substituent for conducting electrons and for increasing the solubility in organic solvents, or at least a second substituent for conducting holes and for increasing the solubility in organic solvents, wherein the function group is bound either directly or via a bridge to the diimine ligand;
wherein the copper(I)complex
has a $\Delta E(S_1\text{-}T_1)$-value between the lowest exited singlet ($S_1$)-state and the triplet ($T_1$)-state below of smaller than 2500 cm$^{-1}$;
an emission decay time of at the most 20 μs;
an emission quantum yield of large 40%, and
a solubility in organic solvents of at least 1 g/L.

WO2013017675 discloses dimeric copper

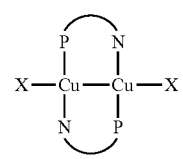

complexes, wherein: Cu: Cu(I), X: Cl, Br, I, SCN, CN, and/or alkinyl, and N∩P: a phosphane ligand substituted with an N-heterocycle.

WO2013072508 describes copper (I) complexes of the formula

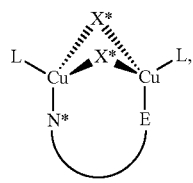

where X*=Cl, Br, I, CN, OCN, SCN, alkinyl, and/or $N_3$ and N*∩E=a bidentate ligand, wherein E=a phosphanyl/arsenyl/antimonyl group of the form $R_2E$ (in which R=alkyl, aryl, heteroaryl, alkoxyl, phenoxyl, or amid);

N*=an imin function that is a component of an aromatic group selected from pyridyl, pyridazinyl, pyrimidyl, pyrazinyl, triazinyl, tetrazinyl, oxazolyl, thiazolyl, imidazolyl, pyrazolyl, isoxazolyl, isothiazolyl, 1,2,3-triazolyl, 1,2,4-triazolyl, 1,2,4-oxadiazolyl, 1,2,4-thiadiazolyl, tetrazolyl, 1,2,3,4-oxatriazolyl, 1,2,3,4-thiatriazolyl, chinolyl, isochinolyl, chinoxalyl, and chinazolyl, which are optionally additionally substituted and/or anneleated; and "∩"=at least one carbon atom that is likewise a component of the aromatic group, said carbon atom being found both directly adjacent to the amine nitrogen atom as well as to the phosphorous, arsenic, or antimony atom; L represents specific monodentate, or bidentate ligands, such as, for example, copper complexes (Cu-3), (Cu-4) and (Cu-5) shown in claim 9. EP2543672 describes copper(I) complexes of formula

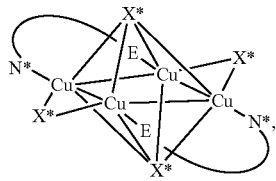

wherein

X*: Cl, Br, I, CN and/or SCN; N*∩E=a bidentate ligand, wherein E=a phosphanyl/arsenyl group of the form $R_2E$ (in which R=alkyl, aryl, heteroaryl, alkoxyl, phenoxyl, or amid);

N*=an imin function that is a component of an N-heteroaromatic five-membered ring selected from oxazolyl, imidazolyl, thiazolyl, isoxazolyl, isothiazolyl, pyrazolyl, 1,2,3-triazolyl, 1,2,3-oxadiazolyl, 1,2,5-oxadiazolyl, 1,2,3-thiadiazolyl, and 1,2,5-thiadiazolyl;

"∩"=at least one carbon atom that is likewise a component of the aromatic group, said carbon atom being found both directly adjacent to the amine nitrogen atom as well as to the phosphorous, or arsenic atom; such as, for example, copper complex (Cu-2) shown in claim 9. WO2013001086 relates to a copper(I) complex of the formula

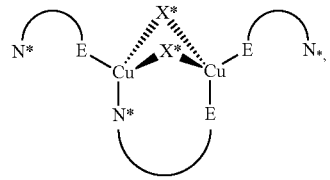

(A)

wherein X*=Cl, Br, I, CN, SCN, alkinyl, and/or $N_3$ (independently of one another); N*∩E=a bidentate ligand in which E=phosphanyl/arsenyl group of the form $R_2E$ (in which R=alkyl, aryl, alkoxyl, phenoxyl, or amide); N*=imine function, which is a component of an N-heteroaromatic 5-ring that is selected from the group consisting of pyrazole, isoxazole, isothiazole, triazole, oxadiazole, thiadiazole, tetrazole, oxatriazole, and thiatriazole; and "n"=at least one carbon atom which is likewise a component of the aromatic group, said carbon atom being located directly adjacent both to the imine nitrogen atom as well as to the phosphor or arsenic atom.

Examples of luminescent copper complexes, which can advantageously be used according to the present invention are compounds (Cu-1) to (Cu-9) shown in claim 10.

Additional luminescent copper complexes are described, for example, in Hartmut Yersin et al., J. Am. Chem. Soc. 136 (2014) 16032-6038, M. Hashimoto et al., J. Am. Chem. Soc. 133 (2011) 10348-10351, S. Harkins et al., J. Am. Chem. Soc. 130 (2008) 3478-3485 and S. Harkins et al., J. Am. Chem. Soc. 132 (2010) 9499-9508.

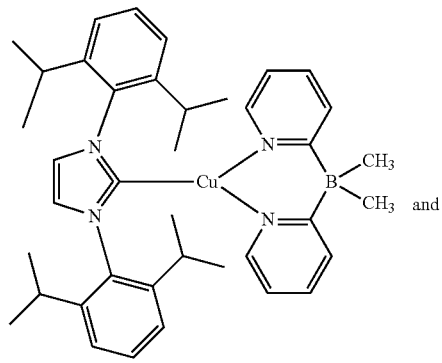
(Cu-10)

and

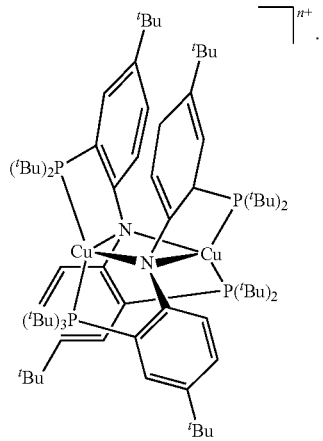
(Cu-11)

The copper complexes (Cu-1) to (Cu-11) can advantageously be used in combination with fluorescent emitters (FE-1), (FE-2), (FE-6), (FE-7), (FE-8) and (FE-9).

In addition, the Pd and Pt complexes with small $S_1$-$T_1$ splitting described in WO2014109814 may be used as luminescent metal complex.

The Host Compound:

For efficient light emission the triplet energy of the host material should be larger than the triplet energy of the luminescent organometallic complex X used. Therefore all host materials fulfilling this requirement with respect to luminescent organometallic complex X used are, in principle, suitable as host.

Suitable as host compounds are carbazole derivatives, for example 4,4'-bis(carbazol-9-yl)-2,2'-dimethylbiphenyl (CDBP), 4,4'-bis(carbazol-9-yl)biphenyl (CBP), 1,3-bis(N-carbazolyl)benzene (mCP), and the host materials specified in the following applications: WO2008/034758, WO2009/003919.

Further suitable host materials, which may be small molecules or (co)polymers of the small molecules mentioned, are specified in the following publications: WO2007108459 (H-1 to H-37), preferably H-20 to H-22 and H-32 to H-37, most preferably H-20, H-32, H-36, H-37, WO2008035571 A1 (Host 1 to Host 6), JP2010135467 (compounds 1 to 46 and Host-1 to Host-39 and Host-43), WO2009008100 compounds No. 1 to No. 67, preferably No. 3, No. 4, No. 7 to No. 12, No. 55, No. 59, No. 63 to No. 67, more preferably No. 4, No. 8 to No. 12, No. 55, No. 59, No. 64, No. 65, and No. 67, WO2009008099 compounds No. 1 to No. 110, WO2008140114 compounds 1-1 to 1-50, WO2008090912 compounds OC-7 to OC-36 and the polymers of Mo-42 to Mo-51, JP2008084913 H-1 to H-70, WO2007077810 compounds 1 to 44, preferably 1, 2, 4-6, 8, 19-22, 26, 28-30, 32, 36, 39-44, WO201001830 the polymers of monomers 1-1 to 1-9, preferably of 1-3, 1-7, and 1-9, WO2008029729 the (polymers of) compounds 1-1 to 1-36, WO20100443342 HS-1 to HS-101 and BH-1 to BH-17, preferably BH-1 to BH-17, JP2009182298 the (co)polymers based on the monomers 1 to 75, JP2009170764, JP2009135183 the (co)polymers based on the monomers 1-14, WO2009063757 preferably the (co)polymers based on the monomers 1-1 to 1-26, WO2008146838 the compounds a-1 to a-43 and 1-1 to 1-46, JP2008207520 the (co)polymers based on the monomers 1-1 to 1-26, JP2008066569 the (co)polymers based on the monomers 1-1 to 1-16, WO2008029652 the (co)polymers based on the monomers 1-1 to 1-52, WO2007114244 the (co)polymers based on the monomers 1-1 to 1-18, JP2010040830 the compounds HA-1 to HA-20, HB-1 to HB-16, HC-1 to HC-23 and the (co)polymers based on the monomers HD-1 to HD-12, JP2009021336, WO2010090077 the compounds 1 to 55, WO2010079678 the compounds H1 to H42, WO2010067746, WO2010044342 the compounds HS-1 to HS-101 and Poly-1 to Poly-4, JP2010114180 the compounds PH-1 to PH-36, US2009284138 the compounds 1 to 111 and H1 to H71, WO2008072596 the compounds 1 to 45, JP2010021336 the compounds H-1 to H-38, preferably H-1, WO2010004877 the compounds H-1 to H-60, JP2009267255 the compounds 1-1 to 1-105, WO2009104488 the compounds 1-1 to 1-38, WO2009086028, US2009153034, US2009134784, WO2009084413 the compounds 2-1 to 2-56, JP2009114369 the compounds 2-1 to 2-40, JP2009114370 the compounds 1 to 67, WO2009060742 the compounds 2-1 to 2-56, WO2009060757 the compounds 1-1 to 1-76, WO2009060780 the compounds 1-1 to 1-70, WO2009060779 the compounds 1-1 to 1-42, WO2008156105 the compounds 1 to 54, JP2009059767 the compounds 1 to 20, JP2008074939 the compounds 1 to 256, JP2008021687 the compounds 1 to 50, WO2007119816 the compounds 1 to 37, WO2010087222 the compounds H-1 to H-31, WO2010095564 the compounds HOST-1 to HOST-61, WO2007108362, WO2009003898, WO2009003919, WO2010040777, US2007224446, WO06128800, WO2012014621, WO2012105310, WO2012/130709 and European patent applications EP12175635.7 and EP12185230.5. and EP12191408.9 (in particular page 25 to 29 of EP12191408.9).

The above-mentioned small molecules are more preferred than the above-mentioned (co)polymers of the small molecules.

Further suitable host materials, are described in WO2011137072 (for example,

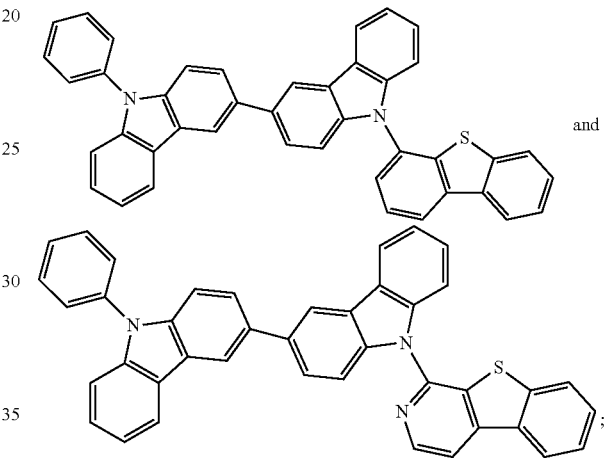

and best results are achieved if said compounds are combined with

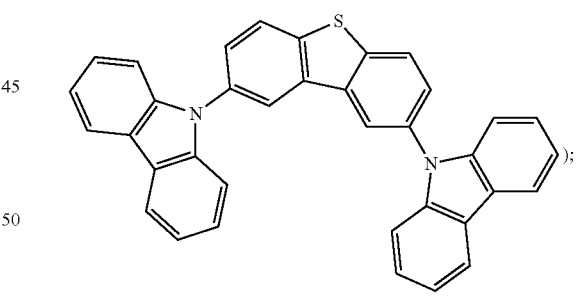

WO2012048266 (for example,

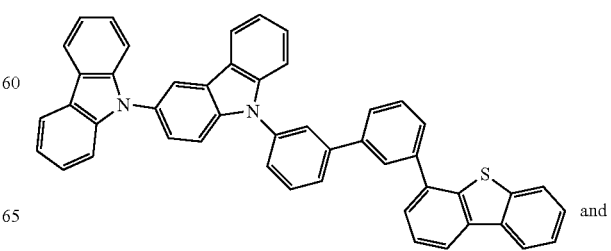

and

WO2012162325 (for example,

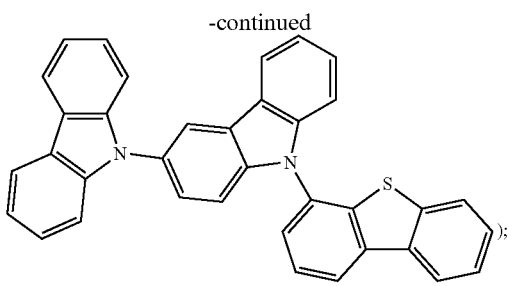

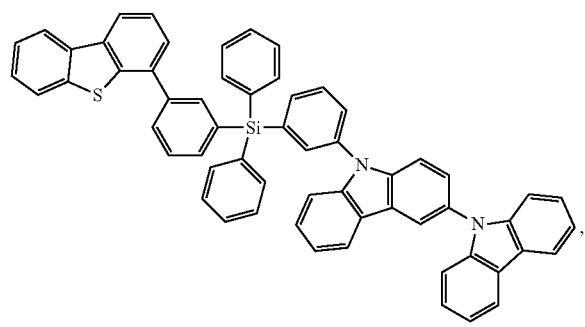

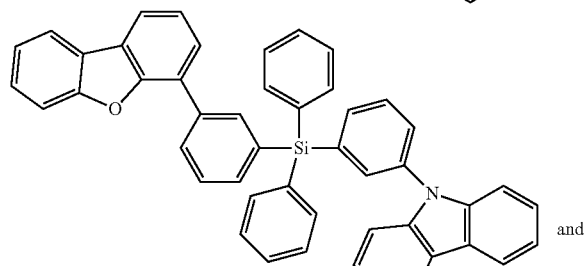

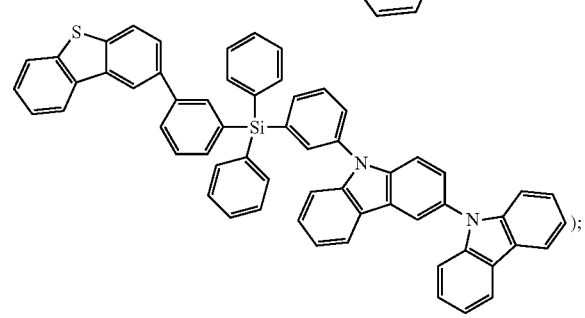

and EP2551932 (for example,

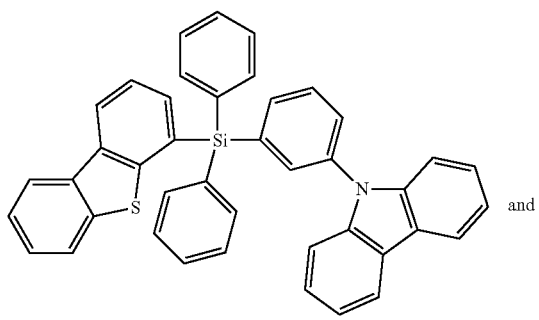

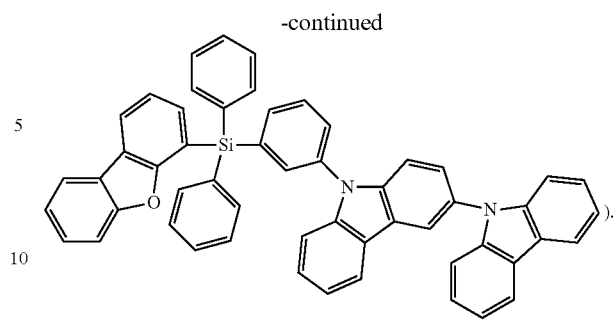

In a particularly preferred embodiment, one or more compounds of the general formula (X) specified hereinafter are used as host material.

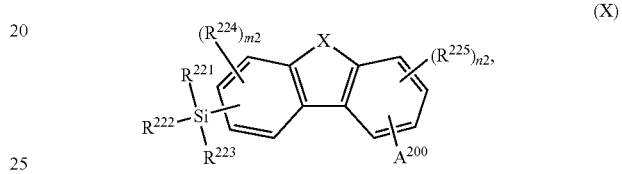

(X)

wherein
X is NR, S, O or PR*;
R* is aryl, heteroaryl, alkyl, cycloalkyl, or heterocycloalkyl;
$A^{200}$ is $-NR^{206}R^{207}$, $-P(O)R^{208}R^{209}$, $-PR^{210}R^{211}$, $-S(O)_2R^{212}$, $-S(O)R^{213}$, $-SR^{214}$, or $-OR^{215}$;
$R^{221}$, $R^{222}$ and $R^{223}$ are independently of each other aryl, heteroaryl, alkyl, cycloalkyl, or heterocycloalkyl, wherein at least on of the groups $R^{221}$, $R^{222}$, or $R^{223}$ is aryl, or heteroaryl;
$R^{224}$ and $R^{225}$ are independently of each other alkyl, cycloalkyl, heterocycloalkyl, aryl, heteroaryl, a group $A^{200}$, or a group having donor, or acceptor characteristics;
n2 and m2 are independently of each other 0, 1, 2, or 3;
$R^{206}$ and $R^{207}$ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and
$R^{208}$, $R^{209}$, $R^{210}$, $R^{211}$, $R^{212}$, $R^{213}$, $R^{214}$ and $R^{215}$ are independently of each other aryl, heteroaryl, alkyl, cycloalkyl, or heterocycloalkyl. Compounds of formula X, such as, for example, (SH-4)

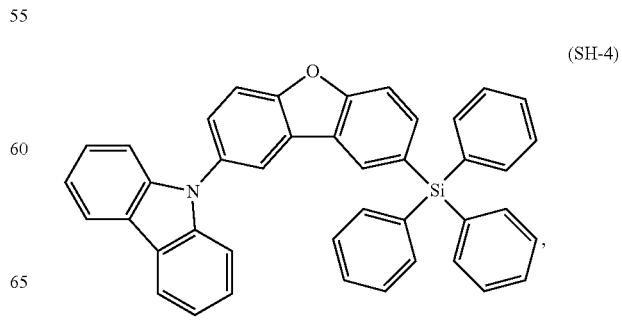

(SH-5)
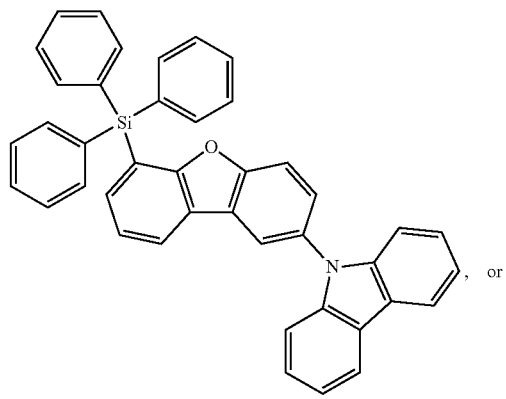
, or
(SH-6)
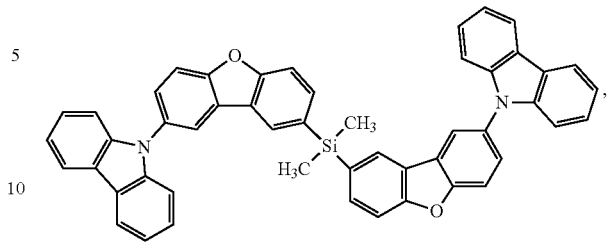
,
are described in WO2010079051 (in particular pages on 19 to 26 and in tables on pages 27 to 34, pages 35 to 37 and pages 42 to 43).
Additional host materials on basis of dibenzofurane are, for example, described in US2009066226, EP1885818B1, EP1970976, EP1998388 and EP2034538. Examples of particularly preferred host materials are shown below:
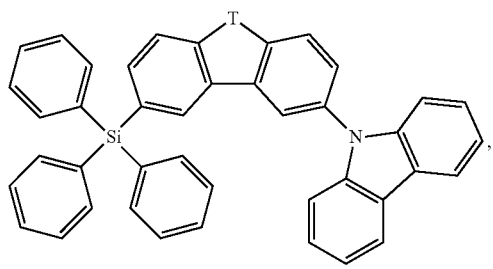
,
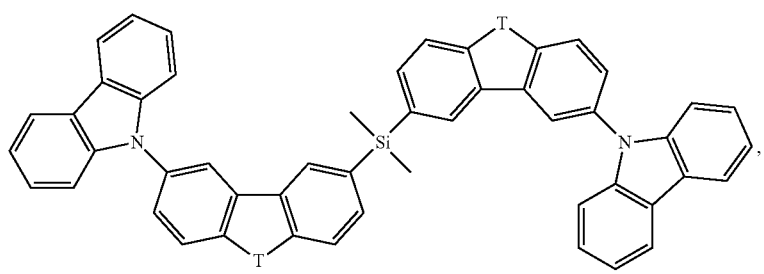
,
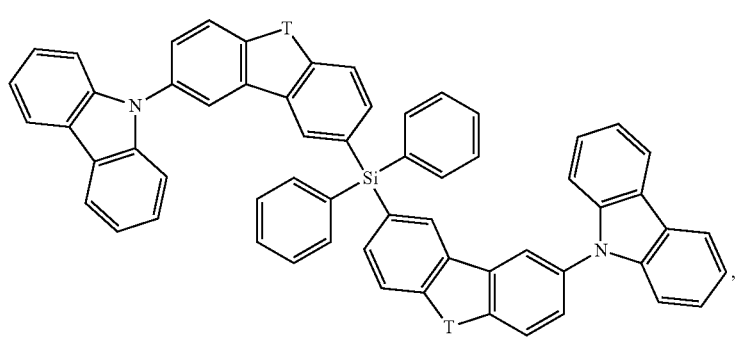
, -continued
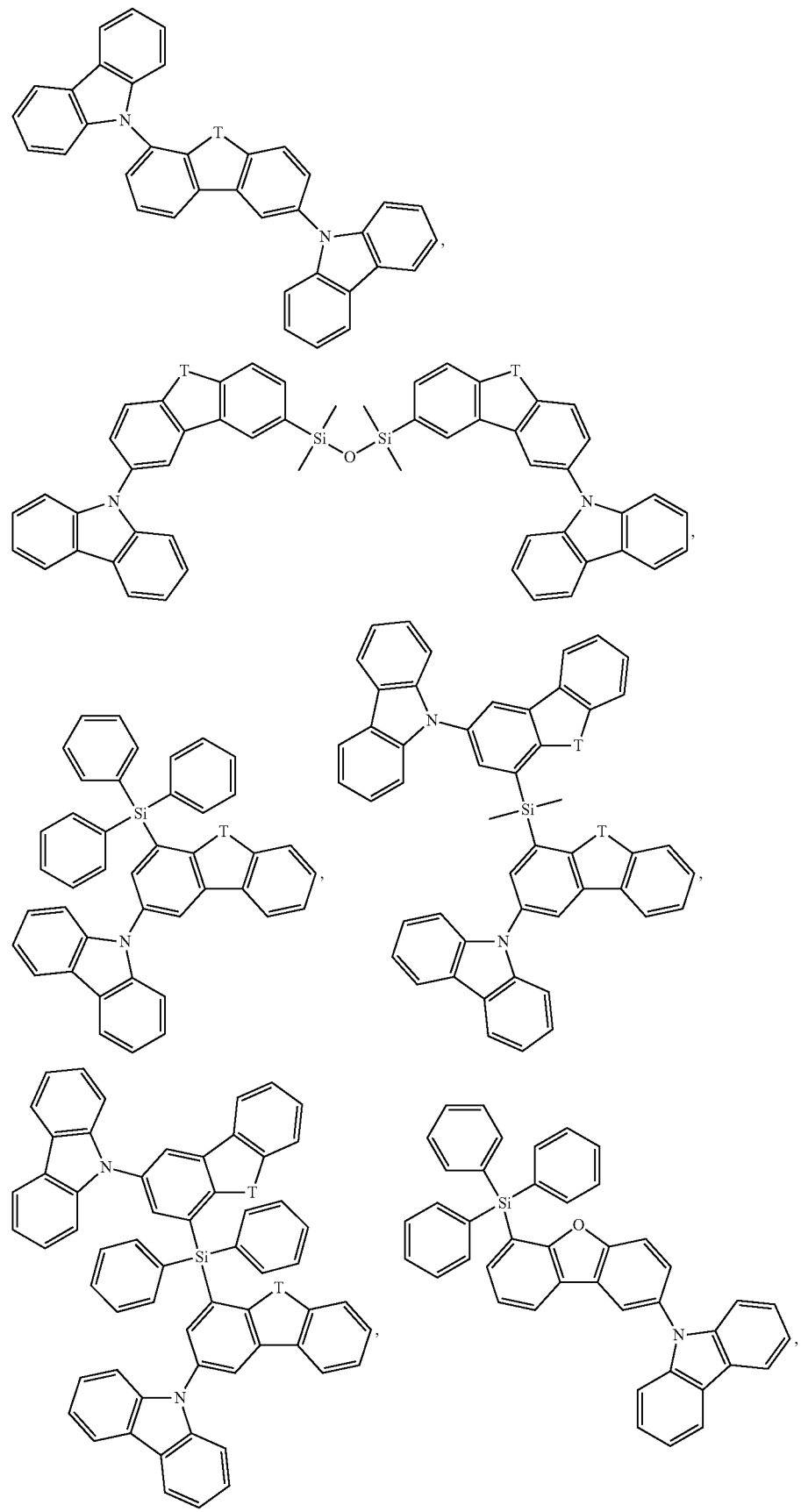

-continued
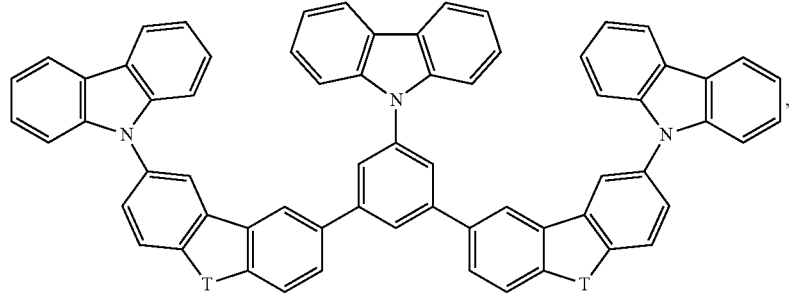
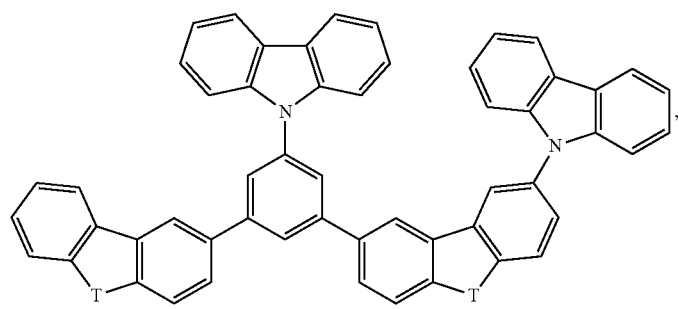
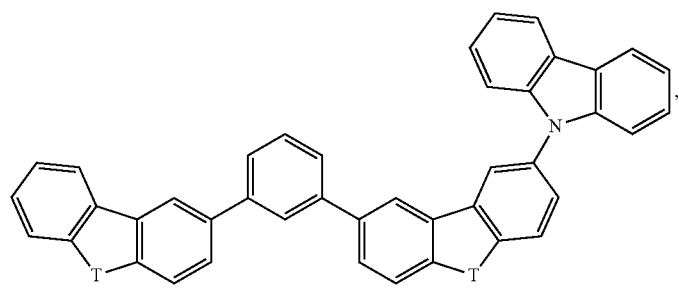
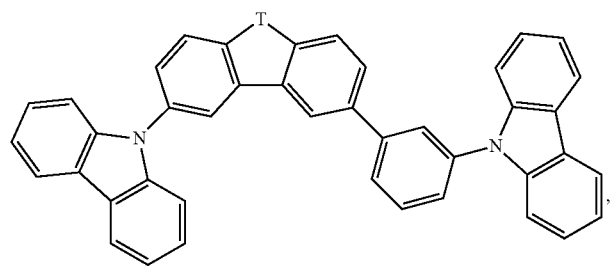
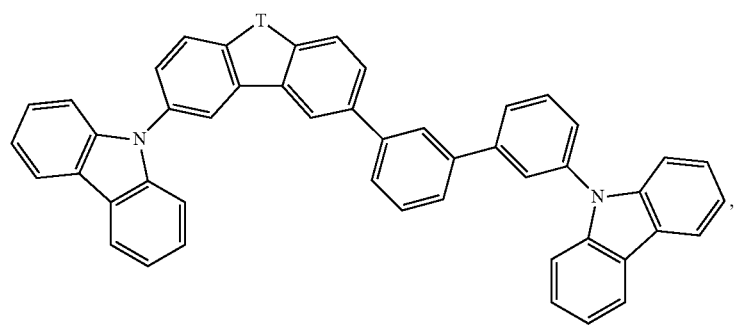

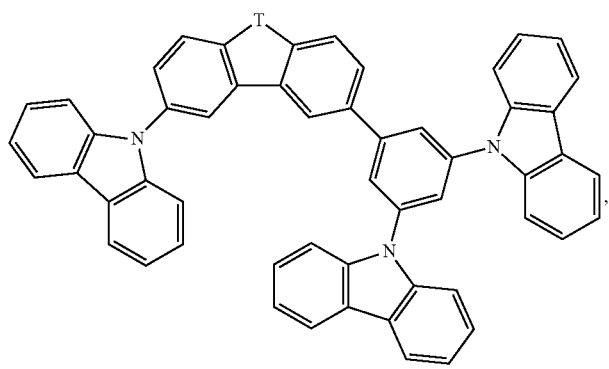
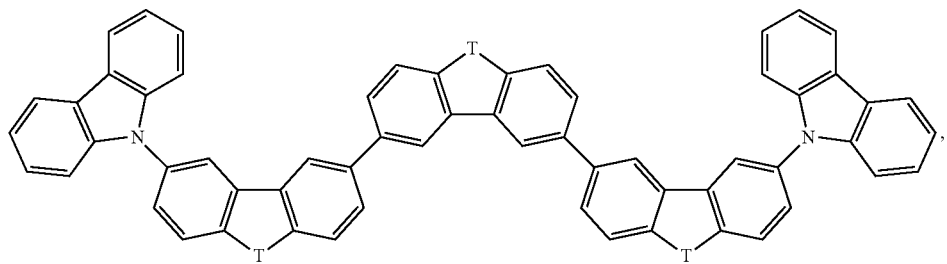
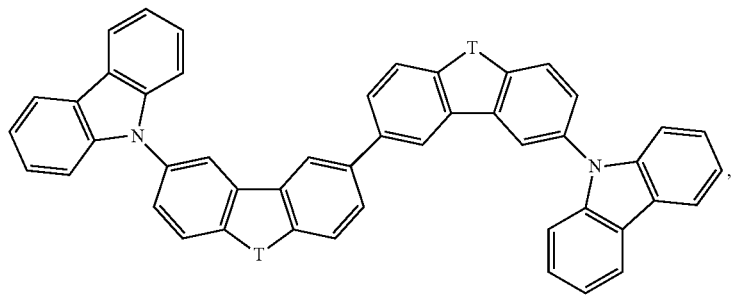
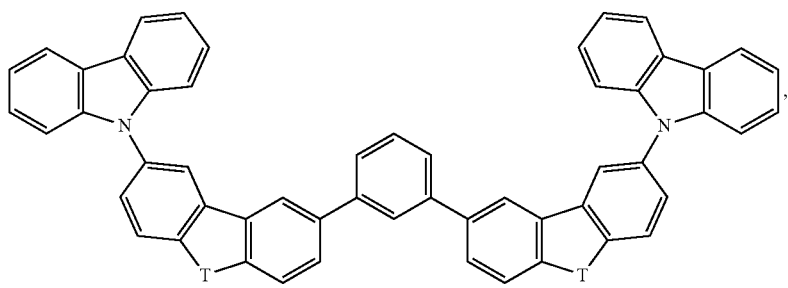
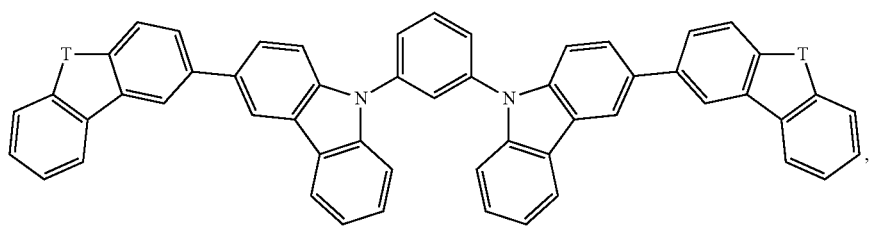

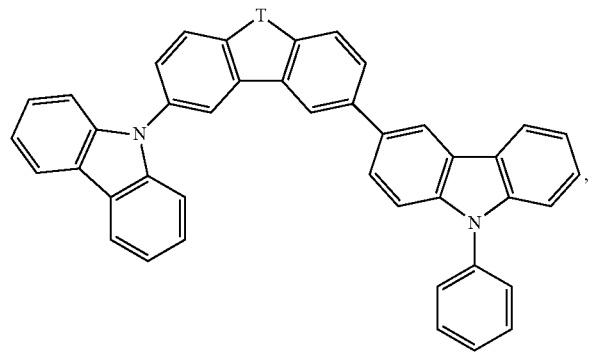
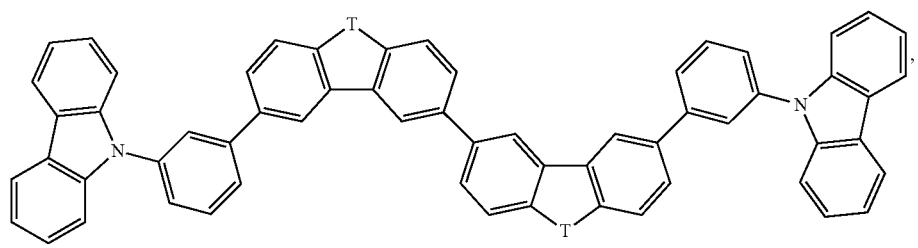
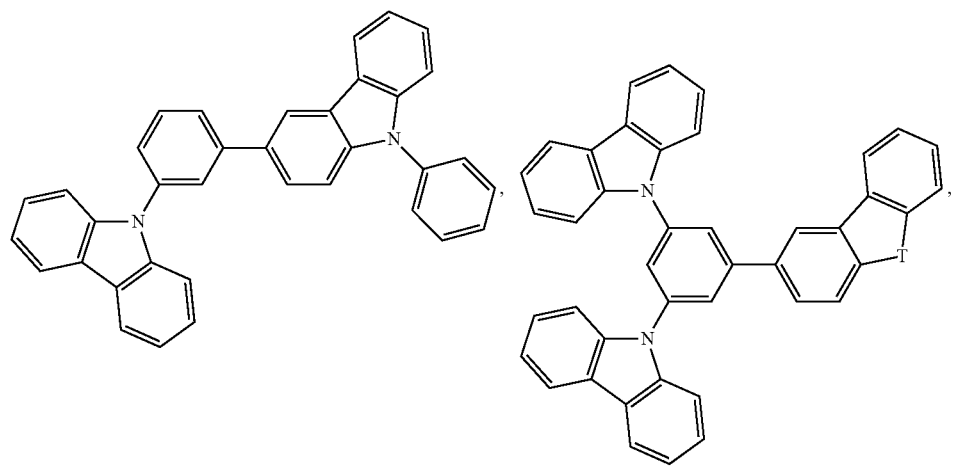
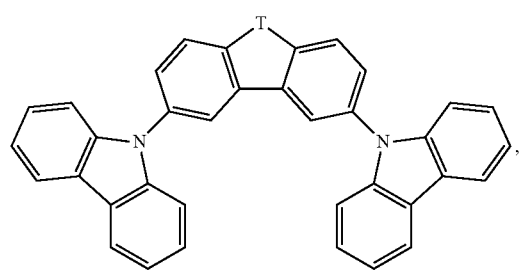
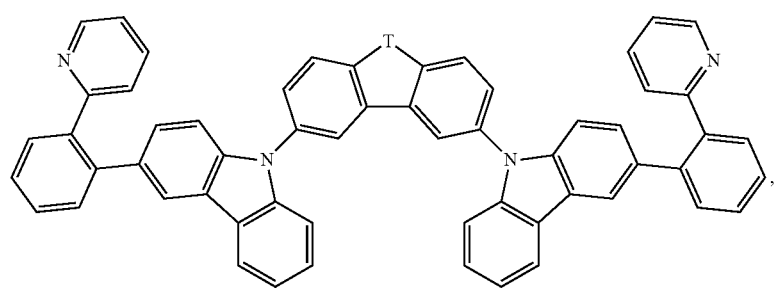

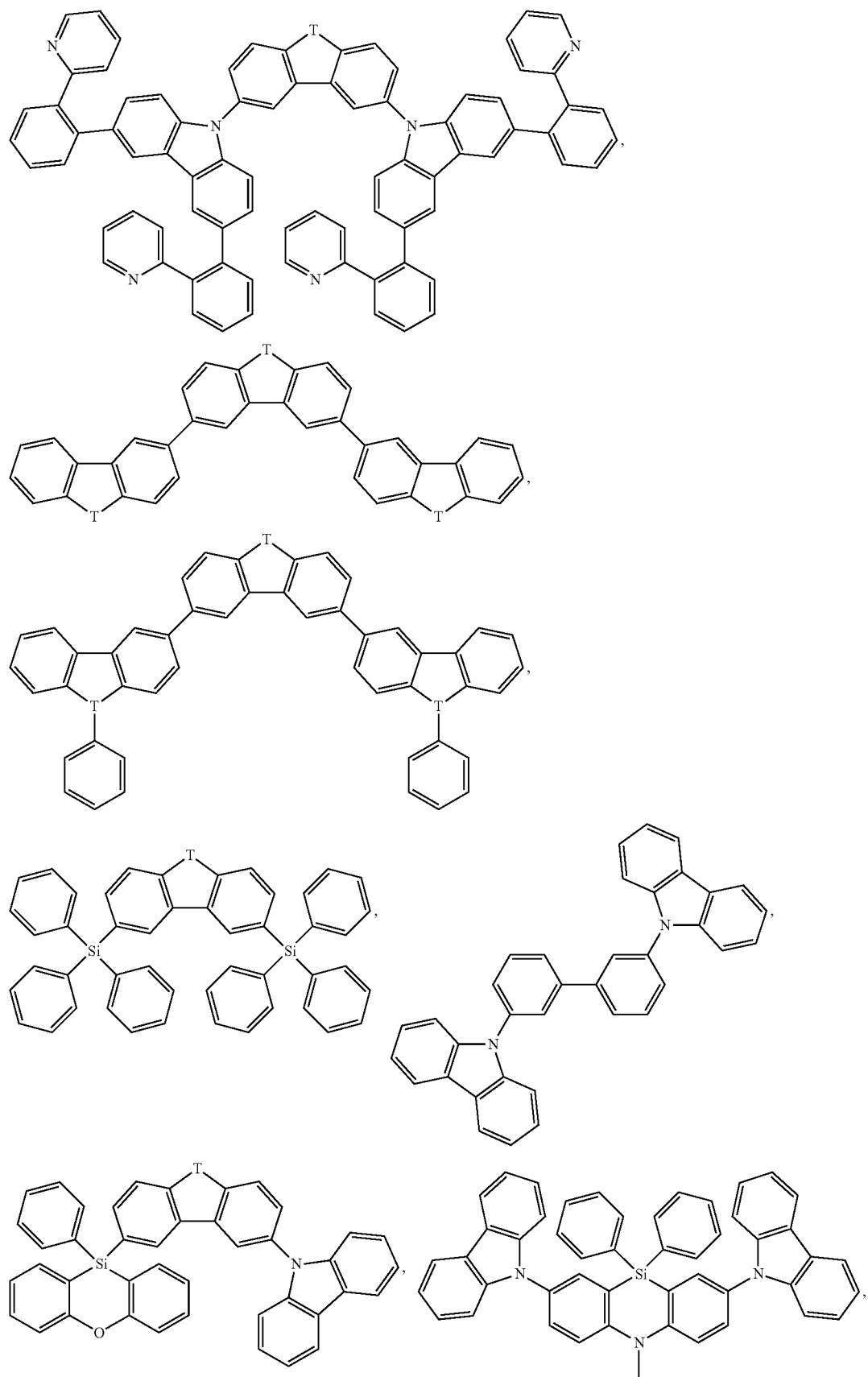

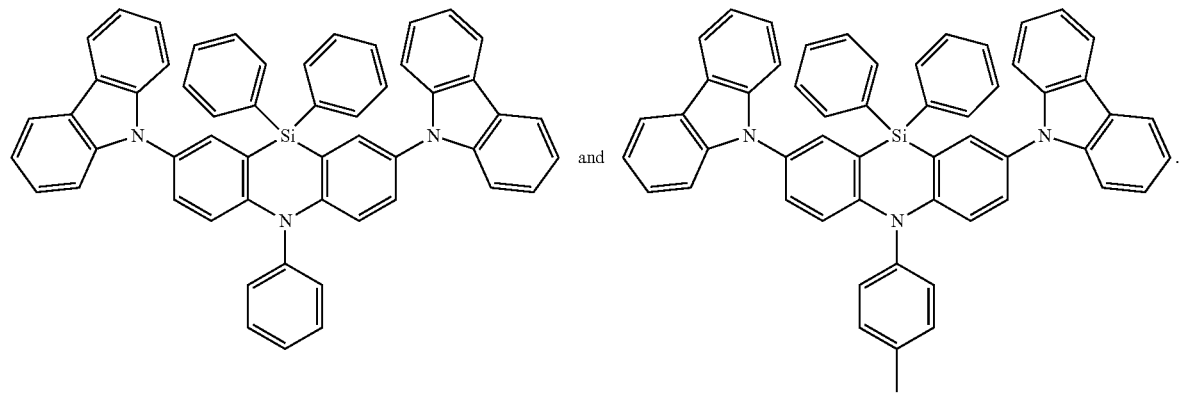

and

In the above-mentioned compounds T is O, or S, preferably O. If T occurs more than one time in a molecule, all groups T have the same meaning. Compounds SH-1 to SH-11 shown in claim 12 are most preferred.

The Fluorescent Emitter (=Acceptor):

The fluorescent emitter is preferably selected from the following: styrylamine derivatives, indenofluorene derivatives, polyaromatic compounds, anthracene derivatives, tetracene derivatives, xanthene derivatives, perylene derivatives, phenylene derivatives, fluorene derivatives, arylpyrene derivatives, arylenevinylene derivatives, rubrene derivatives, coumarine derivatives, rhodamine derivatives, quinacridone derivatives, dicyanomethylenepyran derivatives, thiopyran, polymethine derivatives, pyrylium and thiapyrylium salts, periflanthene derivatives, indenoperylene derivatives, bis(azinyl)imineboron compounds, bis(azinyl)methine compounds, carbostyryl compounds, monostyrylamines, distyrylamines, tristyrylamines, tetrastyrylamines, styrylphosphines, styryl ethers, arylamines, indenofluorenamines and indenofluorenediamines, benzoindenofluorenamines, benzoindenofluorenediamines, dibenzoindenofluorenamines, dibenzoindenofluorenediamines, substituted or unsubstituted tristilbenamines, distyrylbenzene and distyrylbiphenyl derivatives, triarylamines, triazolo derivatves, naphthalene derivatives, anthracene derivatives, tetracene derivatives, fluorene derivatives, periflanthene derivatives, indenoperylene derivatives, phenanthrene derivatives, perylene derivatives, pyrene derivatives, triazine derivatives, chrysene derivatives, decacyclene derivatives, coronene derivatives, tetraphenylcyclopentadiene derivatives, pentaphenylcyclopentadiene derivatives, fluorene derivatives, spirofluorene derivatives, pyran derivatives, oxazone derivatives, benzoxazole derivatives, benzothiazole derivatives, benzimidazole derivatives, pyrazine derivatives, cinnamic acid esters, diketopyrrolopyrrole derivatives, and acridone derivatives.

Fluorescent emitter compounds can preferably be polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imineboron compounds (US 2007/0092753 A1), bis(azinyl)methene compounds and carbostyryl compounds.

Furthermore preferred fluorescent emitter compounds can be emitters which are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

A monostyrylamine here is a compound which contains one substituted or unsubstituted styryl group and at least one, preferably aromatic, amine. A distyrylamine is preferably a compound which contains two substituted or unsubstituted styryl groups and at least one, preferably aromatic, amine. A tristyrylamine is preferably a compound which contains three substituted or unsubstituted styryl groups and at least one, preferably aromatic, amine. A tetrastyrylamine is preferably a compound which contains four substituted or unsubstituted styryl groups and at least one, preferably aromatic, amine. The styryl group is particularly preferably a stilbene, which may be further substituted. The corresponding phosphines and ethers which can be employed in accordance with the invention are defined analogously to the amines. For the purposes of this invention, arylamine or aromatic amine denotes a compound which contains three substituted or unsubstituted aromatic or heteroaromatic ring systems bonded directly to a nitrogen atom. At least one of these aromatic or heteroaromatic ring systems can be a condensed ring. Preferred examples thereof are aromatic anthracenamines, aromatic anthracenediamines, aromatic pyrenamines, aromatic pyrenediamines, aromatic chrysenamines and aromatic chrysenediamines. An aromatic anthracenamine can be a compound in which one diarylamine group is bonded directly to an anthracene group, preferably in position 9. An aromatic anthracenediamine can be a compound in which two diarylamine groups are bonded directly to an anthracene group, preferably in positions 9 and 10. Aromatic pyrenamines, pyrenediamines, chrysenamines and chrysenediamines are defined analogously thereto, in which the diarylamine groups on the pyrene are preferably bonded in position 1 or in positions 1 and 6.

Furthermore preferred fluorescent emitter compounds are indenofluorenamines and indenofluorenediamines, for example in accordance with WO 2006/122630, benzoindenofluorenamines and benzoindenofluorenediamines, for example in accordance with WO 2008/006449, and dibenzoindenofluorenamines and dibenzoindenofluorenediamines, for example in accordance with WO 2007/140847.

Examples of further fluorescent emitter compounds from the class of the styrylamines which can be employed in accordance with the invention are substituted or unsubstituted tristilbenamines or those described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines can be found in US 2007/0122656 A1. Particularly preferred styrylamines and triarylamines are the compounds of the formulae (183) to (188) and those which are disclosed in U.S. Pat. No. 7,250,532 B2, DE 102005058557 A1, CN 1583691 A, JP 08053397 A, U.S. Pat. No. 6,251,531 B1, and US 2006/210830 A.

Furthermore preferred fluorescent emitter compounds can be taken from the group of the triarylamines as disclosed in EP 1957606 A1 and US 2008/0113101 A1.

Furthermore preferred fluorescent emitter compounds can be selected from the derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, the 9,10-substituted anthracenes, such as, for example, 9,10-diphenylanthracene and 9,10-bis(phenylethynyl) anthracene, are preferred. 1,4-Bis(9'-ethynylanthracenyl)benzene may also be preferred as fluorescent emitter compound.

Suitable fluorescent emitter units are furthermore the structures depicted in the following table, and the structures disclosed in JP06001973, WO2004047499, WO200505950, WO2006098080, WO2006114337, WO 2007065678, US 20050260442, WO 2004092111, US2006251925, WO2007003520, WO2011040607; WO2011059099; WO2011090149, WO2011043083, WO2011086941; WO2011086935; JP 002001052870, EP373582, WO2006128800, WO2006/000388, WO2006/000389, WO06025273, WO2006/058737, WO2006/098080, WO2007/065549, WO2007/140847, WO2008/006449, WO2008/059713, WO2008/006449, WO2010122810, WO2011/052186, WO2013/185871, WO2014/037077, US2012/181520, KR2011/0041725, KR2011/0041728, KR2012/0011336, KR2012/0052499, KR2012/0074722 and KR2013/0110347.

Selection Criteria for Fluorescent Acceptors
i) Spectral Overlap 1-3% emission intensity, relative to the 100% emission maximum, is used to determine the emission onset. For efficient energy transfer the emission onset of the fluorescent emitter (acceptor) should be red-shifted with respect to the emission onset of the luminescent organometallic complex (donor) by 0 to 50 nm. Therefore all fluorescent emitters fulfilling this requirement with respect to luminescent organometallic complex X are suitable as fluorescent emitter in this invention.

ii) Avoiding $T_1$-Transfer

An important loss channel regarding quantum efficiency can be due to direct transfer of $T_1$-excitons from the donor molecule to the fluorescent acceptor. Although a significant singlet population in the donor systems described above is expected, still some triplet population will be present. Triplet-transfer according to the Dexter-mechanism (D. L. Dexter, J. Chem. Phys., 21, 836 (1953)) is a short range process based on electron exchange mechanism between donor and acceptor. For an exchange interaction to be large a good overlap between the HOMOs of the donor and acceptor and simultaneously the overlap of the LUMOs of the donor and acceptor is required. To make this unwanted process as unlikely as possible, spatial separation of HOMO and LUMO on the acceptor should be achieved. Standard quantum chemical calculations (DFT) can give a clear guidance here. For example, the orbital structure of FE-7 is spatially separated and the orbital structure of FE-1 is delocalized according to BP86/SV(P)-level of theory.

Another option is the sterical shielding of the acceptor chromophor to avoid any good overlap between donor and acceptor. FE-2 uses this concept to partly compensate for the lack of spatially separated HOMO/LUMO.

Examples of the fluorescent emitter, which can be advantageously be used according to the present invention are shown below:

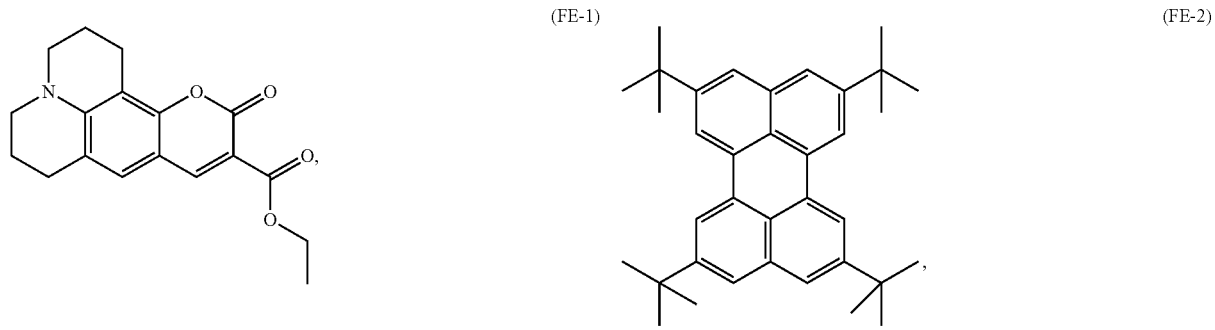

-continued
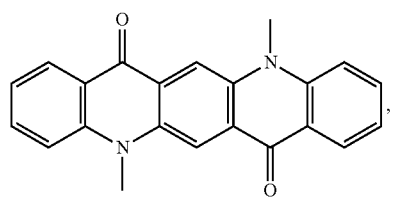
(FE-3)
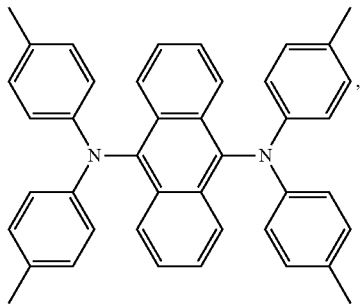
(FE-4)
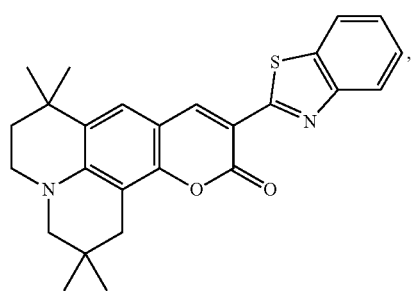
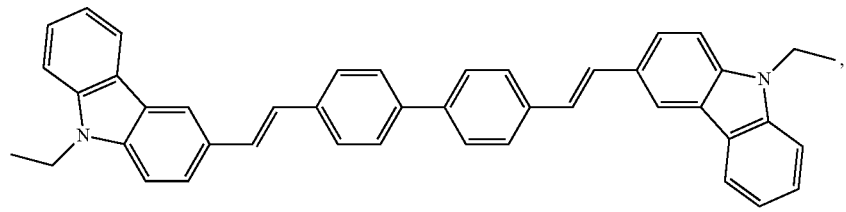
(FE-5)
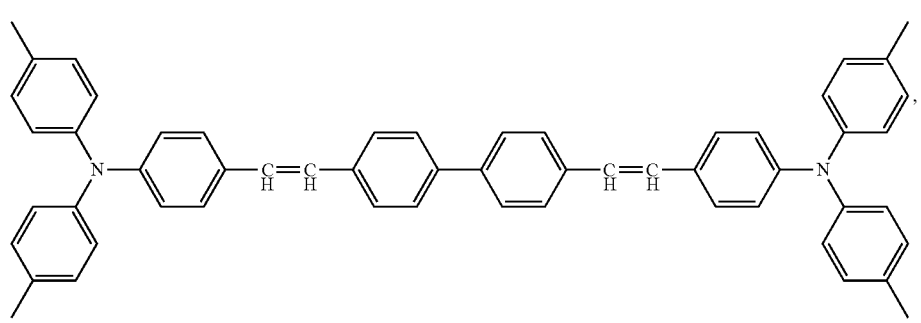
(FE-6)
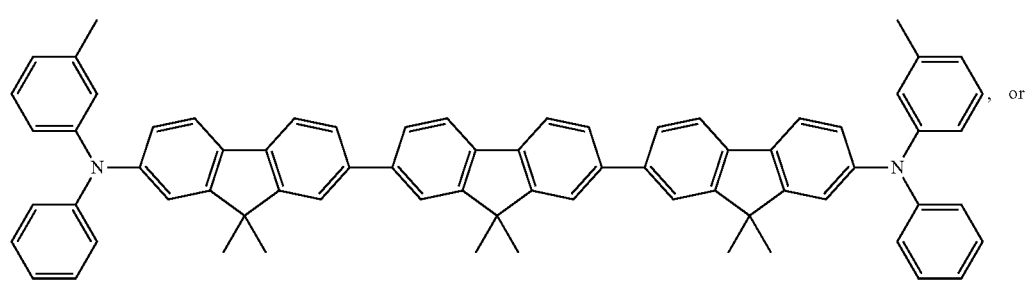
(FE-7)
(FE-8)
, or

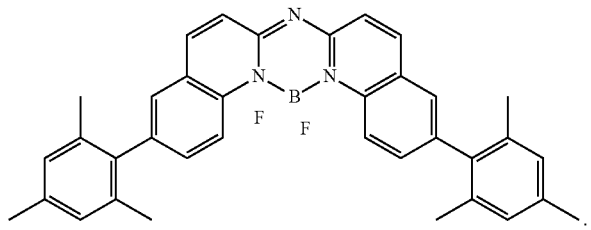

(FE-9)

The fluorescent emitters are commercially available at Luminescence Technology Corp. (Lumtec). The fluorescent emitters (FE-3) and (FE-4) can advantageously be used with iridium complexes of formula (XIa) and (XIb) as well as iridium complex (BE-26). The fluorescent emitter (FE-5) can advantageously be used with iridium complex (BE-26). The fluorescent emitters (FE-1), (FE-2), (FE-6), (FE-7), (FE-8) and (FE-9) can advantageously be used with iridium complexes of formula (XIc).

The fluorescent emitters (FE-2) and (FE-7) are preferred, the fluorescent emitter (FE-7) is most preferred.

In a particularly preferred embodiment the emitting layer comprises
20 to 40% by weight of the luminescent organometallic complex X,
0.1 to 3.0% by weight of the fluorescent emitter Y and
79.9 to 57.0% by weight of a host compound(s), wherein the amount of the organometallic complex X, the fluorescent emitter Y and the host compound(s) adds up to a total of 100% by weight.

The host compound can be one compound or it can be a mixture of two or more compounds. Advantageously compounds HTM-1 and HTM-2 may be added as co-host.

The preferred combinations of host compound(s), luminescent organometallic complex X and fluorescent emitter Y used in the emitting layer are shown in the tables below:

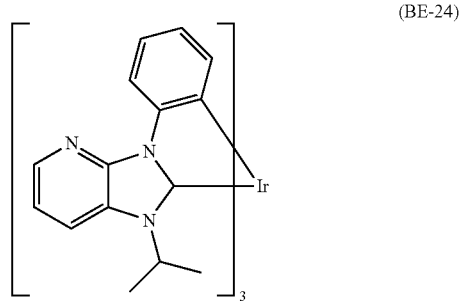

(BE-24)

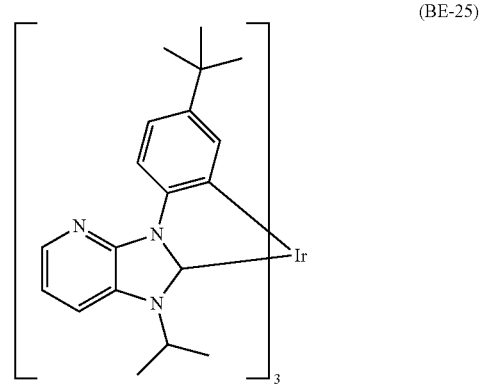

(BE-25)

| Device | 1st Host | 2nd Host | Organom. Comp. | Fluorescent Emitter |
|---|---|---|---|---|
| 1a | SH-4 | | BE-24 | FE-6 |
| 1a | SH-4 | | BE-24 | FE-2 |
| 3a | SH-4 | | BE-24 | FE-7 |
| 4a | SH-4 | | BE-24 | FE-8 |
| 5a | SH-4 | | BE-24 | FE-9 |
| 6a | SH-4 | | BE-24 | FE-1 |
| 7a | SH-5 | | BE-24 | FE-6 |
| 8a | SH-5 | | BE-24 | FE-2 |
| 9a | SH-5 | | BE-24 | FE-7 |
| 10a | SH-5 | | BE-24 | FE-8 |
| 11a | SH-5 | | BE-24 | FE-9 |
| 12a | SH-5 | | BE-24 | FE-1 |
| 13a | SH-11 | | BE-24 | FE-1 |
| 14a | SH-11 | | BE-24 | FE-2 |
| 15a | SH-11 | | BE-24 | FE-6 |
| 16a | SH-11 | | BE-24 | FE-7 |
| 17a | SH-11 | | BE-24 | FE-8 |
| 18a | SH-11 | | BE-24 | FE-9 |
| 19a | SH-11 | HTM-1 | BE-24 | FE-1 |
| 20a | SH-5 | HTM-1 | BE-24 | FE-6 |
| 21a | SH-5 | HTM-1 | BE-24 | FE-2 |
| 22a | SH-5 | HTM-1 | BE-24 | FE-7 |
| 23a | SH-5 | HTM-1 | BE-24 | FE-8 |
| 24a | SH-5 | HTM-1 | BE-24 | FE-9 |
| 25a | SH-5 | HTM-2 | BE-24 | FE-6 |
| 26a | SH-5 | HTM-2 | BE-24 | FE-2 |
| 27a | SH-5 | HTM-2 | BE-24 | FE-7 |
| 28a | SH-5 | HTM-2 | BE-24 | FE-8 |
| 29a | SH-5 | HTM-2 | BE-24 | FE-9 |

| Device | 1st Host | 2nd Host | Organom. Comp. | Fluorescent Emitter |
|---|---|---|---|---|
| 1b | SH-4 | | BE-25 | FE-6 |
| 2b | SH-4 | | BE-25 | FE-2 |
| 3b | SH-4 | | BE-25 | FE-7 |
| 4b | SH-4 | | BE-25 | FE-8 |
| 5b | SH-4 | | BE-25 | FE-8 |
| 6b | SH-4 | | BE-25 | FE-1 |
| 7b | SH-5 | | BE-25 | FE-1 |
| 8b | SH-5 | | BE-25 | FE-2 |
| 9b | SH-5 | | BE-25 | FE-6 |
| 10b | SH-5 | | BE-25 | FE-7 |

-continued

| Device | 1st Host | 2nd Host | Organom. Comp. | Fluorescent Emitter |
|---|---|---|---|---|
| 11b | SH-5 |  | BE-25 | FE-8 |
| 12b | SH-5 |  | BE-25 | FE-9 |
| 13b | SH-11 |  | BE-25 | FE-1 |
| 14b | SH-11 |  | BE-25 | FE-2 |
| 15b | SH-11 |  | BE-25 | FE-6 |
| 16b | SH-11 |  | BE-25 | FE-7 |
| 17b | SH-11 |  | BE-25 | FE-8 |
| 18b | SH-11 |  | BE-25 | FE-9 |
| 19b | SH-5 | HTM-1 | BE-25 | FE-1 |
| 20b | SH-5 | HTM-1 | BE-25 | FE-2 |
| 21b | SH-5 | HTM-1 | BE-25 | FE-6 |
| 22b | SH-5 | HTM-1 | BE-25 | FE-7 |
| 23b | SH-5 | HTM-1 | BE-25 | FE-8 |
| 24b | SH-5 | HTM-1 | BE-25 | FE-9 |
| 25b | SH-5 | HTM-2 | BE-25 | FE-1 |
| 26b | SH-5 | HTM-2 | BE-25 | FE-2 |
| 27b | SH-5 | HTM-2 | BE-25 | FE-6 |
| 28b | SH-5 | HTM-2 | BE-25 | FE-7 |
| 29b | SH-5 | HTM-2 | BE-25 | FE-8 |
| 30b | SH-5 | HTM-2 | BE-25 | FE-9 |

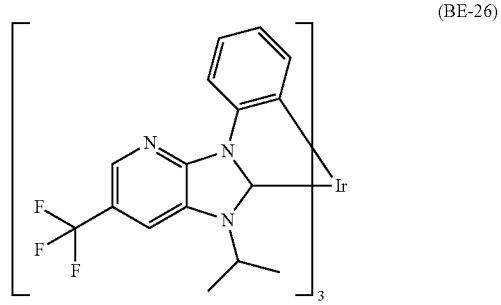

(Cu-1)

| Device | 1st Host | 2nd Host | Organom. Comp. | Fluorescent Emitter |
|---|---|---|---|---|
| 1c | SH-4 |  | Cu-1 | FE-1 |
| 2c | SH-4 |  | Cu-1 | FE-2 |
| 3c | SH-4 |  | Cu-1 | FE-6 |
| 4c | SH-4 |  | Cu-1 | FE-7 |
| 5c | SH-4 |  | Cu-1 | FE-8 |
| 6c | SH-4 |  | Cu-1 | FE-9 |
| 7c | SH-5 |  | Cu-1 | FE-1 |
| 8c | SH-5 |  | Cu-1 | FE-6 |
| 9c | SH-5 |  | Cu-1 | FE-2 |
| 10c | SH-5 |  | Cu-1 | FE-7 |
| 11c | SH-5 |  | Cu-1 | FE-8 |
| 12c | SH-5 |  | Cu-1 | FE-9 |
| 13c | SH-11 |  | Cu-1 | FE-6 |
| 14c | SH-11 |  | Cu-1 | FE-2 |
| 15c | SH-11 |  | Cu-1 | FE-7 |
| 16c | SH-11 |  | Cu-1 | FE-8 |
| 17c | SH-11 |  | Cu-1 | FE-9 |
| 18c | SH-11 |  | Cu-1 | FE-1 |
| 19c | SH-5 | HTM-1 | Cu-1 | FE-1 |
| 20c | SH-5 | HTM-1 | Cu-1 | FE-6 |
| 21c | SH-5 | HTM-1 | Cu-1 | FE-2 |
| 22c | SH-5 | HTM-1 | Cu-1 | FE-7 |
| 23c | SH-5 | HTM-1 | Cu-1 | FE-8 |
| 24c | SH-5 | HTM-1 | Cu-1 | FE-9 |
| 25c | SH-5 | HTM-2 | Cu-1 | FE-6 |

-continued

| Device | 1st Host | 2nd Host | Organom. Comp. | Fluorescent Emitter |
|---|---|---|---|---|
| 26c | SH-5 | HTM-2 | Cu-1 | FE-2 |
| 27c | SH-5 | HTM-2 | Cu-1 | FE-7 |
| 28c | SH-5 | HTM-2 | Cu-1 | FE-8 |
| 29c | SH-5 | HTM-2 | Cu-1 | FE-9 |

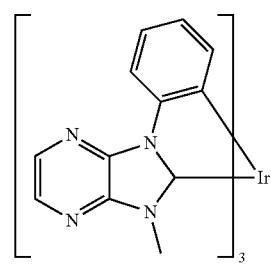

(BE-26)

| Device | 1st Host | 2nd Host | Organom. Comp. | Fluorescent Emitter |
|---|---|---|---|---|
| 1d | SH-1 |  | BE-26 | FE-3 |
| 2d | SH-1 |  | BE-26 | FE-4 |
| 3d | SH-1 |  | BE-26 | FE-5 |
| 4d | SH-2 |  | BE-26 | FE-3 |
| 5d | SH-2 |  | BE-26 | FE-4 |
| 6d | SH-2 |  | BE-26 | FE-5 |
| 7d | SH-3 |  | BE-26 | FE-3 |
| 8d | SH-3 |  | BE-26 | FE-4 |
| 9d | SH-3 |  | BE-26 | FE-5 |
| 10d | SH-4 |  | BE-26 | FE-3 |
| 11d | SH-4 |  | BE-26 | FE-4 |
| 12d | SH-4 |  | BE-26 | FE-5 |
| 13d | SH-5 |  | BE-26 | FE-3 |
| 14d | SH-5 |  | BE-26 | FE-4 |
| 15d | SH-5 |  | BE-26 | FE-5 |
| 16d | SH-11 |  | BE-26 | FE-3 |
| 17d | SH-11 |  | BE-26 | FE-4 |
| 18d | SH-11 |  | BE-26 | FE-5 |
| 19d | SH-5 | HTM-1 | BE-26 | FE-3 |
| 20d | SH-5 | HTM-1 | BE-26 | FE-4 |
| 21d | SH-5 | HTM-1 | BE-26 | FE-5 |
| 22d | SH-5 | HTM-2 | BE-26 | FE-3 |
| 23d | SH-5 | HTM-2 | BE-26 | FE-4 |
| 24d | SH-5 | HTM-2 | BE-26 | FE-5 |

(BE-3)

| Device | 1st Host | 2nd Host | Organom. Comp. | Fluorescent Emitter |
|---|---|---|---|---|
| 1e | SH-1 | | BE-3 | FE-3 |
| 2e | SH-1 | | BE-3 | FE-4 |
| 3e | SH-1 | HTM-1 | BE-3 | FE-3 |
| 4e | SH-2 | | BE-3 | FE-3 |
| 5e | SH-2 | | BE-3 | FE-4 |
| 6e | SH-2 | HTM-2 | BE-3 | FE-4 |
| 7e | SH-3 | | BE-3 | FE-3 |
| 8e | SH-3 | | BE-3 | FE-4 |
| 9e | SH-3 | HTM-2 | BE-3 | FE-3 |
| 10e | SH-4 | | BE-3 | FE-3 |
| 11e | SH-4 | | BE-3 | FE-4 |
| 12e | SH-4 | HTM-1 | BE-3 | FE-4 |
| 13e | SH-5 | | BE-3 | FE-3 |
| 14e | SH-5 | | BE-3 | FE-4 |
| 15e | SH-5 | HTM-1 | BE-3 | FE-3 |
| 16e | SH-5 | HTM-2 | BE-3 | FE-3 |
| 17e | SH-5 | HTM-1 | BE-3 | FE-4 |
| 18e | SH-5 | HTM-2 | BE-3 | FE-4 |

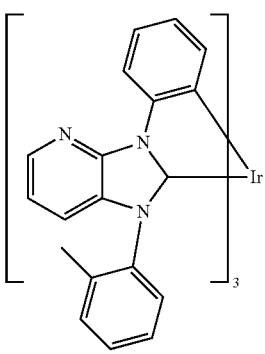

(BE-38)

| Device | 1st Host | 2nd Host | Organom. Comp. | Fluorescent Emitter |
|---|---|---|---|---|
| 1f | SH-4 | | BE-38 | FE-6 |
| 2f | SH-4 | | BE-38 | FE-2 |
| 3f | SH-4 | | BE-38 | FE-7 |
| 4f | SH-4 | | BE-38 | FE-8 |
| 5f | SH-4 | | BE-38 | FE-9 |
| 6f | SH-4 | | BE-38 | FE-1 |
| 7f | SH-5 | | BE-38 | FE-6 |
| 8f | SH-5 | | BE-38 | FE-2 |
| 9f | SH-5 | | BE-38 | FE-7 |
| 10f | SH-5 | | BE-38 | FE-8 |
| 11f | SH-5 | | BE-38 | FE-9 |
| 12f | SH-5 | | BE-38 | FE-1 |
| 13f | SH-11 | | BE-38 | FE-1 |
| 14f | SH-11 | | BE-38 | FE-2 |
| 15f | SH-11 | | BE-38 | FE-6 |
| 18f | SH-11 | | BE-38 | FE-7 |
| 17f | SH-11 | | BE-38 | FE-8 |
| 18f | SH-11 | | BE-38 | FE-9 |
| 19f | SH-11 | HTM-1 | BE-38 | FE-1 |
| 20f | SH-5 | HTM-1 | BE-38 | FE-6 |
| 21f | SH-5 | HTM-1 | BE-38 | FE-2 |
| 22f | SH-5 | HTM-1 | BE-38 | FE-7 |
| 23f | SH-5 | HTM-1 | BE-38 | FE-8 |
| 24f | SH-5 | HTM-1 | BE-38 | FE-9 |
| 25f | SH-5 | HTM-2 | BE-38 | FE-6 |
| 26f | SH-5 | HTM-2 | BE-38 | FE-2 |
| 27f | SH-5 | HTM-2 | BE-38 | FE-7 |
| 28f | SH-5 | HTM-2 | BE-38 | FE-8 |
| 29f | SH-5 | HTM-2 | BE-38 | FE-9 |

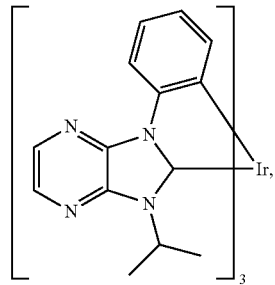

(BE-2)

| Device | 1st Host | 2nd Host | Organom. Comp. | Fluorescent Emitter |
|---|---|---|---|---|
| 1g | SH-1 | | BE-2 | FE-3 |
| 2g | SH-1 | | BE-2 | FE-4 |
| 3g | SH-1 | | BE-2 | FE-5 |
| 4g | SH-2 | | BE-2 | FE-3 |
| 5g | SH-2 | | BE-2 | FE-4 |
| 6g | SH-2 | | BE-2 | FE-5 |
| 7g | SH-3 | | BE-2 | FE-3 |
| 8g | SH-3 | | BE-2 | FE-4 |
| 9g | SH-3 | | BE-2 | FE-5 |
| 10g | SH-4 | | BE-2 | FE-3 |
| 11g | SH-4 | | BE-2 | FE-4 |
| 12g | SH-4 | | BE-2 | FE-5 |
| 13g | SH-5 | | BE-2 | FE-3 |
| 14g | SH-5 | | BE-2 | FE-4 |
| 15g | SH-5 | | BE-2 | FE-5 |
| 16g | SH-11 | | BE-2 | FE-3 |
| 17g | SH-11 | | BE-2 | FE-4 |
| 18g | SH-11 | | BE-2 | FE-5 |
| 19g | SH-5 | HTM-1 | BE-2 | FE-3 |
| 20g | SH-5 | HTM-1 | BE-2 | FE-4 |
| 21g | SH-5 | HTM-1 | BE-2 | FE-5 |
| 22g | SH-5 | HTM-2 | BE-2 | FE-3 |
| 23g | SH-5 | HTM-2 | BE-2 | FE-4 |
| 24g | SH-5 | HTM-2 | BE-2 | FE-5 |

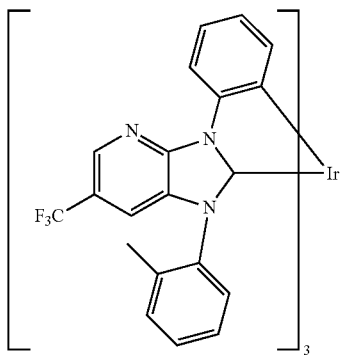

(BE-39)

| Device | 1st Host | 2nd Host | Organom. Comp. | Fluorescent Emitter |
|---|---|---|---|---|
| 1h | SH-1 | | BE-39 | FE-3 |
| 2h | SH-1 | | BE-39 | FE-4 |
| 3h | SH-1 | | BE-39 | FE-5 |
| 4h | SH-2 | | BE-39 | FE-3 |
| 5h | SH-2 | | BE-39 | FE-4 |
| 6h | SH-2 | | BE-39 | FE-5 |

-continued

| Device | 1st Host | 2nd Host | Organom. Comp. | Fluorescent Emitter |
|---|---|---|---|---|
| 7h | SH-3 | | BE-39 | FE-3 |
| 8h | SH-3 | | BE-39 | FE-4 |
| 9h | SH-3 | | BE-39 | FE-5 |
| 10h | SH-4 | | BE-39 | FE-3 |
| 11h | SH-4 | | BE-39 | FE-4 |
| 12h | SH-4 | | BE-39 | FE-5 |
| 13h | SH-5 | | BE-39 | FE-3 |
| 14h | SH-5 | | BE-39 | FE-4 |
| 15h | SH-5 | | BE-39 | FE-5 |
| 16h | SH-11 | | BE-39 | FE-3 |
| 17h | SH-11 | | BE-39 | FE-4 |
| 18h | SH-11 | | BE-39 | FE-5 |
| 19h | SH-5 | HTM-1 | BE-39 | FE-3 |
| 20h | SH-5 | HTM-1 | BE-39 | FE-4 |
| 21h | SH-5 | HTM-1 | BE-39 | FE-5 |
| 22h | SH-5 | HTM-2 | BE-39 | FE-3 |
| 23h | SH-5 | HTM-2 | BE-39 | FE-4 |
| 24h | SH-5 | HTM-2 | BE-39 | FE-5 |

Hole/Exciton Blocking Layer (f):

Blocking layers may be used to reduce the number of charge carriers (electrons or holes) and/or excitons that leave the emissive layer. The hole blocking layer may be disposed between the emitting layer (e) and electron transport layer (g), to block holes from leaving layer (e) in the direction of electron transport layer (g). Blocking layers may also be used to block excitons from diffusing out of the emissive layer. Suitable hole/exciton material are, in principle, the host compounds mentioned above. The same preferences apply as for the host material.

The at present most preferred hole/exciton blocking materials are compounds SH-1 to SH-11.

Electron Transport Layer (g):

Electron transport layer may include a material capable of transporting electrons. Electron transport layer may be intrinsic (undoped), or doped. Doping may be used to enhance conductivity. Suitable electron-transporting materials for layer (g) of the inventive OLEDs comprise metals chelated with oxinoid compounds, such as tris(8-hydroxyquinolato)aluminum (Alq$_3$), compounds based on phenanthroline such as 2,9-dimethyl-4,7-diphenyl-1,10-phenanthroline (DDPA=BCP), 4,7-diphenyl-1,10-phenanthroline (Bphen), 2,4,7,9-tetraphenyl-1,10-phenanthroline, 4,7-diphenyl-1,10-phenanthroline (DPA) or phenanthroline derivatives disclosed in EP1786050, in EP1970371, or in EP1097981, and azole compounds such as 2-(4-biphenylyl)-5-(4-t-butylphenyl)-1,3,4-oxadiazole (PBD) and 3-(4-biphenylyl)-4phenyl-5-(4-t-butylphenyl)-1,2,4-triazole (TAZ).

It is likewise possible to use mixtures of at least two materials in the electron-transporting layer, in which case at least one material is electron-conducting. Preferably, in such mixed electron-transporting layers, at least one phenanthroline compound is used, preferably BCP, or at least one pyridine compound according to the formula (VIII) below. More preferably, in mixed electron-transporting layers, in addition to at least one phenanthroline compound, alkaline earth metal or alkali metal hydroxyquinolate complexes, for example Liq, are used. Suitable alkaline earth metal or alkali metal hydroxyquinolate complexes are specified below (formula VII). Reference is made to WO2011/157779.

The electron-transporting layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo, Appl. Phys. Lett., Vol. 82, No. 25, 23 Jun. 2003 and Pfeiffer et al., Organic Electronics 2003, 4, 89-103 and K. Walzer, B. Maennig, M. Pfeiffer, K. Leo, Chem. Soc. Rev. 2007, 107, 1233. For example, it is possible to use mixtures which lead to electrical n-doping of the electron-transporting layer. n-Doping is achieved by the addition of reducing materials. These mixtures may, for example, be mixtures of the above-mentioned electron transport materials with alkali/alkaline earth metals or alkali/alkaline earth metal salts, for example Li, Cs, Ca, Sr, Cs$_2$CO$_3$, with alkali metal complexes, for example 8-hydroxyquinolatolithium (Liq), and with Y, Ce, Sm, Gd, Tb, Er, Tm, Yb, Li$_3$N, Rb$_2$CO$_3$, dipotassium phthalate, W(hpp)$_4$ from EP1786050, or with compounds described in EP1837926B1, EP1837927, EP2246862 and WO2010132236.

In a preferred embodiment, the electron-transporting layer comprises at least one compound of the general formula (VII)

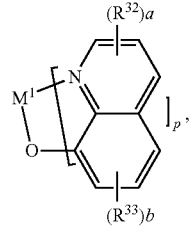

in which
R$^{32}$ and R$^{33}$ are each independently F, C$_1$-C$_8$-alkyl, or C$_6$-C$_{14}$-aryl, which is optionally substituted by one or more C$_1$-C$_8$-alkyl groups, or
two R$^{32}$ and/or R$^{33}$ substituents together form a fused benzene ring which is optionally substituted by one or more C$_1$-C$_8$-alkyl groups;
a and b are each independently 0, or 1, 2 or 3,
M$^1$ is an alkaline metal atom or alkaline earth metal atom,
p is 1 when M$^1$ is an alkali metal atom, p is 2 when M$^1$ is an earth alkali metal atom.

A very particularly preferred compound of the formula (VII) is

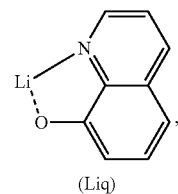

(Liq)

which may be present as a single species, or in other forms such as Li$_g$Q$_g$ in which g is an integer, for example Li$_6$Q$_6$. Q is an 8-hydroxyquinolate ligand or an 8-hydroxyquinolate derivative.

In a further preferred embodiment, the electron-transporting layer comprises at least one compound of the formula (VIII),

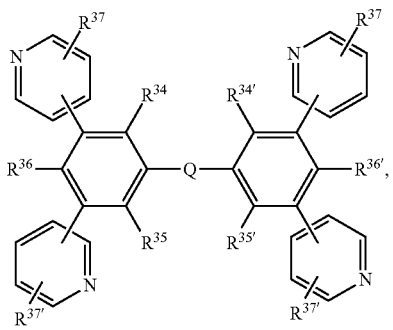
(VIII)

in which $R^{34}$, $R^{35}$, $R^{36}$, $R^{37}$, $R^{34'}$, $R^{35'}$, $R^{36'}$ and $R^{37'}$ are each independently H, $C_1$-$C_{18}$-alkyl, $C_1$-$C_{18}$-alkyl which is substituted by E and/or interrupted by D, $C_6$-$C_{24}$-aryl, $C_6$-$C_{24}$-aryl which is substituted by G, $C_2$-$C_{20}$-heteroaryl or $C_2$-$C_{20}$-heteroaryl which is substituted by G, Q is an arylene or heteroarylene group, each of which is optionally substituted by G;

D is —CO—; —COO—; —S—; —SO—; —SO$_2$—; —O—; —NR$^{40}$—; —SiR$^{45}$R$^{46}$—; —POR$^{47}$—; —CR$^{38}$=CR$^{39}$—; or —C≡C—;

E is —OR$^{44}$; —SR$^{44}$; —NR$^{40}$R$^{41}$; —COR$^{43}$; —COOR$^{42}$; —CONR$^{40}$R$^{41}$; —CN; or F;

G is E, $C_1$-$C_{18}$-alkyl, $C_1$-$C_{18}$-alkyl which is interrupted by D, $C_1$-$C_{18}$-perfluoroalkyl, $C_1$-$C_{18}$-alkoxy, or $C_1$-$C_{18}$-alkoxy which is substituted by E and/or interrupted by D, in which $R^{38}$ and $R^{39}$ are each independently H, $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—;

$R^{40}$ and $R^{41}$ are each independently $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—; or $R^{40}$ and $R^{41}$ together form a 6-membered ring;

$R^{42}$ and $R^{43}$ are each independently $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—, $R^{44}$ is $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—, $R^{45}$ and $R^{46}$ are each independently $C_1$-$C_{18}$-alkyl, $C_6$-$C_{18}$-aryl or $C_6$-$C_{18}$-aryl which is substituted by $C_1$-$C_{18}$-alkyl, $R^{47}$ is $C_1$-$C_{18}$-alkyl, $C_6$-$C_{18}$-aryl or $C_6$-$C_{18}$-aryl which is substituted by $C_1$-$C_{18}$-alkyl.

Preferred compounds of the formula (VIII) are compounds of the formula (VIIIa)

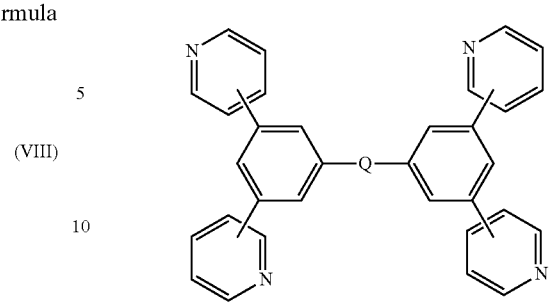
(VIIIa)

in which Q is:

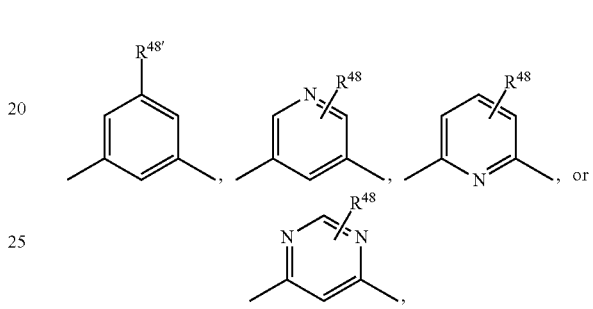

$R^{48}$ is H or $C_1$-$C_{18}$-alkyl and $R^{48'}$ is H, $C_1$-$C_{18}$-alkyl or Particular preference is given to a compound of the formula

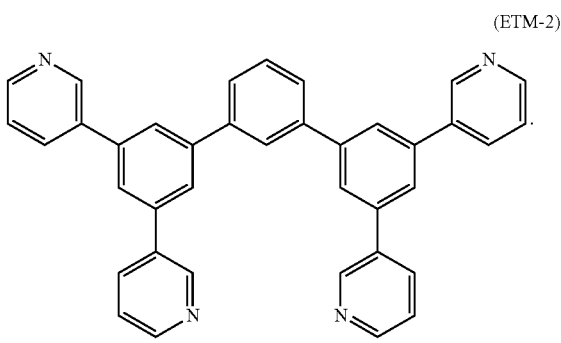 [SMILES: c1cncc(-c2cc(-c3cccnc3)cc(-c3cccc(-c4cc(-c5cccnc5)cc(-c5cccnc5)c4)c3)c2)c1]
(ETM-2)

In a further, very particularly preferred embodiment, the electron-transporting layer comprises a compound Liq and a compound ETM-2.

In a preferred embodiment, the electron-transporting layer comprises the compound of the formula (VII) in an amount of 99 to 1% by weight, preferably 75 to 25% by weight, more preferably about 50% by weight, where the amount of the compounds of the formulae (VII) and the amount of the compounds of the formulae (VIII) adds up to a total of 100% by weight.

The preparation of the compounds of the formula (VIII) is described in J. Kido et al., Chem. Commun. (2008)

5821-5823, J. Kido et al., Chem. Mater. 20 (2008) 5951-5953 and JP2008/127326, or the compounds can be prepared analogously to the processes disclosed in the aforementioned documents.

It is likewise possible to use mixtures of alkali metal hydroxyquinolate complexes, preferably Liq, and dibenzofuran compounds in the electron-transporting layer. Reference is made to WO2011/157790. Dibenzofuran compounds A-1 to A-36 and B-1 to B-22 described in WO2011/157790 are preferred, wherein dibenzofuran compound

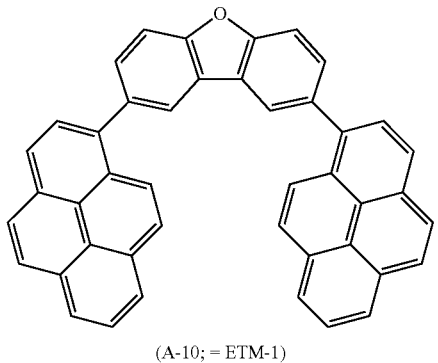 [SMILES: c1cc2ccc3ccc(-c4ccc5oc6ccc(-c7ccc8ccc9cccc%10ccc7c8c9%10)cc6c5c4)c4ccc(c1)c2c34]

(A-10; = ETM-1)

is most preferred.

In a preferred embodiment, the electron-transporting layer comprises Liq in an amount of 99 to 1% by weight, preferably 75 to 25% by weight, more preferably about 50% by weight, where the amount of Liq and the amount of the dibenzofuran compound(s), especially ETM-1, adds up to a total of 100% by weight.

In a preferred embodiment, the electron-transporting layer comprises at least one phenanthroline derivative and/or pyridine derivative.

In a further preferred embodiment, the electron-transporting layer comprises at least one phenanthroline derivative and/or pyridine derivative and at least one alkali metal hydroxyquinolate complex.

In a further preferred embodiment, the electron-transporting layer comprises at least one of the dibenzofuran compounds A-1 to A-36 and B-1 to B-22 described in WO2011/157790, especially ETM-1.

In a further preferred embodiment, the electron-transporting layer comprises a compound described in WO2012/111462, WO2012/147397, WO2012014621, such as, for example, a compound of formula

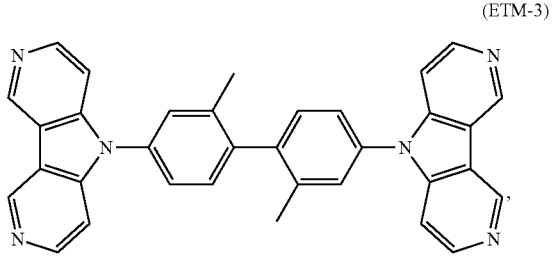 [SMILES: Cc1cc(-n2c3ccncc3c3cnccc32)ccc1-c1ccc(-n2c3ccncc3c3cnccc32)cc1C]

(ETM-3)

US2012/0261654, such as, for example, a compound of formula

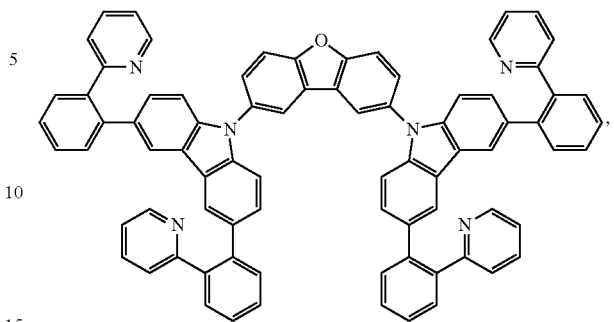

(ETM-4)

and WO2012/115034, such as for example, such as, for example, a compound of formula

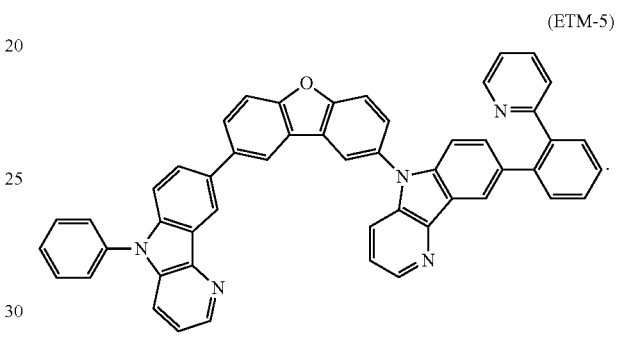

(ETM-5)

Electron Injection Layer (h):

The electron injection layer may be any layer that improves the injection of electrons into an adjacent organic layer. Lithium-comprising organometallic compounds such as 8-hydroxyquinolatolithium (Liq), CsF, NaF, KF, $Cs_2CO_3$ or LiF may be applied between the electron transport layer (g) and the cathode (i) as an electron injection layer (h) in order to reduce the operating voltage.

Cathode (i):

The cathode (i) is an electrode which serves to introduce electrons or negative charge carriers. The cathode may be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. In addition, metals such as aluminum, indium, calcium, barium, samarium and magnesium, and combinations thereof, may be used.

In general, the different layers, if present, have the following thicknesses:

anode (a): 500 to 5000 Å (angstrom), preferably 1000 to 2000 Å;

a hole injection layer (b): 50 to 1000 Å, preferably 200 to 800 Å, hole-transport layer (c): 50 to 1000 Å, preferably 100 to 900 Å, exciton blocking layer (d): 10 to 500 Å, preferably 50 to 100 Å, light-emitting layer (e): 10 to 1000 Å, preferably 50 to 600 Å, a hole/exciton blocking layer (f): 10 to 500 Å, preferably 50 to 100 Å, electron-transport layer (g): 50 to 1000 Å, preferably 200 to 800 Å, electron injection layer (h): 10 to 500 Å, preferably 20 to 100 Å, cathode (i): 200 to 10 000 Å, preferably 300 to 5000 Å.

The inventive OLED can be produced by methods known to those skilled in the art. In general, the inventive OLED is produced by successive vapor deposition of the individual layers onto a suitable substrate. Suitable substrates are, for example, glass, inorganic semiconductors or polymer films. For vapor deposition, it is possible to use customary techniques, such as thermal evaporation, chemical vapor deposition (CVD), physical vapor deposition (PVD) and others. In an alternative process, the organic layers of the OLED can be applied from solutions or dispersions in suitable solvents, employing coating techniques known to those skilled in the art.

The OLEDs can be used in all apparatus in which electroluminescence is useful. Suitable devices are preferably selected from stationary and mobile visual display units and illumination units. Stationary visual display units are, for example, visual display units of computers, televisions, visual display units in printers, kitchen appliances and advertising panels, illuminations and information panels. Mobile visual display units are, for example, visual display units in cellphones, tablet PCs, laptops, digital cameras, MP3 players, vehicles and destination displays on buses and trains. Further apparatus in which the inventive OLEDs can be used are, for example, keyboards; items of clothing; furniture; wallpaper.

Accordingly, the present invention relates to an apparatus selected from the group consisting of stationary visual display units such as visual display units of computers, televisions, visual display units in printers, kitchen appliances and advertising panels, illuminations, information panels, and mobile visual display units such as visual display units in cellphones, tablet PCs, laptops, digital cameras, MP3 players, vehicles and destination displays on buses and trains; illumination units; keyboards; items of clothing; furniture; wallpaper, comprising at least one inventive organic light-emitting device, or emitting layer.

Another aspect of the invention is an emitting layer, comprising 2 to 40% by weight of a luminescent organometallic complex X having a difference of the singlet energy and the triplet energy of smaller than 0.2 eV, 0.05 to 5% by weight of a fluorescent emitter Y and 55 to 97.95% by weight of a host compound(s), wherein the amount of the organometallic complex X, the fluorescent emitter Y and the host compound(s) adds up to a total of 100% by weight and the singlet energy of the luminescent organometallic complex X ($E_{S1}(X)$) is greater than the singlet energy of the fluorescent emitter Y ($E_{S1}(Y)$).

The difference of the singlet energy and the triplet energy of the luminescent organometallic complex X is preferably smaller than 0.1 eV, more preferably smaller than 0.05 eV.

Preferably, the emitting layer comprises 5 to 40% by weight of the luminescent organometallic complex X, 0.1 to 4.0% by weight of the fluorescent emitter Y and 94.9 to 56.0% by weight of a host compound(s), wherein the amount of the organometallic complex X, the fluorescent emitter Y and the host compound(s) adds up to a total of 100% by weight. More preferably, the emitting layer comprises 10 to 40% by weight of the luminescent organometallic complex X, 0.1 to 3.0% by weight of the fluorescent emitter Y and 89.9 to 57.0% by weight of a host compound(s), wherein the amount of the organometallic complex X, the fluorescent emitter Y and the host compound(s) adds up to a total of 100% by weight. Most preferred, the emitting layer comprises 20 to 40% by weight of the luminescent organometallic complex X, 0.1 to 3.0% by weight of the fluorescent emitter Y and 79.9 to 57.0% by weight of a host compound(s), wherein the amount of the organometallic complex X, the fluorescent emitter Y and the host compound(s) adds up to a total of 100% by weight.

Another subject of the present invention is the use of a fluorescent emitter Y for doping an emitting layer comprising a luminescent organometallic complex X having a difference of the singlet energy ($E_{S1}(X)$) and the triplet energy ($E_{T1}(X)$) of smaller than 0.2 eV and having a singlet energy ($E_{S1}(X)$) which is greater than the singlet energy of the fluorescent emitter Y ($E_{S1}(Y)$) and a host compound(s) to decrease the emissive lifetime $\tau_0$ below 100 ns, which is calculated by $\tau_0 = \tau_v/QY$, of thin films consisting of the luminescent organometallic complex X, fluorescent emitter Y and host compound(s). The decrease of the emissive lifetime $\tau_0$ below 100 ns take place without sacrificing QY. i.e. the EQE remains fundamentally the same, or is improved.

The emissive lifetime $\tau_0$ is preferably in the range of 0.1 to 80 ns, more preferably 0.5 to 50 ns, most preferred 0.5 to 40 ns.

The difference of the singlet energy and the triplet energy of the luminescent organometallic complex X is preferably smaller than 0.1 eV, more preferably smaller than 0.05 eV.

The emitting layer can be used in light-emitting electrochemical cells (LEECs), OLEDs, OLED sensors, especially in a gas and vapor sensor not hermetically sealed from the outside, optical temperature sensors, organic solar cells (OSCs; organic photovoltaics, OPVs), organic field-effect transistors, organic diodes and organic photodiodes.

The following examples are included for illustrative purposes only and do not limit the scope of the claims. Unless otherwise stated, all parts and percentages are by weight.

EXAMPLES

The examples which follow, more particularly the methods, materials, conditions, process parameters, apparatus and the like detailed in the examples, are intended to support the present invention, but not to restrict the scope of the present invention. All experiments are carried out in protective gas atmosphere. The percentages and ratios mentioned in the examples below—unless stated otherwise—are % by weight and weight ratios. The meridionale isomers of BE-2, BE-3, BE-24, BE-25, BE-26, BE-38, BE-39 and BE-40 are used in the Examples.

Determination of Quantum Efficiencies and Emissive Wavelengths (PMMA Matrix)

The photoluminescence (PL) spectra of the emissive donor and/or emissive acceptor molecule are measured on thin polymer films doped with the respective molecules. The thin films are prepared by the following procedure: a 10%-w/w polymer solution is made by dissolving 1 g of the polymer "Plexiglas 6N" (Evonik) in 9 g of dichloromethane, followed by stirring for one hour. The respective molecules are added to the PMMA solution according to the desired doping concentrations, and stirring is continued for one minute. The solutions are cast by doctor-blading with a film applicator (Model 360 2082, Erichsen) with a 60 μm gap onto quartz substrates providing thin doped polymer films (thickness ca. 6 μm).

Determination of Quantum Efficiencies and Emissive Wavelengths (SH-11 Matrix)

The same procedure described above for the PMMA matrix is used, except that instead of the PMMA polymer 4.8 mg of the host molecule (SH-11) are dissolved in 250 µl dichloromethane, followed by stirring for one hour.

The PL spectra and quantum yields (QY) of these films are measured with the integrating-sphere method using the absolute PL Quantum Yield Measurement System (Hamamatsu, Model C9920-02) (excitation wavelength: 370 nm for table 1, 310 nm for tables 2-9).

Determination of the Excited-State Lifetime $\tau_V$ and the Emissive Lifetime $\tau_0$ The excited-state lifetime ($T_v$) of the prepared films is measured by the following procedure: For excitation a pulsed diode laser with excitation wavelength 310 nm operated at 10 kHz is used. Detection is carried out with time correlated single photon counting (TCSPC). The emissive lifetime $\tau_0$ is calculated by $\tau_0 = \tau_v/QY$.

The luminescent organometallic complex BE-24 is used as donor. The fluorescent emitters FE-1 and FE-2 are used as acceptor.

blue shifted by ~15 nm relative to PMMA. Again the same basic trends are shown including a reduction of the excited-state lifetime below 20 ns for 0.3% of the fluorescent acceptor, FE-1. Even with the very small difference in emission wavelength between donor and acceptor an efficient transfer occurs.

In the fourth part another fluorescent acceptor molecule is introduced (FE-2). Here significantly higher concentrations of the acceptor molecule are necessary. With 2% concentration of FE-2 high quantum efficiencies of 74% are achieved in combination with 20 ns excited-state lifetime.

Quantum Yield (QY) (%), $CIE_{x,y}$, and emissive lifetime $\tau_0$ (ns) measured for different samples are shown in the Tables 2 to 9 below. Excitation for determining the QY is carried out at 310 nm, here the absorption is almost exclusively from the donor.

Table 1 shows four series of energy transfer experiments involving the donor molecule BE-24 in two different concentrations, two different acceptor molecules (FE-1 and FE-2) and two different host molecules (PMMA and SH-11).

| Donor | Acc. | c(Don.) | c(Acc.) | Host | $\tau_v$/ns | $\tau_o$/ns | QY | $\lambda_{max,\,em}$ |
|---|---|---|---|---|---|---|---|---|
| BE-24 | FE-1 | 2% | 0% | PMMA | 700 | 875 | 80% | 440 nm |
| BE-24 | FE-1 | 0% | 0.10% | PMMA | 4 | 4 | 98% | 468 nm |
| BE-24 | FE-1 | 2% | 0.05% | PMMA | 49 | 83 | 78% | 468 nm |
| BE-24 | FE-1 | 2% | 0.10% | PMMA | 44 | 57 | 77% | 466 nm |
| BE-24 | FE-1 | 2% | 0.20% | PMMA | 27 | 38 | 71% | 469 nm |
| BE-24 | FE-1 | 2% | 0.40% | PMMA | 17 | 25 | 68% | 470 nm |
| BE-24 | FE-1 | 10% | 0% | PMMA | 700 | 843 | 83% | 447 nm |
| BE-24 | FE-1 | 10% | 0.05% | PMMA | 69 | 103 | 67% | 468 nm |
| BE-24 | FE-1 | 10% | 0.10% | PMMA | 57 | 89 | 64% | 468 nm |
| BE-24 | FE-1 | 10% | 0.20% | PMMA | 25 | 48 | 52% | 473 nm |
| BE-24 | FE-1 | 10% | 0.40% | PMMA | 24 | 49 | 49% | 473 nm |
| BE-24 | FE-1 | 2% | 0% | SH-11 | — |  | 71% | 449 nm |
| BE-24 | FE-1 | 2% | 0.05% | SH-11 | 57 | 98 | 58% | 453 nm |
| BE-24 | FE-1 | 2% | 0.10% | SH-11 | 40 | 70 | 57% | 454 nm |
| BE-24 | FE-1 | 2% | 0.30% | SH-11 | 17 | 31 | 55% | 458 nm |
| BE-24 | FE-2 | 0% | 0.10% | PMMA | 5 | 5 | 100% | 458 nm |
| BE-24 | FE-2 | 2% | 0.10% | PMMA | 240 | 282 | 85% | 460 nm |
| BE-24 | FE-2 | 2% | 2% | PMMA | 20 | 27 | 74% | 487 nm |

The first part of the table shows samples with 2% of the donor BE-24 and varying concentrations of the acceptor FE-1 in the host PMMA. The first line shows that the pure donor (2% doping concentration) has an excited-state lifetime ($\tau_v$) of 700 ns in combination with a quantum yield of 80% and an emission maximum at 440 nm. The pure acceptor (doping concentration of 0.1%) has an excited-state lifetime of 3.7 ns at ~100% quantum efficiency. The emission maximum is at 468 nm. Using now the donor as well as the acceptor as dopands it is shown that a very efficient energy transfer from the donor to the acceptor occurs (78% quantum efficiency with 0.1% acceptor doping compared to 80% without acceptor doping).

Figure 3:
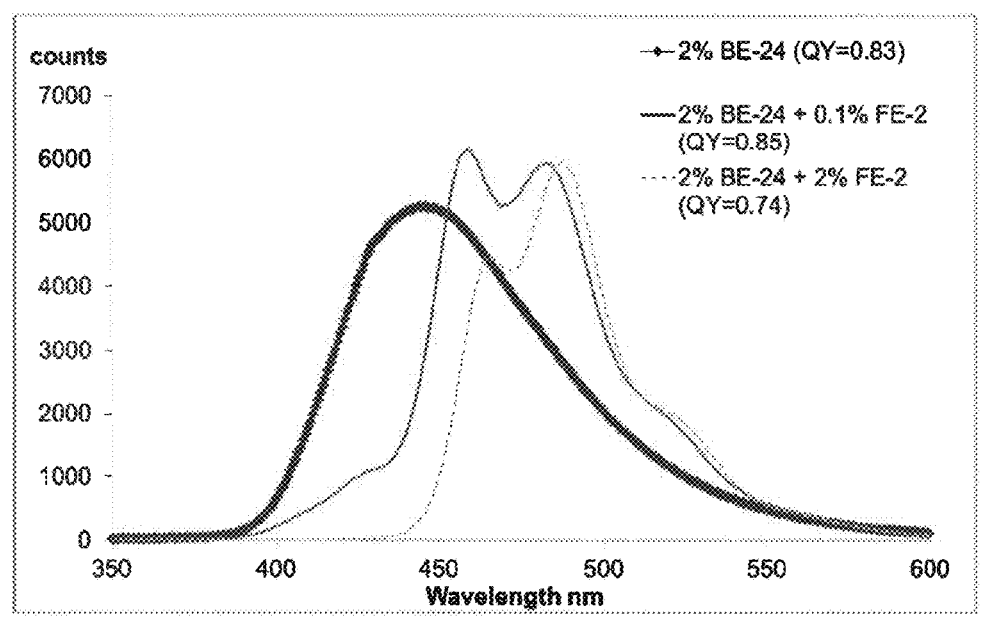
FIG. 3 shows PL-spectra of 2% luminescent organometallic complex BE-24 and varying concentrations of the fluorescent emitter FE-2 in PMMA.

The shift in the emission maximum from 440 nm (donor) to 468-470 nm (acceptor) supports this interpretation (see FIGS. 2 and 3). It is shown in the table that the excited-state lifetime is reduced to as little as 17 ns without substantially sacrificing quantum efficiency.

In the second part of the table the donor concentration is increased to 10%. An overall similar behavior is observed as described for the 2% doping concentration, however with smaller quantum efficiencies.

The third part of table 1 describes a system, where PMMA is replaced by the host material SH-11. FE-1 is significantly

TABLE 2

Quantum Yield (QY) (%), $CIE_{x,\,y}$, and emissive lifetime $\tau_0$ (ns) measured for a thin film consisting of 10% BE-24, x % FE-7 and 90-x % PMMA.

| Example | x/% | QY/% | $CIE_x$ | $CIE_y$ | $\tau_0$/ns |
|---|---|---|---|---|---|
| Film 1 | 0 | 79 | 0.156 | 0.148 | 1030 |
| Film 2 | 0.2 | 96 | 0.158 | 0.267 | 43 |
| Film 3 | 0.5 | 98 | 0.161 | 0.307 | 24 |
| Film 4 | 1.0 | 99 | 6.170 | 0.374 | 9 |

TABLE 3

Quantum Yield (QY) (%), $CIE_{x,\,y}$, and emissive lifetime $\tau_0$ (ns) measured for a thin film consisting of 10% BE-24, x % FE-2 and 90-x % SH-11.

| Example | x/% | QY/% | $CIE_x$ | $CIE_y$ | $\tau_0$/ns |
|---|---|---|---|---|---|
| Film 5 | 0 | 89 | 0.179 | 0.200 | 1320 |
| Film 6 | 0.5 | 78 | 0.138 | 0.226 | 40 |
| Film 7 | 1.0 | 72 | 0.138 | 0.235 | 39 |

TABLE 4

Quantum Yield (QY) (%), $CIE_{x,y}$, and emissive lifetime $\tau_0$ (ns) measured for a thin film consisting of 10% BE-38, x % FE-2 and 90-x % PMMA.

| Example | x/% | QY/% | $CIE_x$ | $CIE_y$ | $\tau_0$/ns |
|---|---|---|---|---|---|
| Film 8 | 0 | 62 | 0.157 | 0.177 | 934 |
| Film 9 | 0.5 | 72 | 0.135 | 0.230 | 46 |
| Film 10 | 1.0 | 64 | 0.131 | 0.260 | 25 |

TABLE 5

Quantum Yield (QY) (%), $CIE_{x,y}$, and emissive lifetime $\tau_0$ (ns) measured for a thin film consisting of 10% BE-38, x % FE-7 and 90-x % PMMA.

| Example | x/% | QY/% | $CIE_x$ | $CIE_y$ | $\tau_0$/ns |
|---|---|---|---|---|---|
| Film 11 | 0 | 62 | 0.157 | 0.177 | 934 |
| Film 12 | 0.2 | 75 | 0.158 | 0.266 | 46 |
| Film 13 | 0.5 | 83 | 0.162 | 0.316 | 21 |
| Film 14 | 1.0 | 89 | 0.170 | 0.370 | 9 |

TABLE 6

Quantum Yield (QY) (%), $CIE_{x,y}$, and emissive lifetime $\tau_0$ (ns) measured for a thin film consisting of 10% BE-40, x % FE-4 and 90-x % PMMA.

| Example | x/% | QY/% | $CIE_x$ | $CIE_y$ | $\tau_0$/ns |
|---|---|---|---|---|---|
| Film 15 | 0 | 76 | 0.325 | 0.556 | 877 |
| Film 16 | 1.0 | 87 | 0.379 | 0.595 | 79 |

TABLE 7

Quantum Yield (QY) (%), $CIE_{x,y}$, and emissive lifetime $\tau_0$ (ns) measured for a thin film consisting of 10% BE-39, x % FE-5 and 90-x % PMMA.

| Example | x/% | QY/% | $CIE_x$ | $CIE_y$ | $\tau_0$/ns |
|---|---|---|---|---|---|
| Film 17 | 0 | 86 | 0.222 | 0.419 | 976 |
| Film 18 | 0.2 | 97 | 0.262 | 0.621 | 31 |
| Film 19 | 0.5 | 96 | 0.289 | 0.641 | 15 |
| Film 20 | 1.0 | 94 | 0.304 | 0.642 | 10 |

TABLE 8

Quantum Yield (QY) (%), $CIE_{x,y}$, and emissive lifetime $\tau_0$ (ns) measured for a thin film consisting of 10% Cu-1, x % FE-2 and 90-x % PMMA.

| Example | x/% | QY/% | $CIE_x$ | $CIE_y$ | $\tau_0$/ns |
|---|---|---|---|---|---|
| Film 21 | 0 | 47 | 0.171 | 0.215 | 32125 |
| Film 22 | 0.2 | 67 | 0.143 | 0.231 | 41 |
| Film 23 | 0.5 | 77 | 0.136 | 0.243 | 36 |
| Film 24 | 1.0 | 83 | 0.132 | 0.259 | 29 |

TABLE 9

Quantum Yield (QY) (%), $CIE_{x,y}$, and emissive lifetime $\tau_0$ (ns) measured for a thin film consisting of 10% Cu-1, x % FE-7 and 90-x % PMMA.

| Example | x/% | QY/% | $CIE_x$ | $CIE_y$ | $\tau_0$/ns |
|---|---|---|---|---|---|
| Film 25 | 0 | 47 | 0.171 | 0.215 | 32125 |
| Film 26 | 0.2 | 72 | 0.163 | 0.302 | 1.6 |
| Film 27 | 0.5 | 86 | 0.166 | 0.351 | 1.5 |
| Film 28 | 1.0 | 92 | 0.171 | 0.385 | 1.7 |

As evident from tables 2 to 9 the emissive lifetime $\tau_0$ can be reduced by the inventive concept to values well below 80 ns while maintaining or even increasing the QY. The $CIE_y$ coordinate shows that efficient transfer takes place already at low concentrations, as the emission comes from the acceptor.

Determination of the $S_1$-$T_1$ Splitting

To determine the $S_1$-$T_1$-splitting we use a combined approach involving temperature dependent determination of excited-state lifetimes and quantum chemical calculations.

a) Experimental Approach:

A 60 μm thin film of the Iridium complex in PMMA (2%) is prepared by doctor blading from dichloromethane onto a quartz substrate. A cryostat (Optistat CF, Oxford Instruments) is used for cooling the sample with liquid helium. The PL spectra and the PL decay time at the maximum of the emission are measured with a spectrometer (Edinburgh Instruments FLS 920P) at the following temperatures: 4K, 10K, 20K, 30K, 50K, 75K, 100K, 150K, 200K, 250K, 300K, 350K, 375K, 400K.

Fitting:

The temperature dependence of the averaged PL decay time provides information about the energy levels and decay rates of different states that are populated according to the Boltzmann distribution (M. J. Leitl, V. A. Krylova, P. I. Djurovich, M. E. Thompson, H. Yersin J. Am. Chem. Soc. 2014, 136, 16032-16038; T. Hofbeck, H. Yersin, Inorg. Chem. 2010, 49, 9290-9299). For a system with two populated excited states the following expression can be fitted to the measured data $k_{av}$ vs T:

$$k_{av} = \frac{k_I + k_{II} e^{-\Delta E_{I,II}/(k_B T)}}{1 + e^{-\Delta E_{I,II}/(k_B T)}} \quad \text{Equation 2}$$

For a system with three populated excited states equation 2 is used.

$$k_{av} = \frac{k_I + k_{II} e^{-\Delta E_{I,II}/(k_B T)} + k_{III} e^{-\Delta E_{I,III}/(k_B T)}}{1 + e^{-\Delta E_{I,II}/(k_B T)} + e^{-\Delta E_{I,III}/(k_B T)}} \quad \text{Equation 2}$$

where $k_{av}$ is the decay rate determined from the measurement, $k_I$, $k_{II}$, $k_{III}$ are the decay rates of the respective excited states, $E_{I,II}$ and $E_{I,III}$ are the energy differences of the excited states I and II compared to the lowest excited state, $k_B$ is the Boltzmann constant and T is the temperature.

A high value of k ($>2*10^6$ s$^{-1}$) is an indication that the respective excited state is a singlet. However, since the spin multiplicity of the excited states cannot be proven by PL measurements, additional quantum chemical calculations have to be carried out and compared to the excited-state levels we find from the fitting of the measurement.

b) Quantum Chemical Approach

First the triplet geometries of the potential donor molecules were optimized at the unrestricted BP86 [J. P. Perdew, Phys. Rev. B 33, 8822 (1986) and J. P. Perdew, Phys. Rev. B 33, 8822 (1986)]/SV(P) [A. Schäfer, H. Horn, and R. Ahlrichs, J. Chem. Phys. 9, 2571 (1992)]-level of theory including effective core potentials in case of iridium transition metal complexes [D. Andrae, U. Haeussermann, M. Dolg, H. Stoll, and H. Preuss, Theor. Chim. Acta 77, 123 (1990)]. Based on these triplet geometries relativistic all electron calculations were performed to determine the $S_1$-$T_1$-splitting. Specifically we used the B3LYP-functional [Becke, A. D., J. Chem. Phys. 98, 5648 (1993)] in combination with an all-electron basis set of double zeta quality [E. van Lenthe and E. J. Baerends, J. Comp. Chemistry 24, 1142 (2003)]. Scalar relativistic effects were included at the SCF level via the ZORA approach [E. van Lenthe, A. E. Ehlers and E. J. Baerends, Journal of Chemical Physics 110, 8943 (1999)]. Based on that wavefunction time dependent density functional calculations were performed including spin orbit coupling via perturbation theory [F. Wang and T. Ziegler, Journal of Chemical Physics 123, 154102 (2005)]. The $S_1$-$T_1$-splitting is then finally determined as the energy difference of the lowest $T_1$-sublevel to the first spin-orbit corrected $S_1$-state. Relativistic calculations were carried out using the ADF program package [3. ADF2009.01, SCM, Theoretical Chemistry, Vrije Universiteit, Amsterdam, The Netherlands, http://www.scm.com] whereas for the geometry optimisations the TURBOMOLE program package [R. Ahlrichs, M. Bär, M. Häser, H. Horn, and C. Cölmel, Chem. Phys. Lett. 162, 165 (1989)] was used.

To illustrate the validity of the approach a comparison between experimentally fitted and calculated $S_1$-$T_1$-levels is given in the Table 10 below:

| Molecular Structure | Abbreviation | Isomer | $\Delta E(S_1$-$T_1)$ [eV] experimental | $\Delta E(S_1$-$T_1)$ [eV] calculated |
|---|---|---|---|---|
| | Ir(ppy)$_3$ | fac | ~0.200 | 0.150 |
| | FIrpic | trans-N,N | ~0.300 | 0.180 |
| | BE-24 | mer | 0.010 | 0.038 |

-continued

To illustrate the validity of the approach a comparison between experimentally fitted and calculated $S_1$-$T_1$-levels is given in the Table 10 below:

| Molecular Structure | Abbreviation | Isomer | $\Delta E(S_1\text{-}T_1)$ [eV] experimental | $\Delta E(S_1\text{-}T_1)$ [eV] calculated |
|---|---|---|---|---|
| | BE-38 | mer | | 0.057 |
| | BE-2 | mer | | 0.035 |
| | BE-3 | mer | | 0.026 |
| | BE-26 | mer | | 0.034 |

-continued

| To illustrate the validity of the approach a comparison between experimentally fitted and calculated $S_1$-$T_1$-levels is given in the Table 10 below: | | | | |
|---|---|---|---|---|
| Molecular Structure | Abbreviation | Isomer | $\Delta E(S_1$-$T_1)$ [eV] experimental | $\Delta E(S_1$-$T_1)$ [eV] calculated |
|  | BE-25 | mer |  | 0.040 |

A very good agreement between calculated and fitted data was obtained. The exceptionally small $S_1$-$T_1$-splitting of BE-24 was clearly shown. Ir(ppy)$_3$ and FIrpic are included for extended comparison. $S_1$-$T_1$-splittings for Ir(ppy)$_3$ and FIrpic were taken from Burak Himmetoglu, Alex Marchenko, Ismaïla Dabo, and Matteo Cococcioni, The Journal of Chemical Physics 137, 154309 (2012) and literature cited therein. Please note, the $S_1$-$T_1$-splittings for Ir(ppy)$_3$ and FIrpic are very approximate in nature due to their determination from peak wavelengths/absorption onsets. Both theory and measurements also agree for these molecules in giving $S_1$-$T_1$-splittings significantly larger than 0.1 eV.

Determination of the $S_1$-$T_1$-Splitting of BE-24

Quantum chemical calculations as well as low temperature photoluminescence measurements are performed in order to determine the $S_1$-$T_1$-splitting of compound (BE-24). By employing the following set of equations (1)-(4)

$$k_{av} = \frac{n_{S_1}}{n} k_{S_1} + \frac{n_{T_1}}{n} k_{T_1} \quad (1)$$

$$n_{S_1} = e^{-\frac{\Delta E(S_1-T_1)}{kT}} \quad (2)$$

$$n_{T_1} = 1 \quad (3)$$

$$n = n_{S_1} + n_{T_1} \quad (4)$$

and identifying the rate at 4 K with the $T_1$-rate one can fit the $S_1$ emissive rate and the $S_1$-$T_1$-splitting simultaneously. We obtain an emissive lifetime of 330 ns for the $S_1$-state, 10 μs for the $T_1$-state and 0.01 eV for the $S_1$-$T_1$-splitting. This exceptionally small value leads to an Boltzmann-population of the $S_1$-state of ~70%, thus also explaining the very efficient energy transfer described in the preceding section. Since the spin multiplicity of the states cannot be directly proven by the PL measurements we carried out additional relativistic quantum chemical calculations. Here we find in agreement with the above interpretation a very small $S_1$-$T_1$-splitting of 0.04 eV.

Application Examples

The ITO substrate used as the anode is cleaned first with commercial detergents for LCD production (Deconex® 20NS, and 25ORGAN-ACID® neutralizing agent) and then in an acetone/isopropanol mixture in an ultrasound bath. To eliminate possible organic residues, the substrate is exposed to a continuous ozone flow in an ozone oven for a further 25 minutes. This treatment also improves the hole injection properties of the ITO. Thereafter, the organic materials specified below are applied by vapor deposition to the cleaned substrate at about $10^{-7}$-$10^{-9}$ mbar at a rate of approx. 0.5-5 nm/min.

The hole injection, conductor and exciton blocker applied to the substrate is

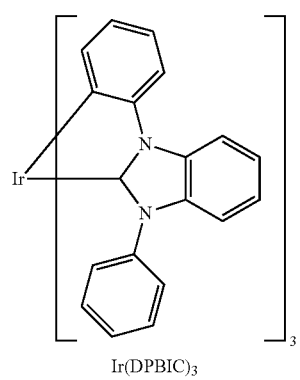

Ir(DPBIC)$_3$ with a thickness between 60 and 100 nm, of which the 50 to 90 nm are doped with MoO$_3$. The remaining 10 nm of Ir(DPBIC)$_3$ serve as an exciton blocker. Subsequently, the emission layer (EML) is deposited as a mixture of luminescent organometallic complex BE-X (2 to 40% by wt.), fluorescent emitter FE-X (0.05 to 2.0% by wt.) and host compound

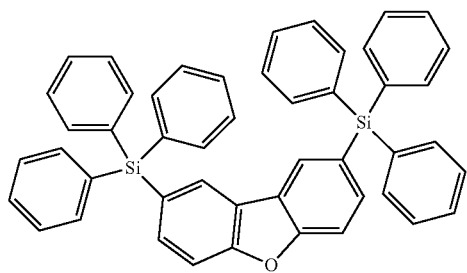
(SH-11)

or

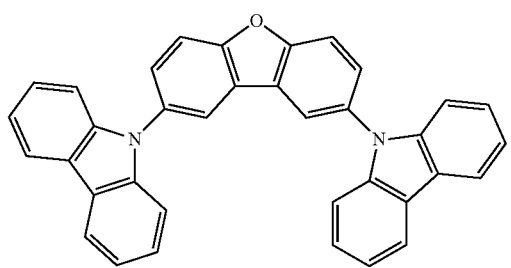
(SH-2)

(58 to 97.95% by wt.) by vapor deposition with a thickness of 40 nm. Subsequently, SH-11 or SH-2 is applied by vapor deposition with a thickness of 5 nm as a hole blocker.

Next, as an electron transporting layer, a mixture of

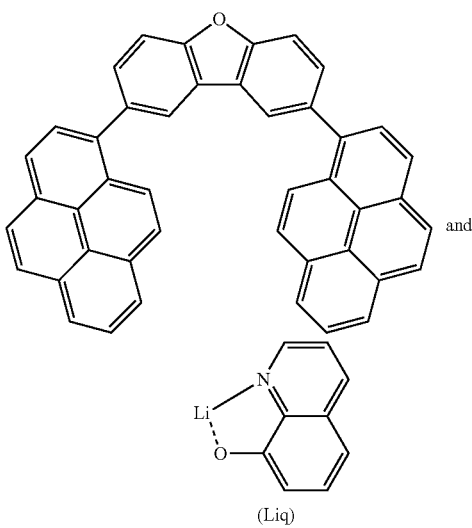
(ETM-1)

and

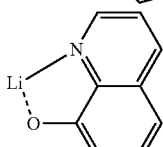
(Liq)

(50:50) is applied by vapor deposition (25 to 35 nm). Then, following 4 nm of KF deposition by vapor deposition, a 100 nm-thick Al electrode is finally deposited by thermal evaporation. All components are adhesive-bonded to a glass lid in an inert nitrogen atmosphere.

Comparative Application Example 1 and Application Example 1

Comparative Device 1 has the following architecture:
ITO-80 nm Ir(DPBIC)$_3$:MoO$_3$ (90:10)-10 nm Ir(DPBIC)$_3$-40 nm BE-24/FE-1/SH-11 (2:0:98)-5 nm SH-11-25 nm ETM-1:Liq (50:50)-4 nm KF-100 nm Al Devices 1 is obtained in analogy to Comparative Device 1. The device architecture of Device 1 is shown below:
ITO-80 nm Ir(DPBIC)$_3$:MoO$_3$ (90:10)-10 nm Ir(DPBIC)$_3$-40 nm BE-24/FE-1/SH-11 (2:0.05:97.95)-5 nm SH-11-25 nm ETM-1:Liq (50:50)-4 nm KF-100 nm Al To characterize the OLED, electroluminescence spectra are recorded at various currents and voltages. In addition, the current-voltage characteristic is measured in combination with the luminance to determine luminous efficiency and external quantum efficiency (EQE). Driving voltage U and EQE are given at luminance (L)=1000 cd/m$^2$ and Commission Internationale de l'Éclairage (CIE) coordinate are given at 5 mA/cm$^2$ except otherwise stated. Furthermore, 50% lifetime (LT50) is measured at constant current density J=25 mA/cm$^2$, the time spent until the initial luminance is reduced to 50%. EQE and LT50 of the Comparative Application Examples are set to 100 and EQE and LT50 of the Application Examples are specified in relation to those of the Comparative Application Examples.

TABLE 11

| | BE-24 | FE-1 | SH-11 | EQE [%] | CIE$_x$ | CIE$_y$ | LT50 [%] |
|---|---|---|---|---|---|---|---|
| Comp. Appl. Ex. 1 Comp. Device 1 | 2 | 0 | 98 | 100 | 0.164 | 0.156 | 100 |
| Appl. Ex. 1 Device 1 | 2 | 0.05 | 97.95 | 128 | 0.157 | 0.143 | 135 |

Comparative Application Example 2 and Application Examples 2 and 3

Comp. Device 2 and Devices 2 and 3 are obtained in analogy to Comp. Application Example 1. The device architectures of Comp. Device 2 and Devices 2 and 3 are shown below:
Comp. Device 2:
ITO-80 nm Ir(DPBIC)$_3$:MoO$_3$ (90:10)-10 nm Ir(DPBIC)$_3$-40 nm BE-24/FE-1/SH-11 (10:0:90)-5 nm SH-11-25 nm ETM-1:Liq (50:50)-4 nm KF-100 nm Al
Device 2:
ITO-80 nm Ir(DPBIC)$_3$:MoO$_3$ (90:10)-10 nm Ir(DPBIC)$_3$-40 nm BE-24/FE-1/SH-11 (10:0.05:89.95)-5 nm SH-11-25 nm ETM-1:Liq (50:50)-4 nm KF-100 nm Al
Device 3:
ITO-80 nm Ir(DPBIC)$_3$:MoO$_3$ (90:10)-10 nm Ir(DPBIC)$_3$-40 nm BE-24/FE-1/SH-11 (10:0.1:89.9)-5 nm SH-11-25 nm ETM-1:Liq (50:50)-4 nm KF-100 nm Al

TABLE 12

| | BE-24 | FE-1 | SH-11 | EQE [%] | CIE$_x$ | CIE$_y$ | LT50 [%] |
|---|---|---|---|---|---|---|---|
| Comp. Appl. Comp. Device 2 | 10 | 0 | 90 | 100 | 0.164 | 0.165 | 100 |
| Appl. Ex. 2 Device 2 | 10 | 0.05 | 89.95 | 105 | 0.157 | 0.146 | 120 |
| Appl. Ex. 3 Device 3 | 10 | 0.1 | 89.9 | 101 | 0.156 | 0.143 | 120 |

Comparative Application Example 3 and Application Examples 4 and 5

Comp. Device 3 and Devices 4 and 5 are obtained in analogy to Comp. Application Example 1. The device architectures of Comp. Device 3 and Devices 4 and 5 are shown below:

Comp. Device 3:
  ITO-90 nm Ir(DPBIC)$_3$:MoO$_3$ (90:10)-10 nm Ir(DPBIC)$_3$-40 nm BE-24/FE-2/SH-11 (30:0:70)-5 nm SH-11-25 nm ETM-1:Liq (50:50)-4 nm KF-100 nm Al Device 4:
  ITO-90 nm Ir(DPBIC)$_3$:MoO$_3$ (90:10)-10 nm Ir(DPBIC)$_3$-40 nm BE-24/FE-2/SH-11 (30:0.1:69.9)-5 nm SH-11-25 nm ETM-1:Liq (50:50)-4 nm KF-100 nm Al Device 5:
  ITO-90 nm Ir(DPBIC)$_3$:MoO$_3$ (90:10)-10 nm Ir(DPBIC)$_3$-40 nm BE-24/FE-2/SH-11 (30:0.3:69.7)-5 nm SH-11-25 nm ETM-1:Liq (50:50)-4 nm KF-100 nm Al

TABLE 13

| | BE-24 | FE-2 | SH-11 | EQE [%] | CIE$_x$ | CIE$_y$ | LT50 [%] |
|---|---|---|---|---|---|---|---|
| Comp. Appl. Comp. Device 3 | 30 | 0 | 70 | 100 | 0.153 | 0.153 | 100 |
| Appl. Ex. 4 Device 4 | 30 | 0.1 | 69.9 | 107 | 0.147 | 0.146 | 175 |
| Appl. Ex. 5 Device 5 | 30 | 0.3 | 69.7 | 99 | 0.140 | 0.144 | 340 |

Comparative Application Example 4 and Application Examples 6 and 7

Comp. Device 4 and Devices 6 and 7 are obtained in analogy to Comp. Application Example 1. The device architectures of Comp. Device 4 and Devices 6 and 7 are shown below:

Comp. Device 4:
  ITO-90 nm Ir(DPBIC)$_3$:MoO$_3$ (90:10)-10 nm Ir(DPBIC)$_3$-40 nm BE-24/FE-7/SH-11 (30:0:70)-5 nm SH-11-25 nm ETM-1:Liq (50:50)-4 nm KF-100 nm Al Device 6:
  ITO-90 nm Ir(DPBIC)$_3$:MoO$_3$ (90:10)-10 nm Ir(DPBIC)$_3$-40 nm BE-24/FE-7/SH-11 (30:1:69)-5 nm SH-11-25 nm ETM-1:Liq (50:50)-4 nm KF-100 nm Al Device 7:
  ITO-80 nm Ir(DPBIC)$_3$:MoO$_3$ (90:10)-10 nm Ir(DPBIC)$_3$-40 nm BE-24/FE-7/SH-11 (30:2:68)-5 nm SH-11-25 nm ETM-1:Liq (50:50)-4 nm KF-100 nm Al

TABLE 14

| | BE-24 | FE-7 | SH-11 | EQE [%] | CIE$_x$ | CIE$_y$ | LT50 [%] |
|---|---|---|---|---|---|---|---|
| Comp. Appl. Ex. 4 Comp. Device 4 | 30 | 0 | 70 | 100 | 0.152 | 0.167 | 100 |
| Appl. Ex. 6 Device 6 | 30 | 1 | 69 | 120 | 0.148 | 0.240 | 800 |
| Appl. Ex. 7 Device 7 | 30 | 2 | 68 | 107 | 0.149 | 0.273 | 2515 |

Comparative Application Example 5 and Application Examples 8 to 10

Comp. Device 5 and Devices 8 to 10 are obtained in analogy to Comp. Application Example 1. The device architectures of Comp. Device 5 and Devices 8 to 10 are shown below:

Comp. Device 5:
  ITO-90 nm Ir(DPBIC)$_3$:MoO$_3$ (90:10)-10 nm Ir(DPBIC)$_3$-40 nm BE-24/FE-2/SH-11 (40:0:60)-5 nm SH-11-25 nm ETM-1:Liq (50:50)-4 nm KF-100 nm Al Device 8:
  ITO-90 nm Ir(DPBIC)$_3$:MoO$_3$ (90:10)-10 nm Ir(DPBIC)$_3$-40 nm BE-24/FE-2/SH-11 (40:0.1:59.9)-5 nm SH-11-25 nm ETM-1:Liq (50:50)-4 nm KF-100 nm Al Device 9:
  ITO-90 nm Ir(DPBIC)$_3$:MoO$_3$ (90:10)-10 nm Ir(DPBIC)$_3$-40 nm BE-24/FE-2/SH-11 (40:0.3:59.7)-5 nm SH-11-25 nm ETM-1:Liq (50:50)-4 nm KF-100 nm Al Device 10:
  ITO-90 nm Ir(DPBIC)$_3$:MoO$_3$ (90:10)-10 nm Ir(DPBIC)$_3$-40 nm BE-24/FE-2/SH-11 (40:0.5:59.5)-5 nm SH-11-25 nm ETM-1:Liq (50:50)-4 nm KF-100 nm Al

TABLE 15

| | BE-24 | FE-2 | SH-11 | EQE [%] | CIE$_x$ | CIE$_y$ | LT50 [%] |
|---|---|---|---|---|---|---|---|
| Comp. Appl. Ex. 5 Comp. Device 5 | 40 | 0 | 60 | 100 | 0.155 | 0.200 | 100 |
| Appl. Ex. 8 Device 8 | 40 | 0.1 | 59.9 | 120 | 0.147 | 0.188 | 180 |
| Appl. Ex. 9 Device 9 | 40 | 0.3 | 59.7 | 123 | 0.139 | 0.168 | 310 |
| Appl. Ex. 10 Device 10 | 40 | 0.5 | 59.5 | 111 | 0.135 | 0.168 | 535 |

Comparative Application Example 6 and Application Examples 11 to 15

Comp. Device 6 and Devices 11 to 15 are obtained in analogy to Comp. Application Example 1. The device architectures of Comp. Device 6 and Devices 11 to 15 are shown below:

Comp. Device 6:
  ITO-90 nm Ir(DPBIC)$_3$:MoO$_3$ (90:10)-10 nm Ir(DPBIC)$_3$-40 nm BE-24/FE-7/SH-11 (40:0:60)-5 nm SH-11-25 nm ETM-1:Liq (50:50)-4 nm KF-100 nm Al Device 11:
  ITO-90 nm Ir(DPBIC)$_3$:MoO$_3$ (90:10)-10 nm Ir(DPBIC)$_3$-40 nm BE-24/FE-7/SH-11 (40:0.3:59.7)-5 nm SH-11-25 nm ETM-1:Liq (50:50)-4 nm KF-100 nm Al Device 12:
  ITO-90 nm Ir(DPBIC)$_3$:MoO$_3$ (90:10)-10 nm Ir(DPBIC)$_3$-40 nm BE-24/FE-7/SH-11 (40:0.5:59.5)-5 nm SH-11-25 nm ETM-1:Liq (50:50)-4 nm KF-100 nm Al Device 13:
  ITO-90 nm Ir(DPBIC)$_3$:MoO$_3$ (90:10)-10 nm Ir(DPBIC)$_3$-40 nm BE-24/FE-7/SH-11 (40:0.7:59.3)-5 nm SH-11-25 nm ETM-1:Liq (50:50)-4 nm KF-100 nm Al Device 14:
  ITO-90 nm Ir(DPBIC)$_3$:MoO$_3$ (90:10)-10 nm Ir(DPBIC)$_3$-40 nm BE-24/FE-7/SH-11 (40:1:59)-5 nm SH-11-25 nm ETM-1:Liq (50:50)-4 nm KF-100 nm Al Device 15:
 ITO-80 nm Ir(DPBIC)$_3$:MoO$_3$ (90:10)-10 nm Ir(DPBIC)$_3$-40 nm BE-24/FE-7/SH-11 (40:2:58)-5 nm SH-11-25 nm ETM-1:Liq (50:50)-4 nm KF-100 nm Al

TABLE 16

|  | BE-24 | FE-7 | SH-11 | EQE [%] | CIE$_x$ | CIE$_y$ | LT50 [%] |
|---|---|---|---|---|---|---|---|
| Comp. Appl. Ex. 6 Comp. Device 6 | 40 | 0 | 60 | 100 | 0.152 | 0.188 | 100 |
| Appl. Ex. 11 Device 11 | 40 | 0.3 | 59.7 | 102 | 0.149 | 0.199 | 245 |
| Appl. Ex. 12 Device 12 | 40 | 0.5 | 59.5 | 110 | 0.148 | 0.222 | 355 |
| Appl. Ex. 13 Device 13 | 40 | 0.7 | 59.3 | 114 | 0.148 | 0.251 | 580 |
| Appl. Ex. 14 Device 14 | 40 | 1 | 59 | 108 | 0.149 | 0.274 | 910 |
| Appl. Ex. 15 Device 15 | 40 | 2 | 58 | 103 | 0.151 | 0.293 | 1190 |

Comparative Application Example 7 and Application Example 16

Comp. Device 7 and Device 16 are obtained in analogy to Comp. Application Example 1. The device architectures of Comp. Device 7 and Device 15 are shown below:
Comp. Device 7:
 ITO-50 nm Ir(DPBIC)$_3$:MoO$_3$ (90:10)-10 nm Ir(DPBIC)$_3$-40 nm BE-2/FE-5/SH-2 (10:0:90)-5 nm SH-2-35 nm ETM-1:Liq (50:50)-4 nm KF-100 nm Al
Device 16:
 ITO-50 nm Ir(DPBIC)$_3$:MoO$_3$ (90:10)-10 nm Ir(DPBIC)$_3$-40 nm BE-2/FE-5/SH-2 (10:0.3:99.7)-5 nm SH-2-35 nm ETM-1:Liq (50:50)-4 nm KF-100 nm Al

TABLE 17

|  | BE-2 | FE-5 | SH-2 | EQE [%] | CIE$_x$ | CIE$_y$ | LT50 [%] |
|---|---|---|---|---|---|---|---|
| Comp. Appl. Ex. 7 Comp. Device 7 | 10 | 0 | 90 | 100 | 0.368 | 0.554 | 100 |
| Appl. Ex. 18 Device 16 | 10 | 0.3 | 89.7 | 110 | 0.296 | 0.594 | 165 |

Comparative Application Example 8 and Application Examples 17 and 18

Comp. Device 8 and Devices 17 to 19 are obtained in analogy to Comp. Application Example 1. The device architectures of Comp. Device 8 and Device 17 and 18 are shown below:
Comp. Device 8:
 ITO-90 nm Ir(DPBIC)$_3$:MoO$_3$ (90:10)-10 nm Ir(DPBIC)$_3$-40 nm BE-38/FE-2/SH-11 (30:0:70)-5 nm SH-11-25 nm ETM-1:Liq (50:50)-4 nm KF-100 nm Al
Device 17:
 ITO-90 nm Ir(DPBIC)$_3$:MoO$_3$ (90:10)-10 nm Ir(DPBIC)$_3$-40 nm BE-38/FE-2/SH-11 (30:0.5:69.5)-5 nm SH-11-25 nm ETM-1:Liq (50:50)-4 nm KF-100 nm Al
Device 18:
 ITO-80 nm Ir(DPBIC)$_3$:MoO$_3$ (90:10)-10 nm Ir(DPBIC)$_3$-40 nm BE-38/FE-2/SH-11 (30:1:69)-5 nm SH-11-25 nm ETM-1:Liq (50:50)-4 nm KF-100 nm Al

TABLE 18

|  | BE-38 | FE-2 | SH-11 | EQE [%] | CIE$_x$ | CIE$_y$ | LT50 [%] |
|---|---|---|---|---|---|---|---|
| Comp. Appl. Ex. 8 Comp. Device 8 | 30 | 0 | 70 | 100 | 0.163 | 0.216 | 100 |
| Appl. Ex. 17 Device 17 | 30 | 0.5 | 69.5 | 182 | 0.140 | 0.157 | 120 |
| Appl. Ex. 18 Device 18 | 30 | 1 | 69 | 167 | 0.137 | 0.154 | 180 |

Comparative Application Example 9 and Application Examples 19 to 21

Comp. Device 8 and Devices 19 to 21 are obtained in analogy to Comp. Application Example 1. The device architectures of Comp. Device 9 and Device 19 to 21 are shown below:
Comp. Device 9:
 ITO-90 nm Ir(DPBIC)$_3$:MoO$_3$ (90:10)-10 nm Ir(DPBIC)$_3$-40 nm BE-38/FE-7/SH-11 (30:0:70)-5 nm SH-11-25 nm ETM-1:Liq (50:50)-4 nm KF-100 nm Al
Device 19:
 ITO-90 nm Ir(DPBIC)$_3$:MoO$_3$ (90:10)-10 nm Ir(DPBIC)$_3$-40 nm BE-38/FE-7/SH-11 (30:0.5:69.5)-5 nm SH-11-25 nm ETM-1:Liq (50:50)-4 nm KF-100 nm Al
Device 20:
 ITO-80 nm Ir(DPBIC)$_3$:MoO$_3$ (90:10)-10 nm Ir(DPBIC)$_3$-40 nm BE-38/FE-7/SH-11 (30:1:69)-5 nm SH-11-25 nm ETM-1:Liq (50:50)-4 nm KF-100 nm Al
Device 21:
 ITO-80 nm Ir(DPBIC)$_3$:MoO$_3$ (90:10)-10 nm Ir(DPBIC)$_3$-40 nm BE-38/FE-7/SH-11 (30:2:68)-5 nm SH-11-25 nm ETM-1:Liq (50:50)-4 nm KF-100 nm Al

TABLE 19

|  | BE-38 | FE-7 | SH-11 | EQE [%] | CIE$_x$ | CIE$_y$ | LT50 [%] |
|---|---|---|---|---|---|---|---|
| Comp. Appl. Ex. 9 Comp. Device 9 | 30 | 0 | 70 | 100 | 0.161 | 0.19 | 100 |
| Appl. Ex. 19 Device 19 | 30 | 0.5 | 69.5 | 121 | 0.156 | 0.195 | 220 |
| Appl. Ex. 20 Device 20 | 30 | 1 | 69 | 148 | 0.155 | 0.221 | 370 |
| Appl. Ex. 21 Device 21 | 30 | 2 | 68 | 150 | 0.156 | 0.247 | 505 |

Comparative Application Example 10 and Application Example 22

Comp. Device 10 and Device 22 are obtained in analogy to Comp. Application Example 1. The device architectures of Comp. Device 10 and Device 22 are shown below:
Comp. Device 10:
 ITO-90 nm Ir(DPBIC)$_3$:MoO$_3$ (90:10)-10 nm Ir(DPBIC)$_3$-40 nm BE-38/FE-2/SH-11 (40:0:70)-5 nm SH-11-25 nm ETM-1:Liq (50:50)-4 nm KF-100 nm Al
Device 22:
 ITO-90 nm Ir(DPBIC)$_3$:MoO$_3$ (90:10)-10 nm Ir(DPBIC)$_3$-40 nm BE-38/FE-2/SH-11 (40:0.5:59.5)-5 nm SH-11-25 nm ETM-1:Liq (50:50)-4 nm KF-100 nm Al

TABLE 20

|  | BE-38 | FE-2 | SH-11 | EQE [%] | CIE$_x$ | CIE$_y$ | LT50 [%] |
|---|---|---|---|---|---|---|---|
| Comp. Appl. Ex. 10 Comp. Device 10 | 40 | 0 | 60 | 100 | 0.164 | 0.215 | 100 |
| Appl. Ex. 22 Device 22 | 40 | 0.5 | 59.5 | 144 | 0.141 | 0.157 | 175 |

Comparative Application Example 11 and Application Examples 22 to 24

Comp. Device 11 and Devices 22 to 24 are obtained in analogy to Comp. Application Example 1. The device architectures of Comp. Device 11 and Device 22 to 24 are shown below:

Comp. Device 11:
ITO-90 nm Ir(DPBIC)$_3$:MoO$_3$ (90:10)-10 nm Ir(DPBIC)$_3$-40 nm BE-38/FE-7/SH-11 (40:0:60)-5 nm SH-11-25 nm ETM-1:Liq (50:50)-4 nm KF-100 nm Al Device 22:
ITO-90 nm Ir(DPBIC)$_3$:MoO$_3$ (90:10)-10 nm Ir(DPBIC)$_3$-40 nm BE-38/FE-7/SH-11 (40:0.5:59.5)-5 nm SH-11-25 nm ETM-1:Liq (50:50)-4 nm KF-100 nm Al Device 23:
ITO-80 nm Ir(DPBIC)$_3$:MoO$_3$ (90:10)-10 nm Ir(DPBIC)$_3$-40 nm BE-38/FE-7/SH-11 (40:1:59)-5 nm SH-11-25 nm ETM-1:Liq (50:50)-4 nm KF-100 nm Al Device 24:
ITO-80 nm Ir(DPBIC)$_3$:MoO$_3$ (90:10)-10 nm Ir(DPBIC)$_3$-40 nm BE-38/FE-7/SH-11 (40:2:58)-5 nm SH-11-25 nm ETM-1:Liq (50:50)-4 nm KF-100 nm Al

TABLE 21

|  | BE-38 | FE-7 | SH-11 | EQE [%] | CIE$_x$ | CIE$_y$ | LT50 [%] |
|---|---|---|---|---|---|---|---|
| Comp. Appl. Ex. 11 Comp. Device 11 | 40 | 0 | 60 | 100 | 0.167 | 0.229 | 100 |
| Appl. Ex. 22 Device 22 | 40 | 0.5 | 59.5 | 123 | 0.158 | 0.208 | 125 |
| Appl. Ex. 23 Device 23 | 40 | 1 | 59 | 164 | 0.156 | 0.230 | 225 |
| Appl. Ex. 24 Device 24 | 40 | 2 | 58 | 169 | 0.156 | 0.263 | 320 |

Comparative Application Example 12 and Application Examples 25 and 26

Comp. Device 12 and Devices 25 and 26 are obtained in analogy to Comp. Application Example 1. The device architectures of Comp. Device 12 and Device 25 and 26 are shown below:

Comp. Device 12:
ITO-90 nm Ir(DPBIC)$_3$:MoO$_3$ (90:10)-10 nm Ir(DPBIC)$_3$-40 nm BE-24/FE-2/SH-11 (10:0:90)-5 nm SH-11-25 nm ETM-1:Liq (50:50)-4 nm KF-100 nm Al Device 25:
ITO-90 nm Ir(DPBIC)$_3$:MoO$_3$ (90:10)-10 nm Ir(DPBIC)$_3$-40 nm BE-24/FE-2/SH-11 (10:0.1:89.9)-5 nm SH-11-25 nm ETM-1:Liq (50:50)-4 nm KF-100 nm Al Device 26:
ITO-80 nm Ir(DPBIC)$_3$:MoO$_3$ (90:10)-10 nm Ir(DPBIC)$_3$-40 nm BE-24/FE-2/SH-11 (10:0.5:89.5)-5 nm SH-11-25 nm ETM-1:Liq (50:50)-4 nm KF-100 nm Al

TABLE 22

|  | BE-24 | FE-2 | SH-11 | EQE [%] | CIE$_x$ | CIE$_y$ | LT50 [%] |
|---|---|---|---|---|---|---|---|
| Comp. Appl. Ex. 12 Comp. Device 12 | 10 | 0 | 90 | 100 | 0.152 | 0.129 | 100 |
| Appl. Ex. 25 Device 25 | 10 | 0.1 | 89.9 | 112 | 0.148 | 0.142 | 120 |
| Appl. Ex. 26 Device 26 | 10 | 0.5 | 89.5 | 151 | 0.139 | 0.156 | 405 |

Comparative Application Example 13 and Application Examples 27 and 28

Comp. Device 13 and Devices 27 and 28 are obtained in analogy to Comp. Application Example 1. The device architectures of Comp. Device 13 and Device 27 and 28 are shown below:

Comp. Device 13:
ITO-90 nm Ir(DPBIC)$_3$:MoO$_3$ (90:10)-10 nm Ir(DPBIC)$_3$-40 nm BE-24/FE-2/SH-11 (20:0:80)-5 nm SH-11-25 nm ETM-1:Liq (50:50)-4 nm KF-100 nm Al Device 27:
ITO-90 nm Ir(DPBIC)$_3$:MoO$_3$ (90:10)-10 nm Ir(DPBIC)$_3$-40 nm BE-24/FE-2/SH-11 (20:0.1:79.9)-5 nm SH-11-25 nm ETM-1:Liq (50:50)-4 nm KF-100 nm Al Device 28:
ITO-80 nm Ir(DPBIC)$_3$:MoO$_3$ (90:10)-10 nm Ir(DPBIC)$_3$-40 nm BE-24/FE-2/SH-11 (20:0.5:79.5)-5 nm SH-11-25 nm ETM-1:Liq (50:50)-4 nm KF-100 nm Al

TABLE 23

|  | BE-24 | FE-2 | SH-11 | EQE [%] | CIE$_x$ | CIE$_y$ | LT50 [%] |
|---|---|---|---|---|---|---|---|
| Comp. Appl. Ex. 13 Comp. Device 13 | 20 | 0 | 80 | 100 | 0.154 | 0.172 | 100 |
| Appl. Ex. 27 Device 27 | 20 | 0.1 | 79.9 | 127 | 0.144 | 0.155 | 240 |
| Appl. Ex. 28 Device 28 | 20 | 0.5 | 79.5 | 116 | 0.135 | 0.160 | 770 |

Comparative Application Example 14 and Application Examples 29 and 30

Comp. Device 14 and Devices 29 and 30 are obtained in analogy to Comp. Application Example 1. The device architectures of Comp. Device 14 and Device 29 and 30 are shown below:

Comp. Device 14:
ITO-90 nm Ir(DPBIC)$_3$:MoO$_3$ (90:10)-10 nm Ir(DPBIC)$_3$-40 nm BE-38/FE-2/SH-11 (20:0:80)-5 nm SH-11-25 nm ETM-1:Liq (50:50)-4 nm KF-100 nm Al Device 29:
ITO-90 nm Ir(DPBIC)$_3$:MoO$_3$ (90:10)-10 nm Ir(DPBIC)$_3$-40 nm BE-38/FE-2/SH-11 (20:0.5:79.5)-5 nm SH-11-25 nm ETM-1:Liq (50:50)-4 nm KF-100 nm Al Device 30:
ITO-80 nm Ir(DPBIC)$_3$:MoO$_3$ (90:10)-10 nm Ir(DPBIC)$_3$-40 nm BE-38/FE-2/SH-11 (20:1:79)-5 nm SH-11-25 nm ETM-1:Liq (50:50)-4 nm KF-100 nm Al Device 31:
ITO-80 nm Ir(DPBIC)$_3$:MoO$_3$ (90:10)-10 nm Ir(DPBIC)$_3$-40 nm BE-38/FE-2/SH-11 (20:2:78)-5 nm SH-11-25 nm ETM-1:Liq (50:50)-4 nm KF-100 nm Al

TABLE 24

|  | BE-38 | FE-2 | SH-11 | EQE [%] | CIE$_x$ | CIE$_y$ | LT50 [%] |
|---|---|---|---|---|---|---|---|
| Comp. Appl. Ex. 14 Comp. Device 14 | 20 | 0 | 80 | 100 | 0.162 | 0.201 | 100 |
| Appl. Ex. 29 Device 29 | 20 | 0.5 | 79.5 | 193 | 0.142 | 0.163 | 165 |
| Appl. Ex. 30 Device 30 | 20 | 1.0 | 79.0 | 185 | 0.138 | 0.163 | 230 |
| Appl. Ex. 31 Device 31 | 20 | 2.0 | 78.0 | 169 | 0.137 | 0.163 | 315 |

As evident from Tables 11 to 24 the EQE and/or lifetime of devices of the present invention, comprising organometallic complex X, fluorescent emitter Y and host compound(s), is increased in comparison to devices, comprising only organometallic complex X and host compound(s).

By doping, for example, an emitting layer containing a luminescent organometallic complex having a small $S_1$-$T_1$ splitting, with a fluorescent emitter the emission decay time can significantly be shortened without sacrificing external quantum efficiency (EQE) because of very efficient energy transfer.

The invention claimed is:
1. An organic light-emitting device comprising
   (a) an anode,
   (i) a cathode, and
   (e) an emitting layer between the anode and cathode, comprising
      2 to 40% by weight of a luminescent organometallic complex X having a difference of the singlet energy ($E_{S1}$(X)) and the triplet energy ($E_{T1}$(X)) of smaller than 0.2 eV,
      0.05 to 5.0% by weight of a fluorescent emitter Y, and
      55 to 97.95% by weight of a host compound(s),
      wherein the amount of the luminescent organometallic complex X, the fluorescent emitter Y and the host compound(s) does not exceed a total of 100% by weight, and
      wherein the singlet energy of the luminescent organometallic complex X ($E_{S1}$(X)) is greater than the singlet energy of the fluorescent emitter Y ($E_{S1}$(Y)).

2. The organic light-emitting device according to claim 1, wherein the difference of the singlet energy and the triplet energy of the luminescent organometallic complex X is smaller than 0.1 eV.

3. The organic light-emitting device according to claim 1, wherein the difference of the singlet energy and the triplet energy of the luminescent organometallic complex X is smaller than 0.05 eV.

4. The organic light-emitting device according to claim 1, wherein the emissive lifetime $\tau_0$, which is calculated by $\tau_0 = \tau_v / QY$, of thin films consisting of the luminescent organometallic complex X, fluorescent emitter Y and host compound(s) is below 100 ns.

5. The organic light-emitting device according to claim 1, wherein the luminescent organometallic complex X is a luminescent iridium complex.

6. The organic light-emitting device according to claim 5, wherein the luminescent iridium complex is a compound of formulae

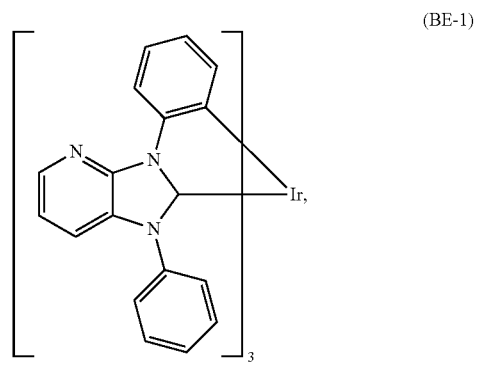

(BE-1)

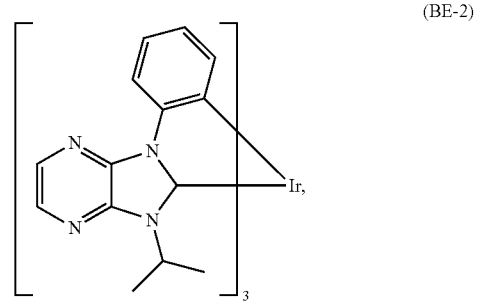

(BE-2)

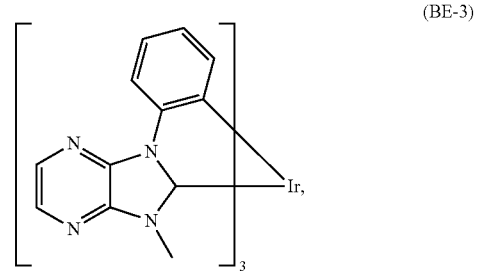

(BE-3)

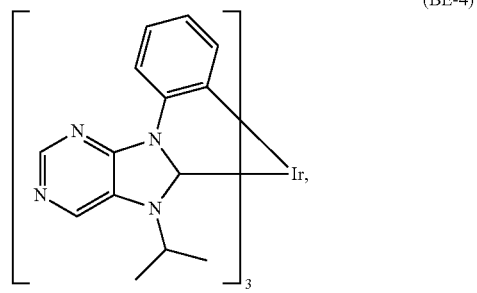

(BE-4)

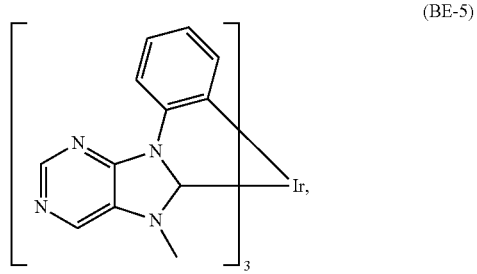

(BE-5)

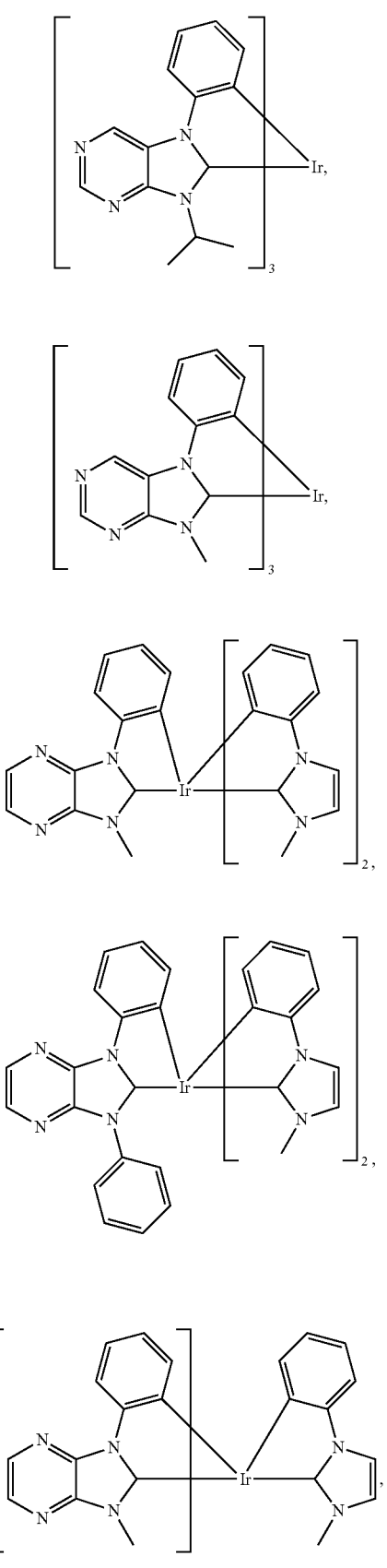

-continued
(BE-15)
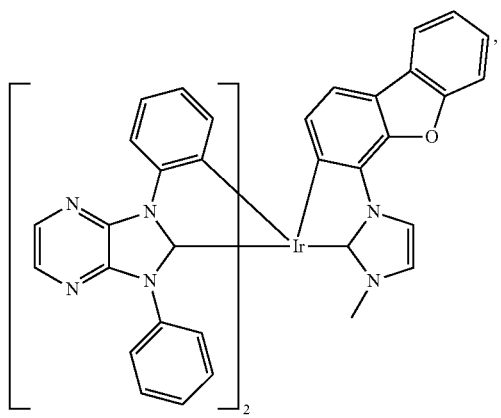
(BE-19)
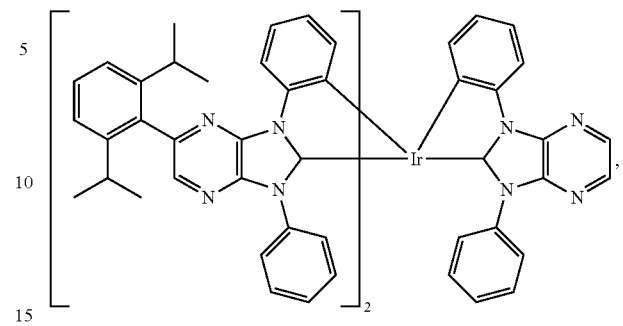
(BE-16)
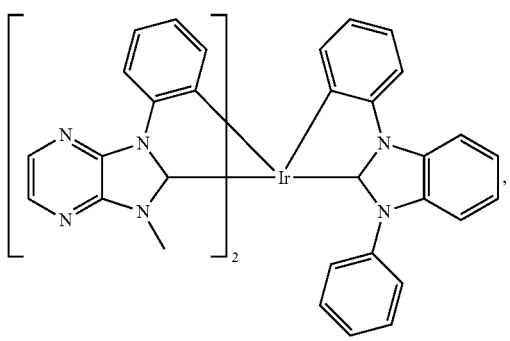
(BE-20)
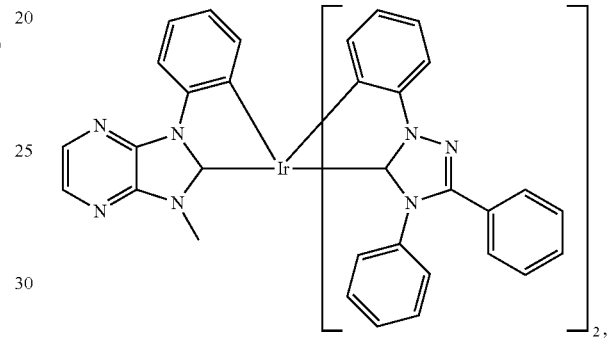
(BE-17)
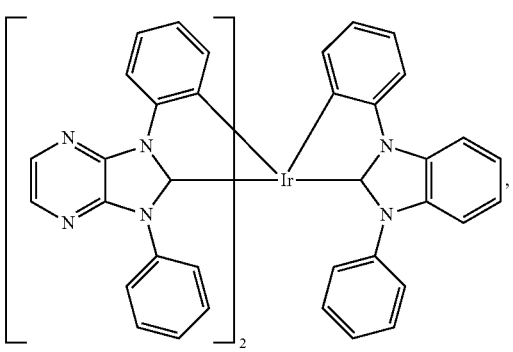
(BE-21)
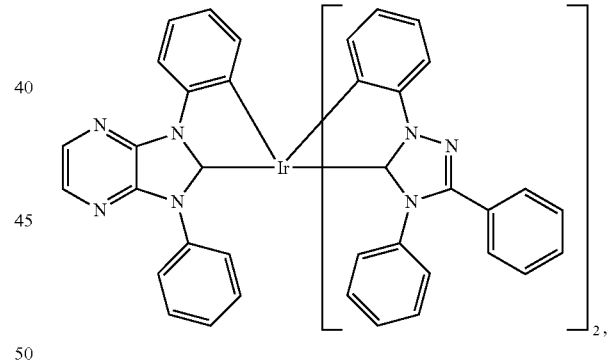
(BE-18)
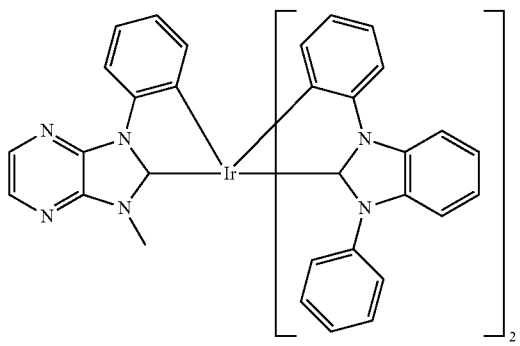
(BE-22)
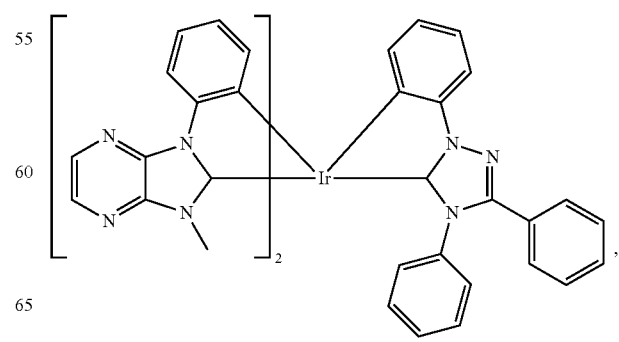

(BE-23)
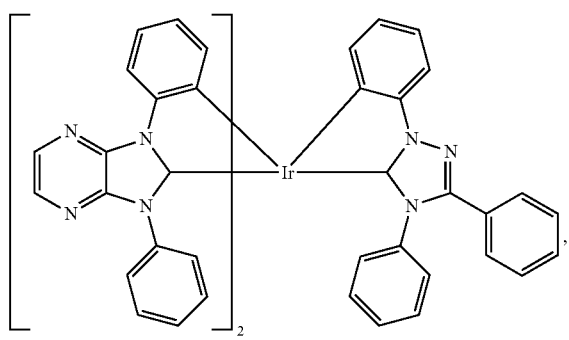
(BE-24)
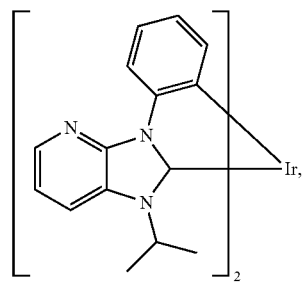
(BE-25)
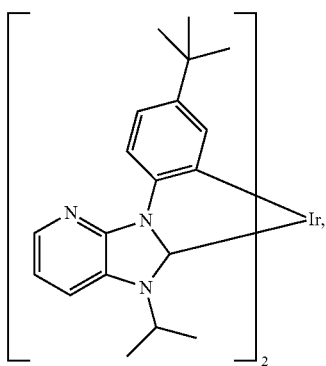
(BE-26)
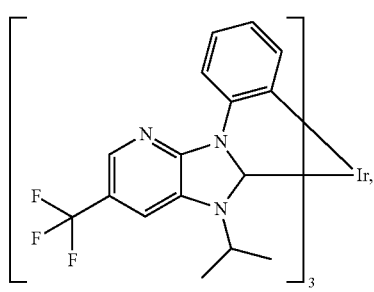
(BE-27)
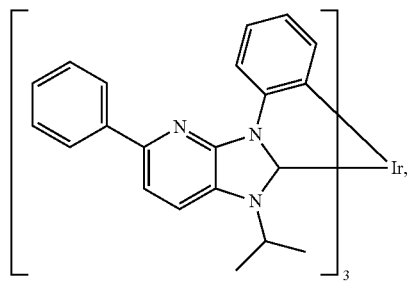
(BE-28)
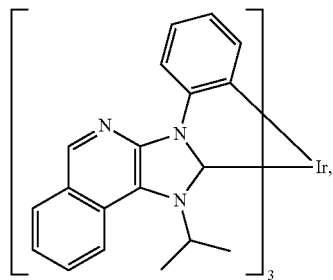
(BE-29)
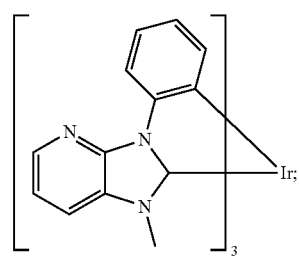
(BE-30)
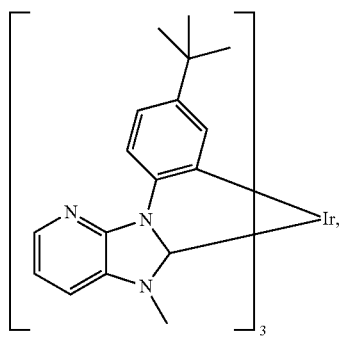
(BE-31)
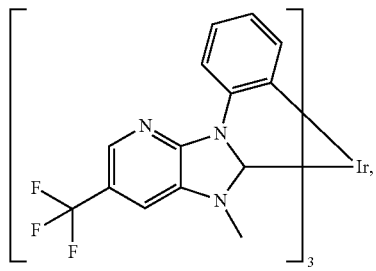
(BE-32)
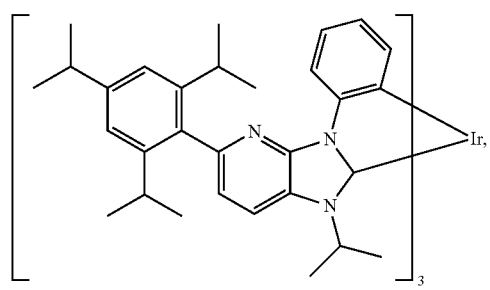

(BE-33)
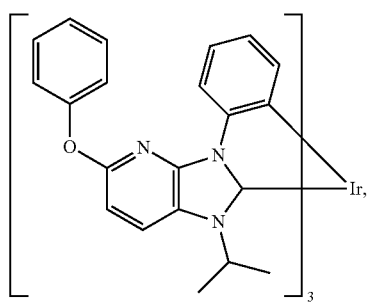

(BE-34)
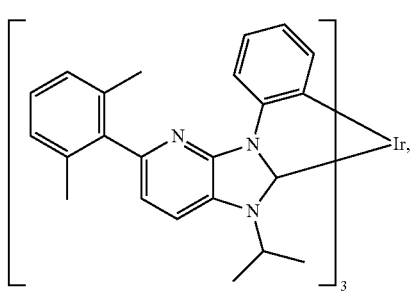

(BE-35)
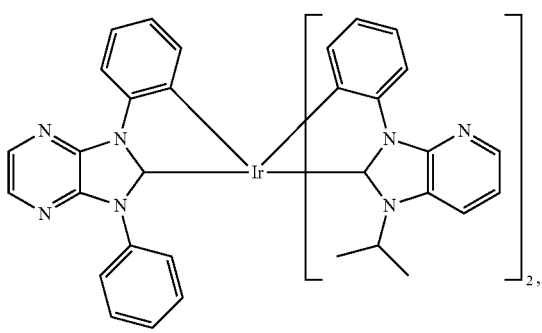

(BE-35a)
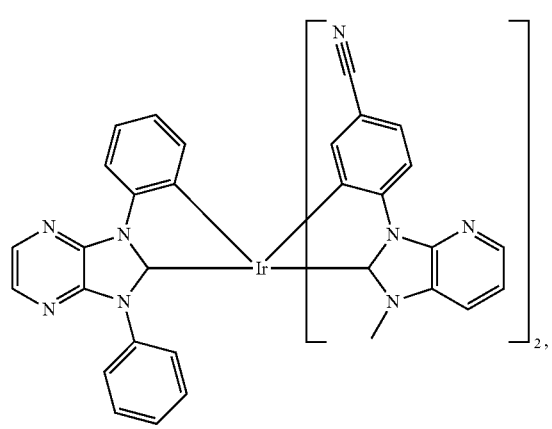

(BE-36)
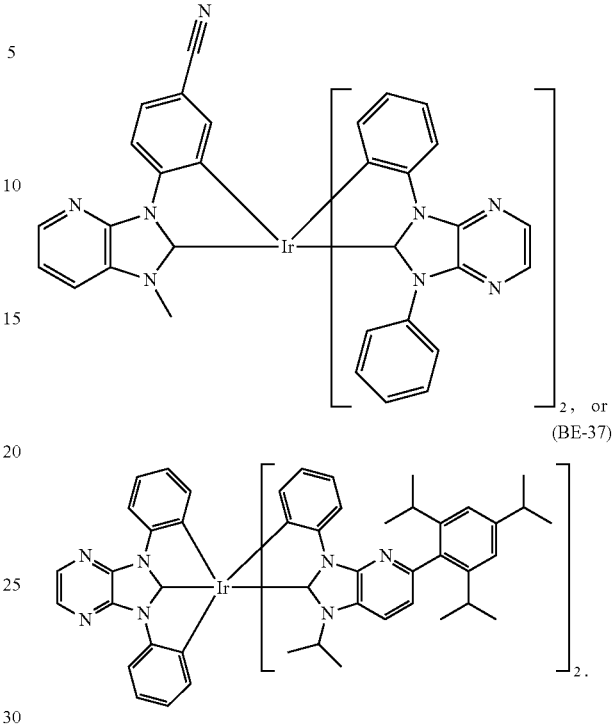

, or (BE-37)
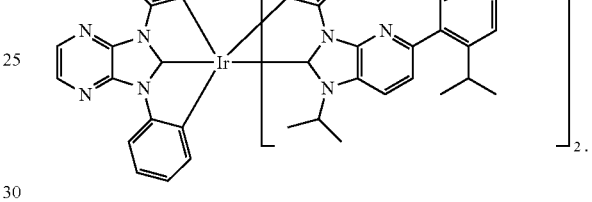

7. The organic light-emitting device according to claim 5, wherein the luminescent iridium complex is a compound of formulae (X)
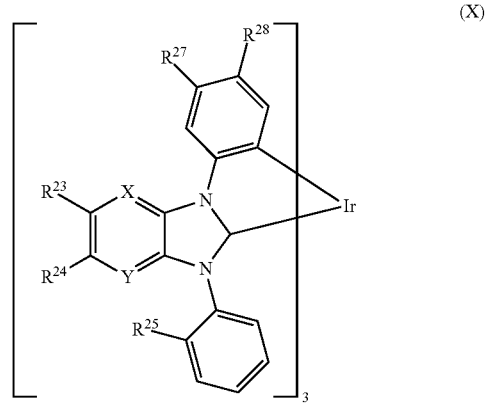

wherein X and Y are independently of each other CH, or N, with the proviso that at least one of X and Y is N; $R^{23}$, $R^{24}$, $R^{27}$ and $R^{28}$ are each independently hydrogen, deuterium, methyl, ethyl, n-propyl, iso-propyl, n-butyl, tert-butyl, sec-butyl, iso-butyl, cyclopentyl, cyclohexyl, $OCH_3$, $OCF_3$, phenyl, pyridyl, primidyl, pyrazinyl, carbazolyl, dibenzofuranyl, dibenzothiophenyl, benzofuranyl and benzothiophenyl, wherein the aforementioned radicals may be unsubstituted or substituted by methyl, ethyl, n-propyl, iso-propyl, n-butyl, tert-butyl, sec-butyl, iso-butyl, methoxy, $CF_3$ or phenyl, a group with donor or acceptor action, selected from F, $CF_3$, CN and $SiPh_3$; and $R^{25}$ is methyl, ethyl, n-propyl, iso-propyl, n-butyl, tert-butyl, sec-butyl, iso-butyl, cyclopentyl, cyclohexyl, OCH$_3$, OCF$_3$, phenyl, pyridyl, primidyl, pyrazinyl, wherein the aforementioned radicals may be substituted by, preferably monosubstituted, by methyl, ethyl, n-propyl, iso-propyl, n-butyl, tert-butyl, sec-butyl, iso-butyl, methoxy or phenyl or unsubstituted; a group with donor or acceptor action selected from CF$_3$ and CN.

8. The organic light-emitting device according to claim 1, wherein the luminescent organometallic complex X is a luminescent copper complex.

9. The organic light-emitting device according to claim 8, wherein the luminescent copper complex is a compound of formulae (Cu-1)

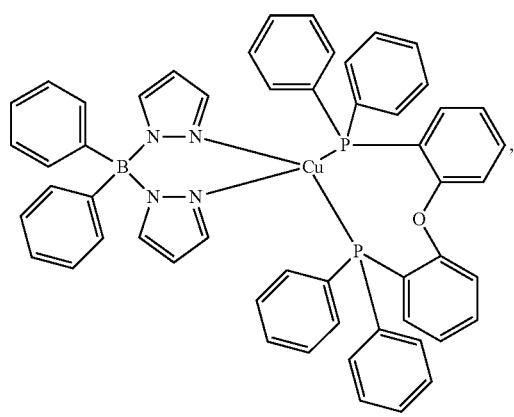

(Cu-2)

(Cu-3)

-continued (Cu-4)

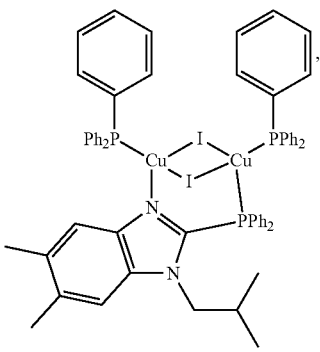

(Cu-5)

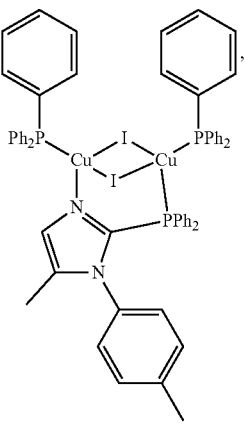

(Cu-6)

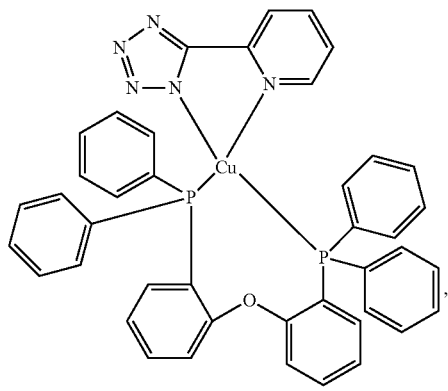

(Cu-7)

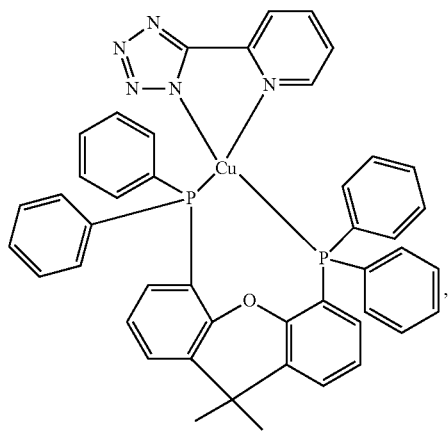

(Cu-8)
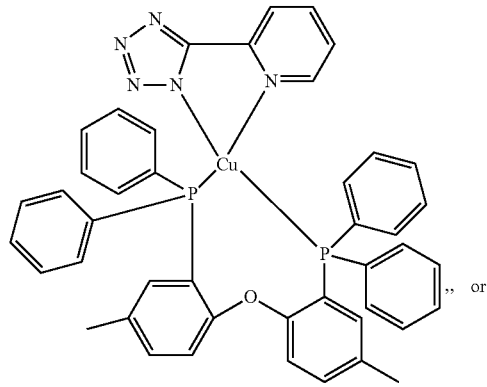
, or
(Cu-9)
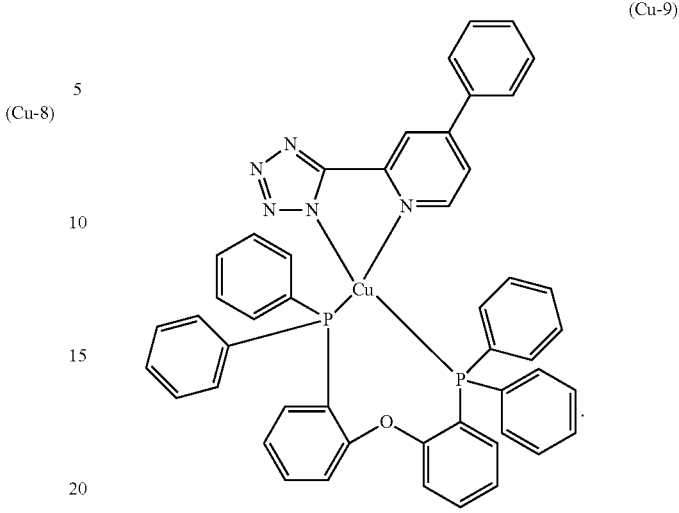
.
10. The organic light-emitting device according to claim 1, wherein the fluorescent emitter Y is a compound of formulae
(FE-1)
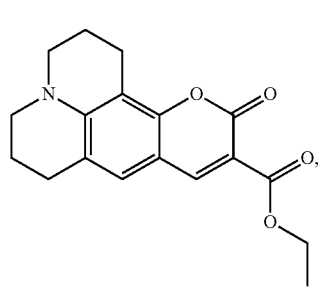
,
(FE-2)
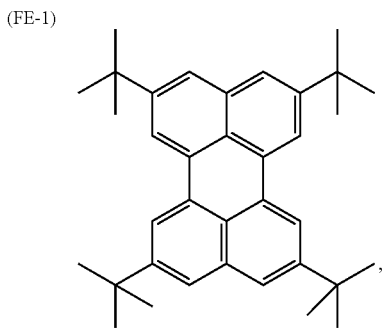
,
(FE-6)
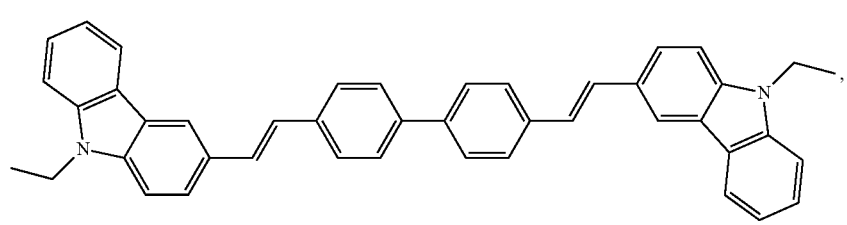
,
(FE-7)
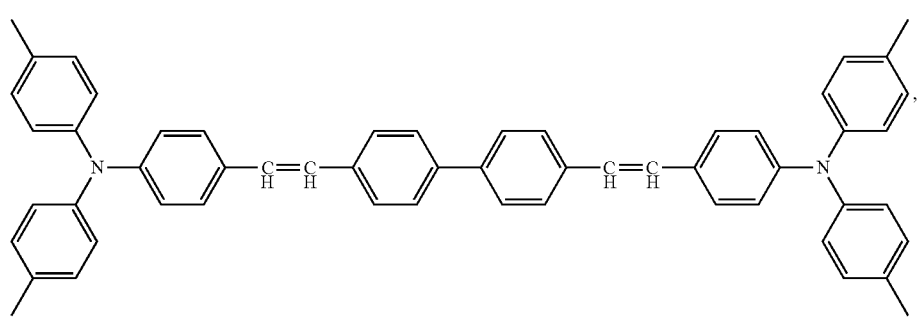
,

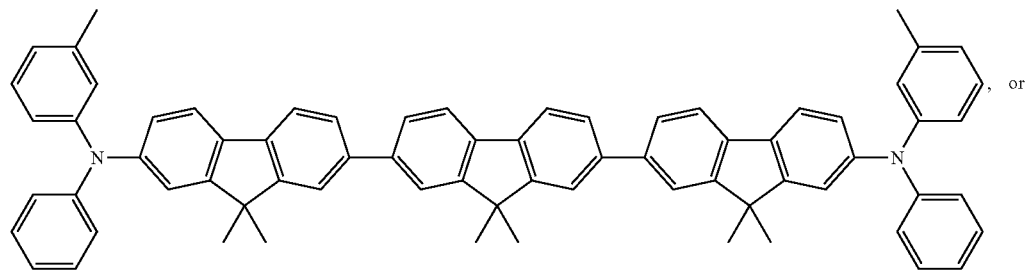
(FE-8)
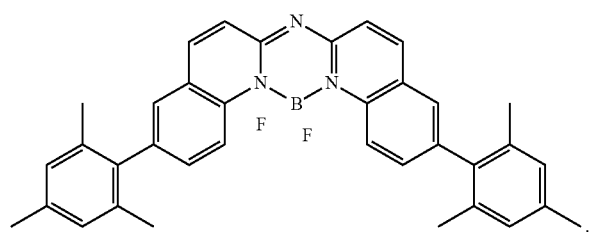
(FE-9)
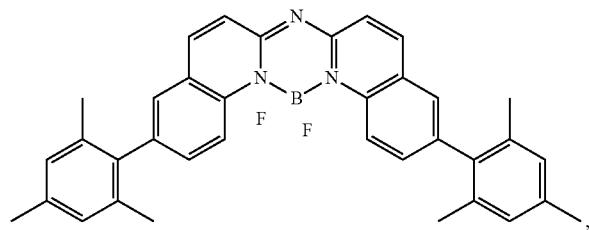
(FE-9)
11. The organic light-emitting device according to claim 1, wherein the host compound is a compound of formulae
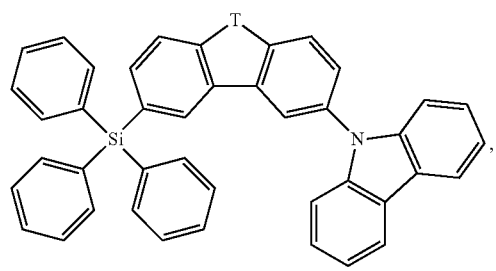
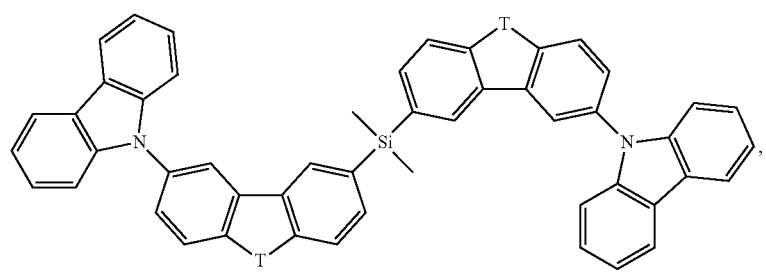

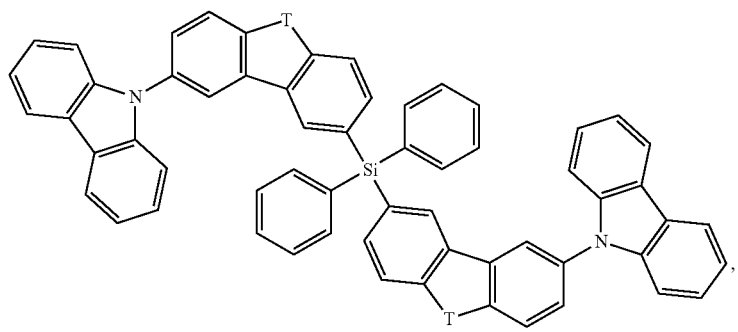
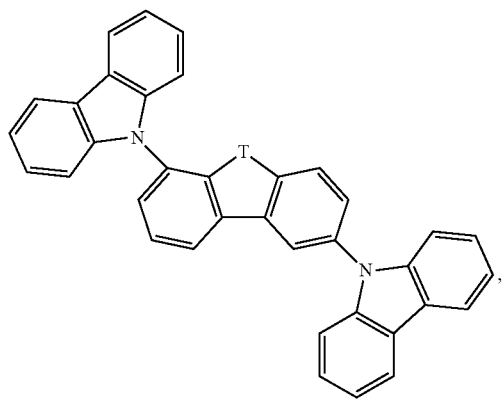
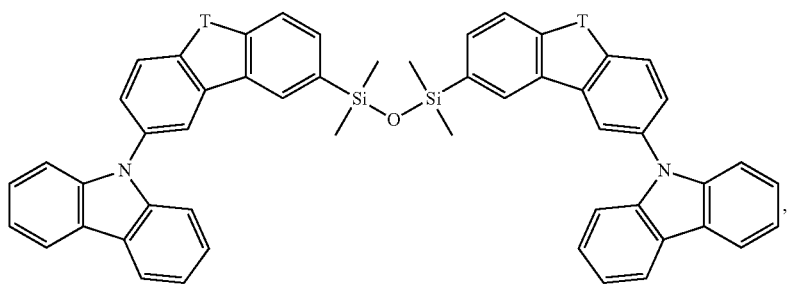
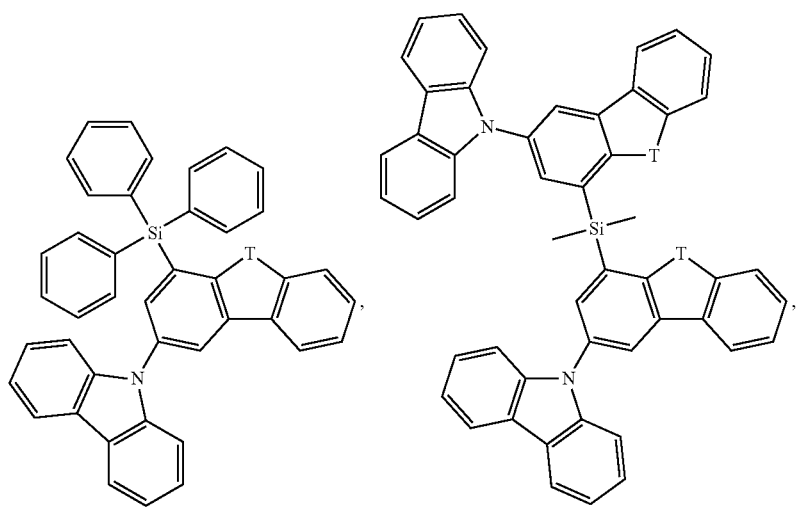

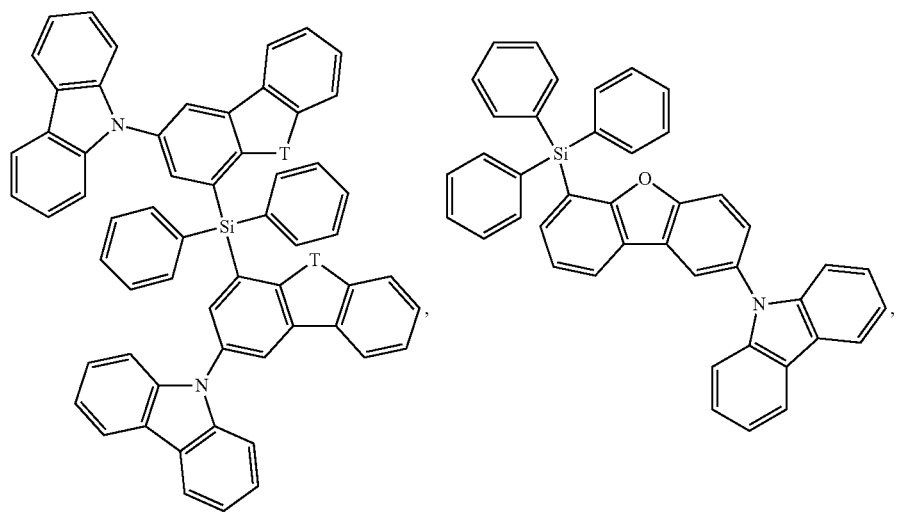
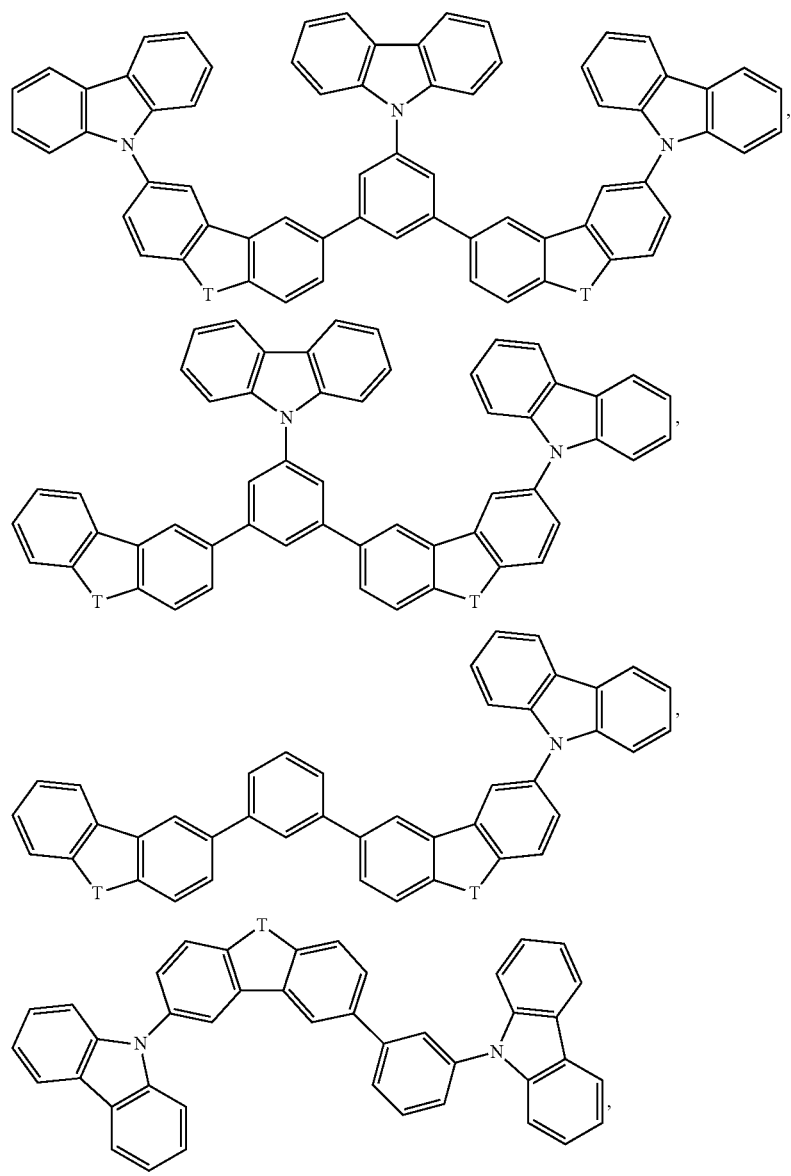

-continued
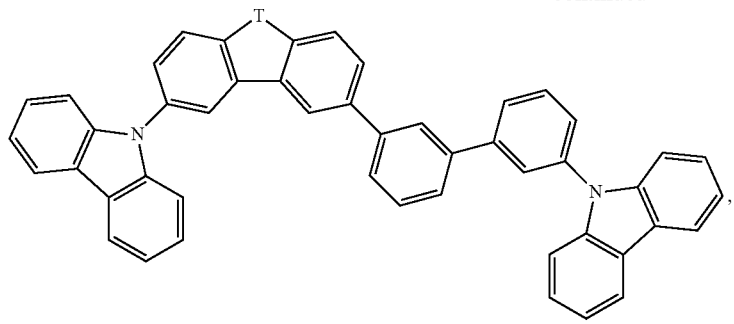
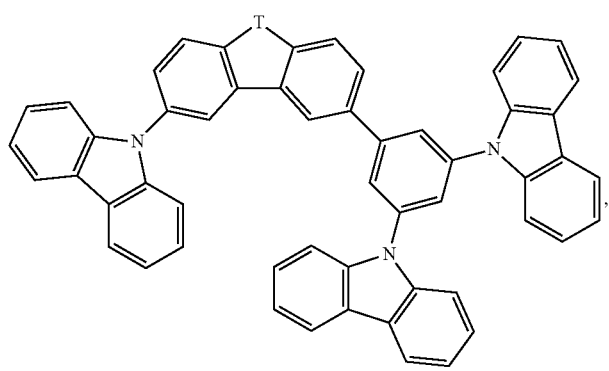
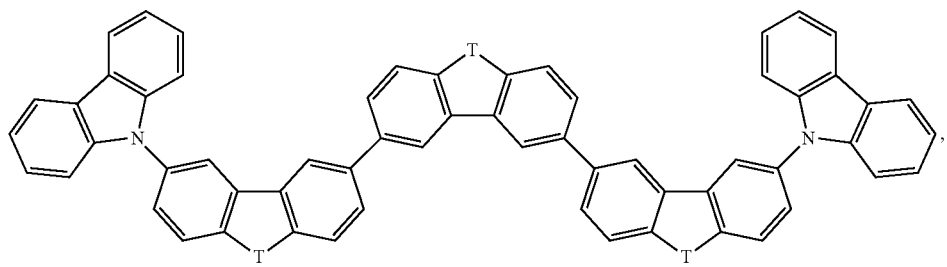
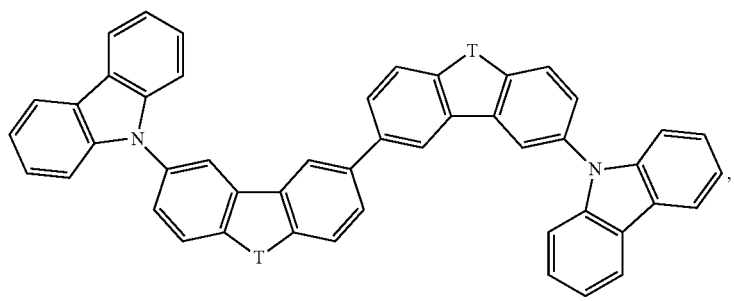
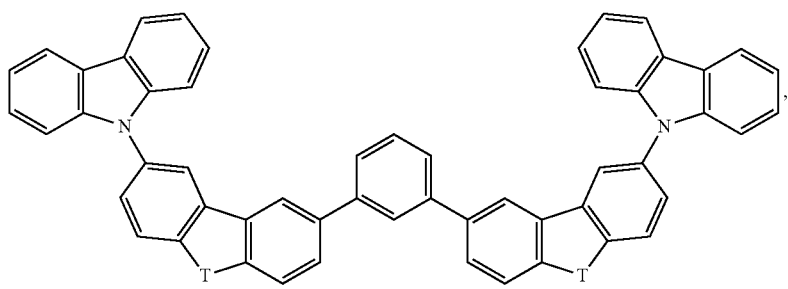

-continued
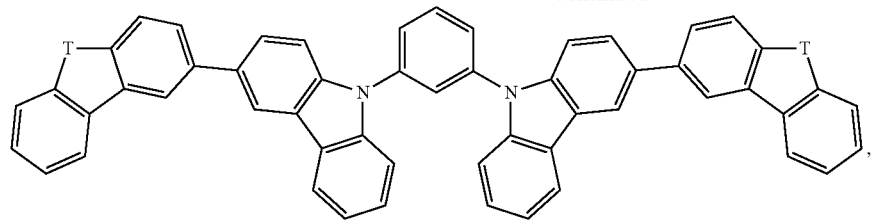
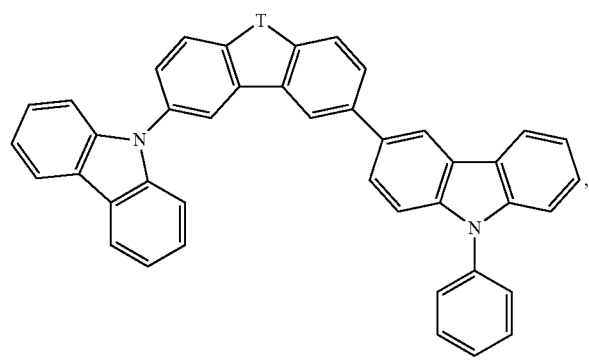
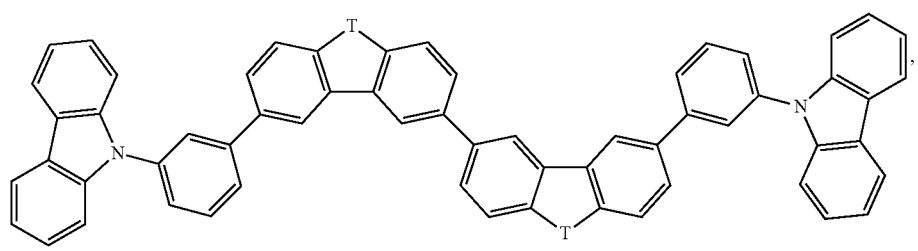
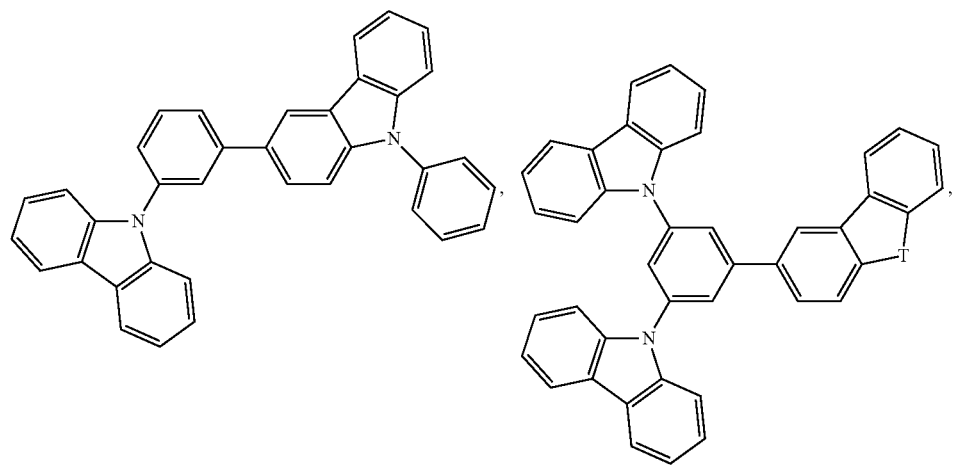
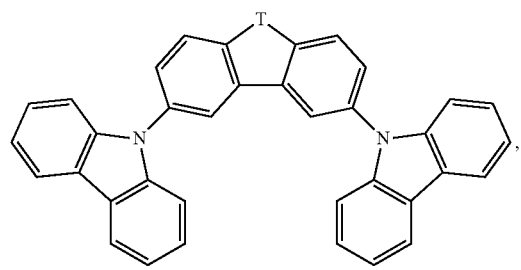

-continued
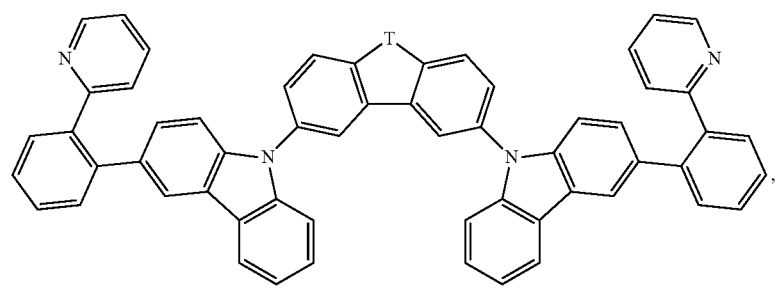
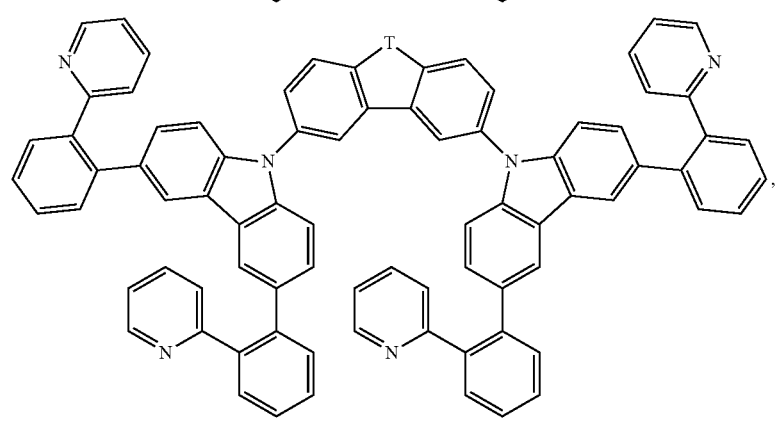
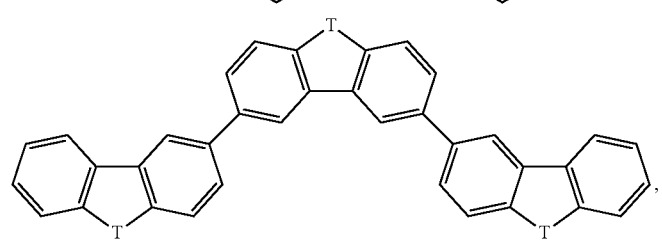
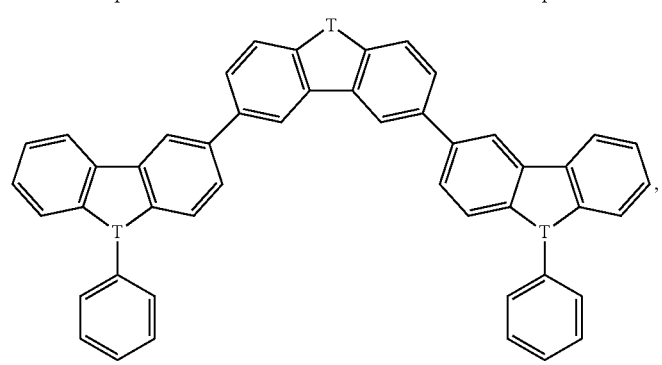
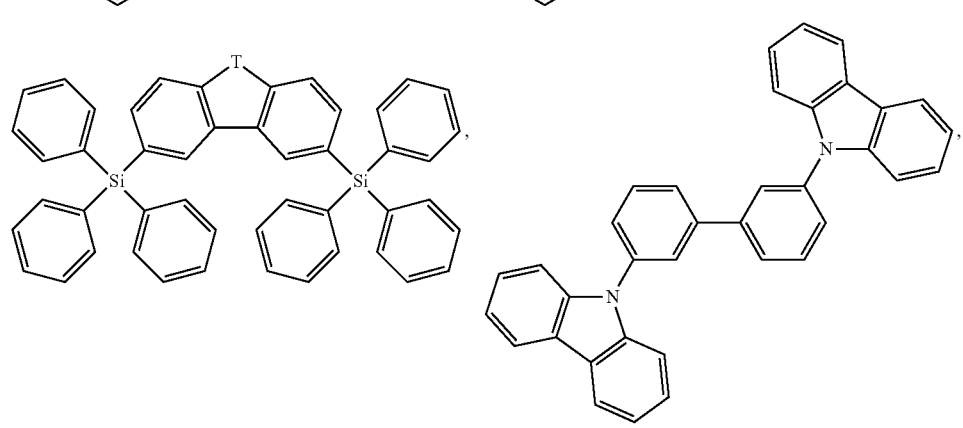

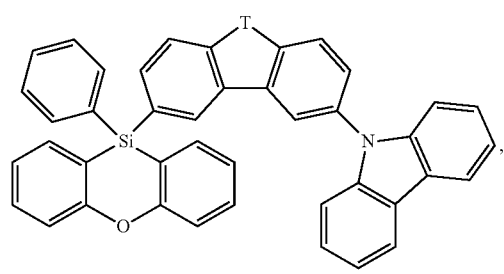
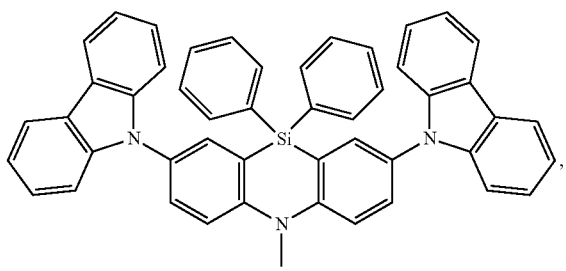
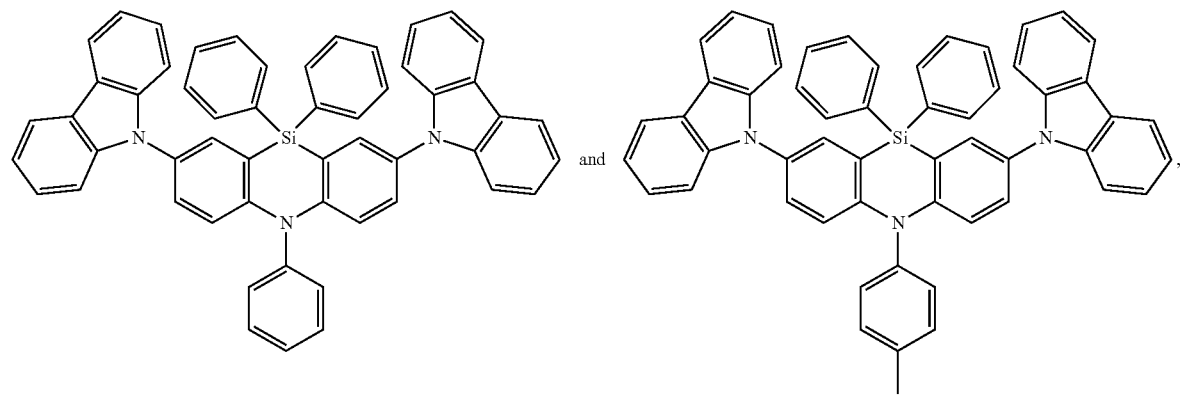
wherein T is O, or S.
12. The organic light-emitting device according to claim 11, wherein the host compound is a compound of formulae
(SH-1)
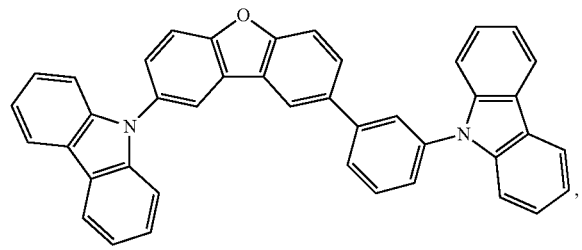
(SH-2)
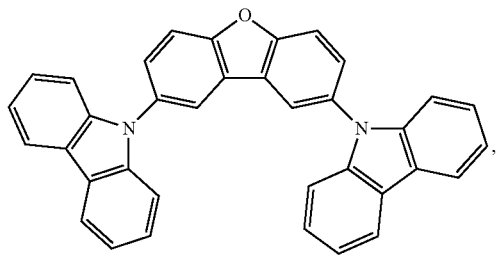
(SH-3)
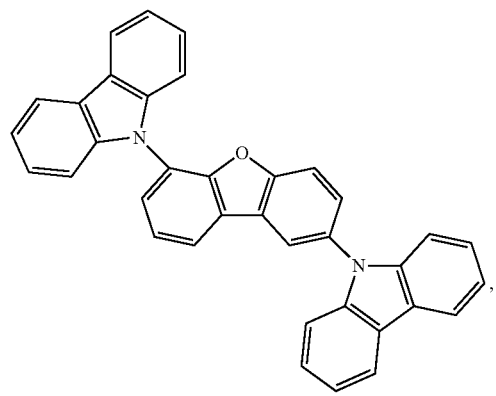
(SH-4)
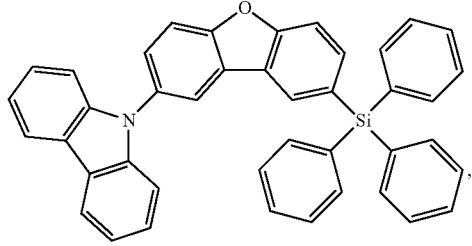

-continued

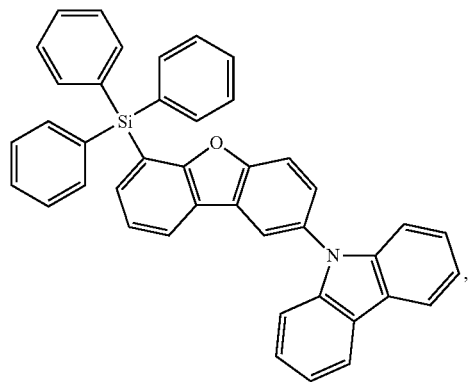
(SH-5)

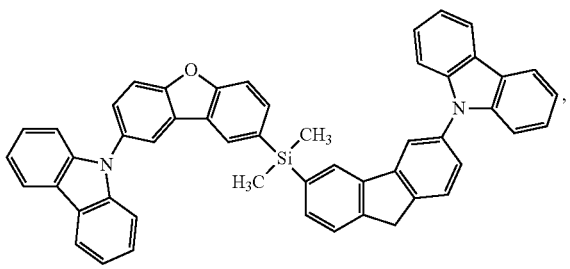
(SH-6)

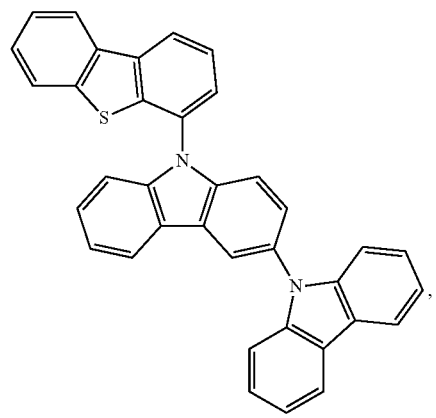
(SH-7)

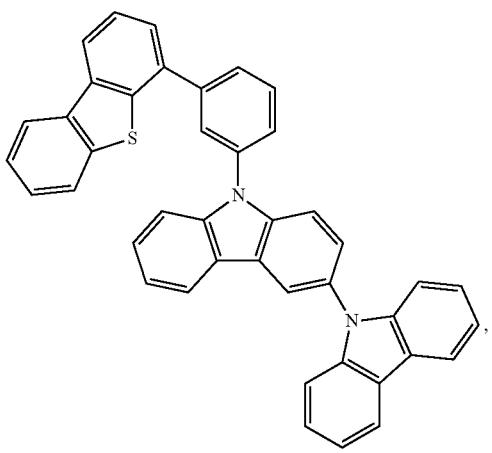
(SH-8)

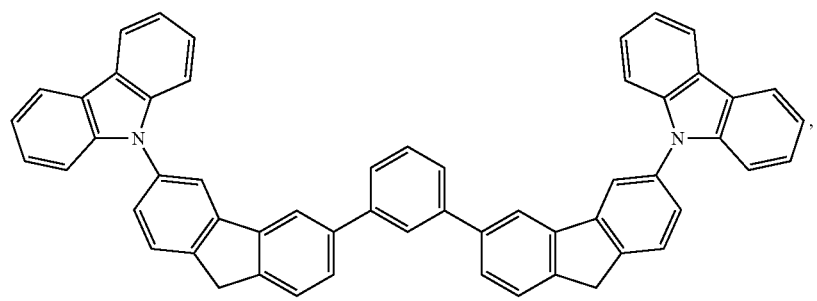
(SH-9)

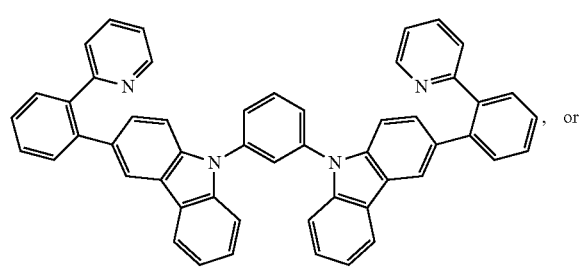
(SH-10), or

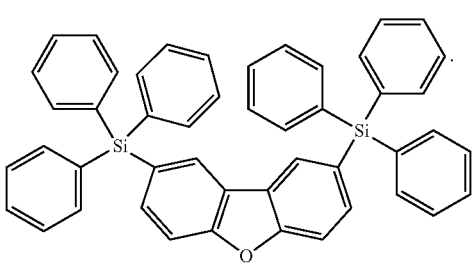
(SH-11)

13. The organic light-emitting device according to claim 1, comprising in this order:
(a) an anode,
(b) optionally a hole injection layer,
(c) a hole transport layer,
(d) exciton blocking layer
(e) an emitting layer, comprising the luminescent organometallic complex X the fluorescent emitter Y and the host compound(s),
(f) a hole/exciton blocking layer
(g) an electron transport layer,
(h) optionally an electron injection layer, and
(i) a cathode.

14. An emitting layer, comprising
2 to 40% by weight of a luminescent organometallic complex X having a difference of the singlet energy and the triplet energy of smaller than 0.2 eV,
0.05 to 5% by weight of a fluorescent emitter Y and
55 to 97.95% by weight of a host compound(s),
wherein the amount of the organometallic complex X, the fluorescent emitter Y and the host compound(s) does not exceed a total of 100% by weight and the singlet energy of the luminescent organometallic complex X ($E_{S1}(X)$) is greater than the singlet energy of the fluorescent emitter Y ($E_{S1}(Y)$).

15. An apparatus selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, MP3 players, vehicles and destination displays on buses and trains; illumination units; keyboards; items of clothing; furniture; wallpaper, comprising the organic light-emitting device according to claim 1.

16. An apparatus selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, MP3 players, vehicles and destination displays on buses and trains; illumination units; keyboards; items of clothing; furniture; wallpaper, comprising the emitting layer of claim 14.

17. A light-emitting electrochemical cell (LEEC), organic light emitting device (OLED) sensor, an organic solar cell (OSC), an organic field-effect transistor, an organic diode and an organic photodiode, comprising the emitting layer of claim 14.

* * * * *